(12) United States Patent
Hosotani et al.

(10) Patent No.: US 11,107,508 B2
(45) Date of Patent: *Aug. 31, 2021

(54) SEMICONDUCTOR MEMORY DEVICE

(71) Applicant: TOSHIBA MEMORY CORPORATION, Tokyo (JP)

(72) Inventors: Keiji Hosotani, Yokkaichi Mie (JP); Fumitaka Arai, Yokkaichi Mie (JP); Keisuke Nakatsuka, Kobe Hyogo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 16/562,372

(22) Filed: Sep. 5, 2019

(65) Prior Publication Data

US 2020/0176033 A1   Jun. 4, 2020

(30) Foreign Application Priority Data

Dec. 4, 2018 (JP) .............................. JP2018-227378

(51) Int. Cl.
| | |
|---|---|
| *H01L 27/11578* | (2017.01) |
| *G11C 5/06* | (2006.01) |
| *H01L 23/48* | (2006.01) |
| *H01L 27/1157* | (2017.01) |
| *H01L 27/11582* | (2017.01) |

(Continued)

(52) U.S. Cl.
CPC .............. *G11C 5/063* (2013.01); *G11C 16/08* (2013.01); *G11C 16/16* (2013.01); *G11C 16/24* (2013.01); *G11C 16/26* (2013.01); *G11C 16/30* (2013.01); *H01L 23/481* (2013.01); *H01L 27/1157* (2013.01); *H01L 27/11519* (2013.01); *H01L 27/11524* (2013.01); *H01L 27/11556* (2013.01);

(Continued)

(58) Field of Classification Search
CPC ................................................. H01L 27/11578
See application file for complete search history.

(56) References Cited

U.S. PATENT DOCUMENTS 7,382,018 B2   6/2008   Kim et al.
9,224,429 B2   12/2015  Park et al.
(Continued)

FOREIGN PATENT DOCUMENTS

JP   2008-078404 A   4/2008

OTHER PUBLICATIONS

Office Action, U.S. Appl. No. 16/564,584, dated Dec. 28, 2020.
(Continued)

*Primary Examiner* — Christopher A Johnson
(74) *Attorney, Agent, or Firm* — Foley & Lardner LLP

(57) ABSTRACT

According to one embodiment, a semiconductor memory device includes: a conductive layer including a first portion and a second portion electrically coupled to the first portion; a first contact plug electrically coupled to the first portion; a first semiconductor layer; a first insulating layer between the second portion and the first semiconductor layer, and between the first portion and the first semiconductor layer; a second contact plug coupled to the first semiconductor layer in a region in which the first insulating layer is formed; a first interconnect; and a first memory cell apart from the second portion in the second direction and storing information between the first semiconductor layer and the first interconnect.

19 Claims, 37 Drawing Sheets

(51) Int. Cl.
*H01L 27/11565* (2017.01)
*H01L 27/11519* (2017.01)
*G11C 16/30* (2006.01)
*H01L 27/11556* (2017.01)
*G11C 16/08* (2006.01)
*G11C 16/16* (2006.01)
*G11C 16/24* (2006.01)
*G11C 16/26* (2006.01)
*H01L 27/11524* (2017.01)

(52) U.S. Cl.
CPC .. *H01L 27/11565* (2013.01); *H01L 27/11582* (2013.01)

(56) References Cited

U.S. PATENT DOCUMENTS

| | | | |
|---|---|---|---|
| 9,224,474 | B2 | 12/2015 | Lue |
| 9,236,127 | B2 | 1/2016 | Rhie |
| 9,343,152 | B2 | 5/2016 | Rhie |
| 9,805,927 | B2 | 10/2017 | Fujii et al. |
| 10,056,433 | B2 | 8/2018 | Kiyotoshi et al. |
| 2015/0098274 | A1* | 4/2015 | Rhie ............ G11C 16/0416 365/185.17 |
| 2019/0157282 | A1 | 5/2019 | Jung |
| 2019/0326315 | A1 | 10/2019 | Lee et al. |
| 2019/0393238 | A1 | 12/2019 | Lim et al. |
| 2020/0194458 | A1 | 6/2020 | Kim et al. |

OTHER PUBLICATIONS

U.S. Appl. No. 16/564,584, filed Sep. 9, 2019, Toshiba Memory Corp.

Non-Final Office Action on U.S. Appl. No. 16/564,584 dated May 24, 2021.

Examiner Interview Summary on U.S. Appl. No. 16/564,584 dated Jun. 1, 2021.

* cited by examiner

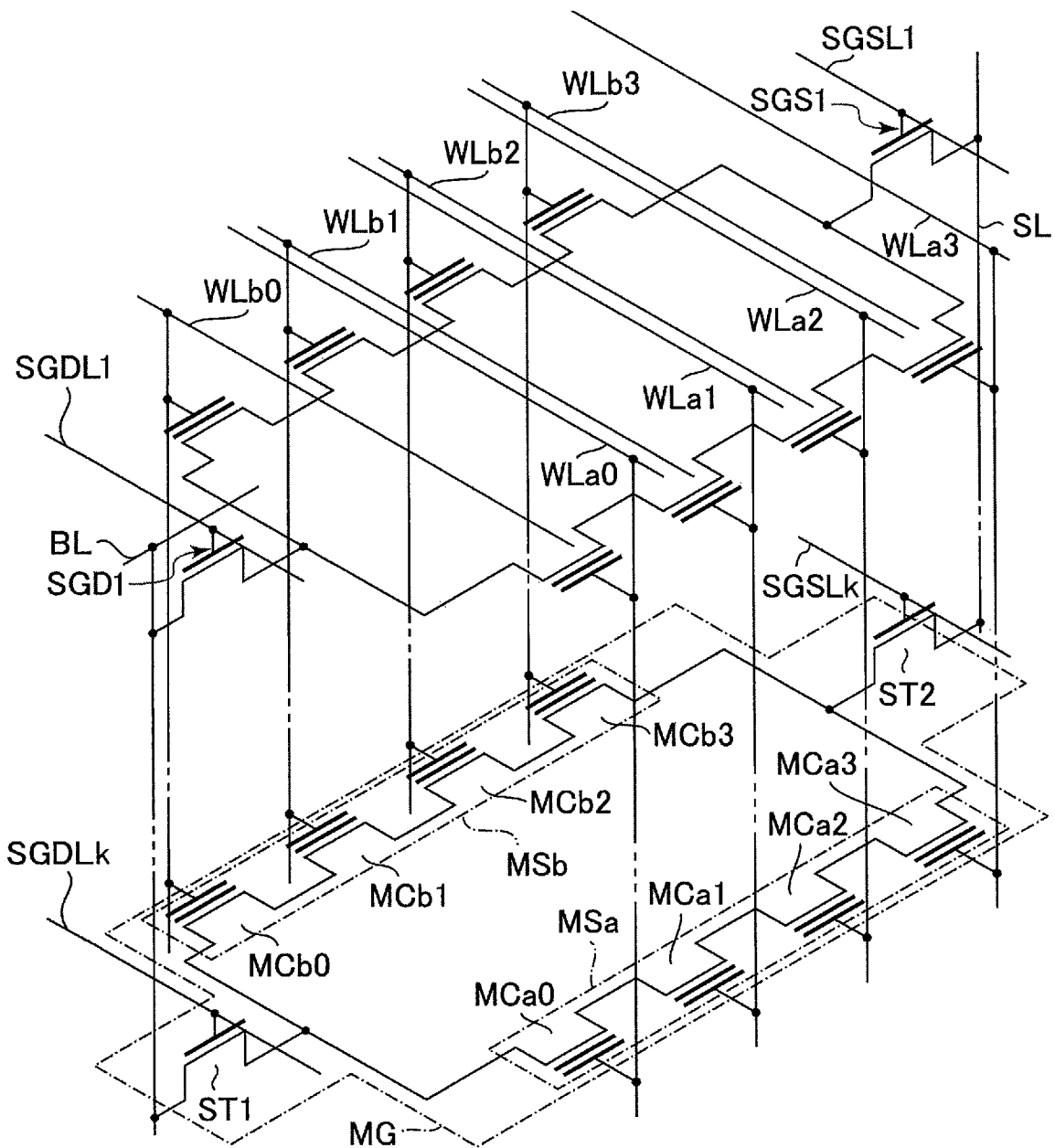
F I G. 3

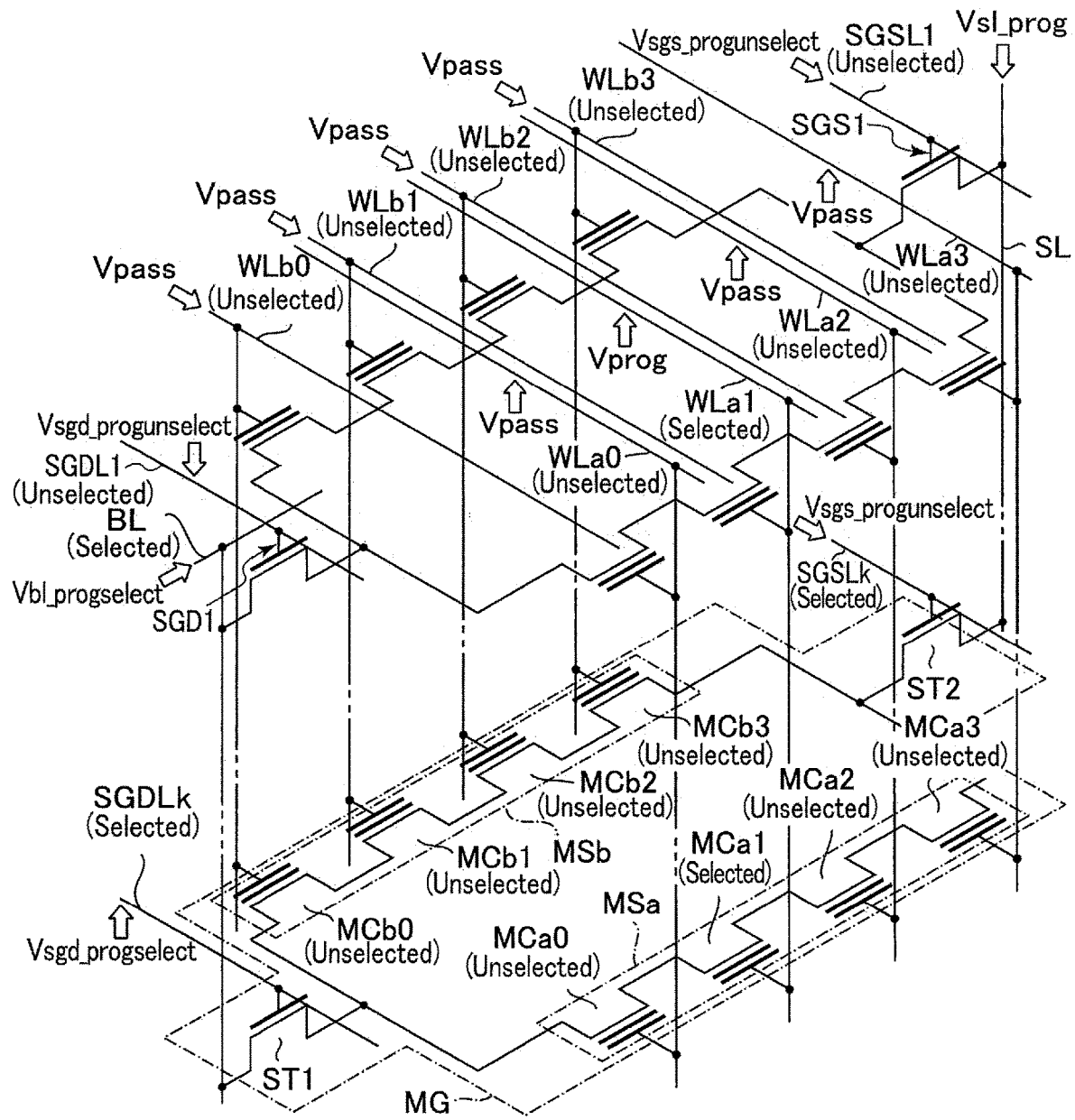
F I G. 29

SEMICONDUCTOR MEMORY DEVICE

CROSS-REFERENCE TO RELATED APPLICATION

This application is based upon and claims the benefit of priority from Japanese Patent Application No. 2018-227378, filed Dec. 4, 2018, the entire contents of which are incorporated herein by reference.

FIELD

Embodiments described herein relate generally to a semiconductor memory device.

BACKGROUND

NAND flash memories are known as semiconductor memory devices.

BRIEF DESCRIPTION OF THE DRAWINGS

FIG. 3 is a circuit diagram of the memory cell array included in the semiconductor memory device according to the first embodiment;

FIG. 29 is a circuit diagram of the memory cell array of the semiconductor memory device according to the first embodiment, showing voltages of interconnects in a write operation;

DETAILED DESCRIPTION

In general, according to one embodiment, a semiconductor memory device includes: a conductive layer including a first portion extending in a first direction and a second portion electrically coupled to the first portion and extending in a second direction intersecting the first direction; a first contact plug extending in a third direction intersecting the first and second directions, and electrically coupled to the first portion; a first semiconductor layer extending in the second direction; a first insulating layer between the second portion and the first semiconductor layer, and between the first portion and the first semiconductor layer; a second contact plug extending in the third direction, and coupled to the first semiconductor layer in a region in which the first insulating layer is formed; a first interconnect extending in the third direction; and a first memory cell apart from the second portion in the second direction and storing information between the first semiconductor layer and the first interconnect.

1. First Embodiment

A semiconductor memory device according to a first embodiment will be described. As an example of the semiconductor memory device, a three-dimensionally stacked NAND-type flash memory, in which memory cell transistors are three-dimensionally stacked above a semiconductor substrate, will be described below.

1.1. Configuration

1.1.1. Overall Configuration of Semiconductor Memory Device

Figure 1:
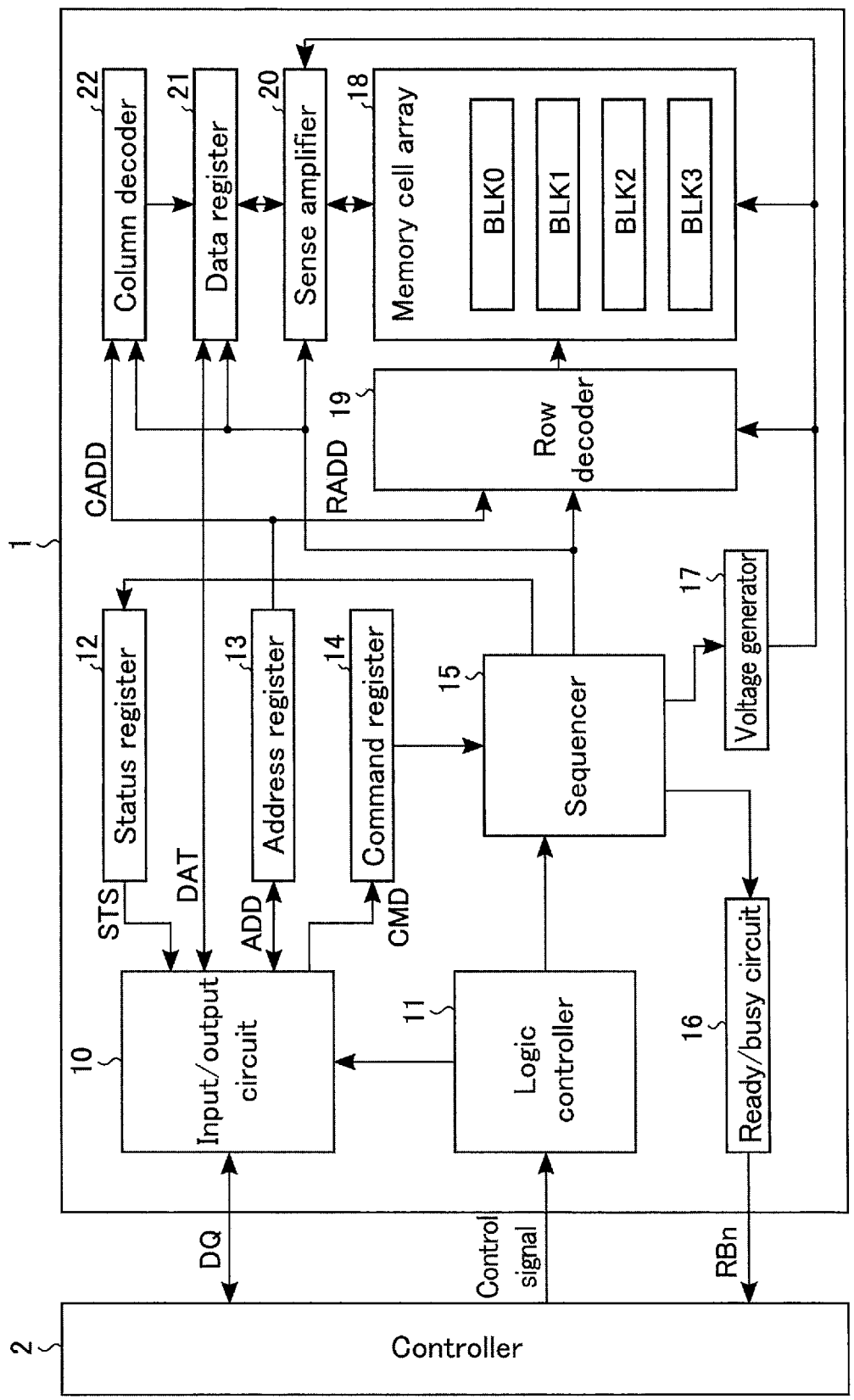
FIG. 1 is a block diagram of a semiconductor memory device according to a first embodiment.

The overall configuration of the semiconductor memory device will be described, with reference to FIG. 1. FIG. 1 is a block diagram showing an example of a basic overall configuration of the semiconductor memory device. In FIG. 1, some of the couplings between the blocks are indicated by arrows; however, the couplings between the blocks are not limited to those shown in FIG. 1.

As shown in FIG. 1, the semiconductor memory device 1 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls input and output of a signal DQ to and from an external controller 2. The signal DQ includes, for example, data DAT, an address ADD and a command CMD. More specifically, the input/output circuit 10 transmits the data DAT received from the external controller 2 to the data register 21, transmits the address ADD to the address register 13, and transmits the command CMD to the command register 14. The input/output circuit 10 also transmits status information STS received from the status register 12, the data DAT received from the data register 21, the address ADD received from the address register 13, etc. to the external controller 2.

The logic controller 11 receives various control signals from the external controller 2. The logic controller 11 controls the input/output circuit 10 and the sequencer 15 in accordance with the received control signal.

The status register 12 temporarily holds, for example, status information STS in a write operation, a read operation, and an erase operation, and notifies the external controller 2 as to whether or not the operation has been normally completed.

The address register 13 temporarily holds the received address ADD. The address register 13 transfers a row address RADD to the row decoder 19, and transfers a column address CADD to the column decoder 22.

The command register 14 temporarily stores the received command CMD, and transfers the command CMD to the sequencer 15.

The sequencer 15 controls the entire operation of the semiconductor memory device 1. More specifically, the sequencer 15 controls the status register 12, the ready/busy circuit 16, the voltage generator 17, the row decoder 19, the sense amplifier 20, the data register 21, the column decoder 22, etc. in accordance with the received command CMD, and performs a write operation, a read operation, an erase operation, etc.

The ready/busy circuit 16 transmits a ready/busy signal RBn to the external controller 2, in accordance with the operation status of the sequencer 15.

Under the control of the sequencer 15, the voltage generator 17 generates voltages required for the write, read and erase operations, and supplies the generated voltages to, for example, the memory cell array 18, the row decoder 19, the sense amplifier 20, etc. The row decoder 19 and the sense amplifier 20 apply voltages supplied from the voltage generator 17 to the memory cell transistors in the memory cell array 18.

The memory cell array 18 includes a plurality of blocks BLK (BLK0 to BLK3) each including a plurality of non-volatile memory cell transistors (also referred to as "memory cells" hereinafter) associated with the rows and columns. Each of the blocks BLK includes a plurality of memory units MU. Each of the memory units MU includes a plurality of memory groups MG. The number of blocks BLK in the memory cell array 18, the number of memory units MU in each block BLK, and the number of memory groups MG in each memory unit MU may be set freely. The memory cell array 18 will be described in detail later.

The row decoder 19 decodes the row address RADD. Based on the result of decoding, the row decoder 19 applies a required voltage to the memory cell array 18.

In a read operation, the sense amplifier 20 senses data read from the memory cell array 18. The sense amplifier 20 transmits the read data to the data register 21. In a write operation, the sense amplifier 20 transmits write data to the memory cell array 18.

The data register 21 includes a plurality of latch circuits. The latch circuits temporarily hold write data or read data.

In a write operation, a read operation, an erase operation, etc., the column decoder 22 decodes the column address CADD, and selects latch circuits in the data register 21, in accordance with the result of decoding.

1.1.2. Overall Configuration of Memory Cell Array

Figure 2:
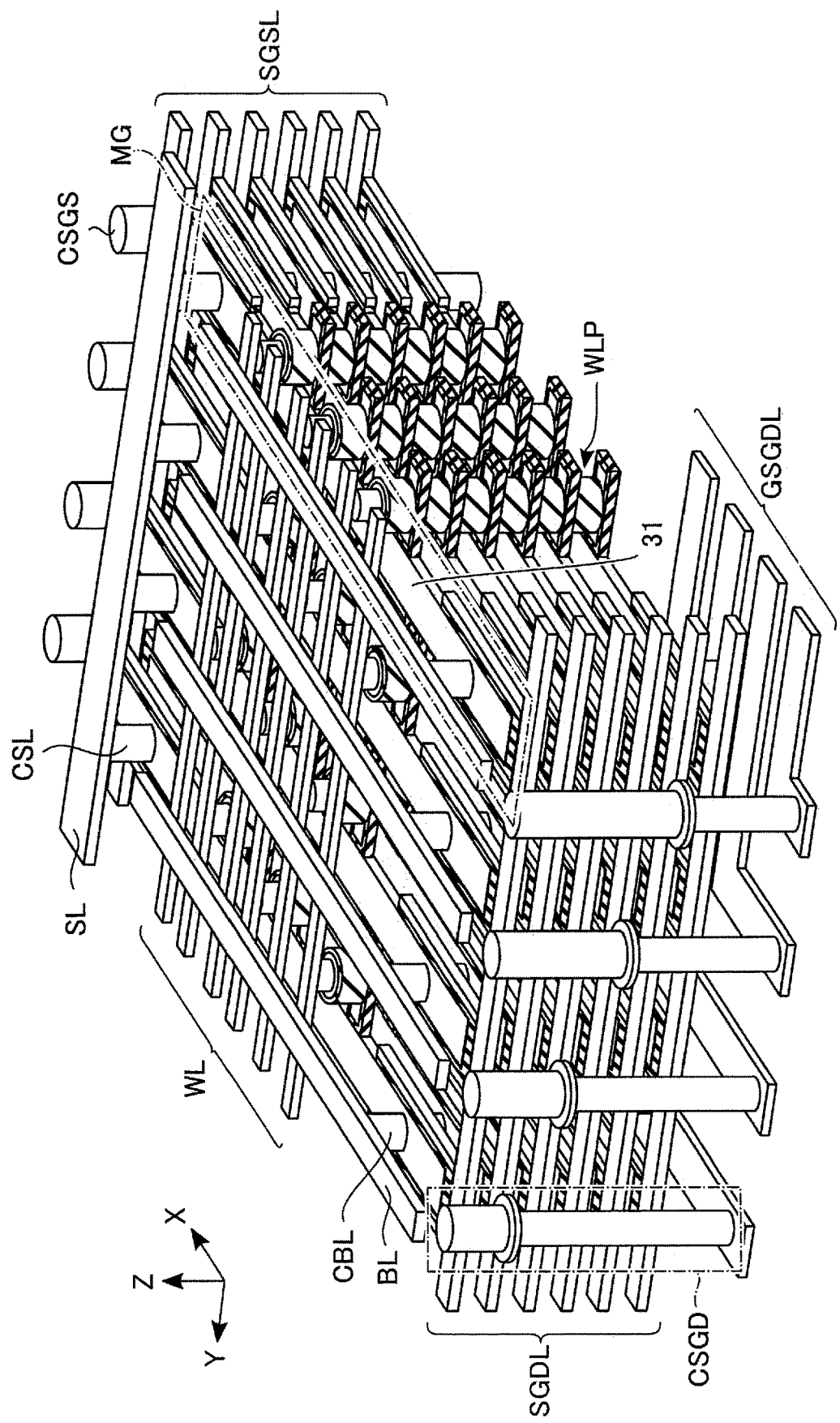
FIG. 2 is a perspective view of a memory cell array included in the semiconductor memory device according to the first embodiment.

Next, the overall configuration of the memory cell array 18 will be described, with reference to FIG. 2. FIG. 2 is a perspective view of the memory cell array 18. In the example of FIG. 2, insulating layers are partly omitted.

As shown in FIG. 2, the memory cell array 18 includes a plurality of semiconductor layers 31, a plurality of word line pillars WLP, a plurality of word lines WL, a plurality of select gate SGD and SGS, a plurality of contact plugs CSGD and CSGS, a plurality of select gate lines SGDL and SGSL, a plurality of global select gate lines GSGDL and GSGSL, a plurality of contact plugs CBL, a plurality of bit lines BL, a plurality of contact plugs CSL, and a source line SL.

Each of the semiconductor layers 31 corresponds to one memory group MG (to be described later) and functions as an active area where a channel layer of a plurality of memory cell transistors MC and select transistors ST1 and ST2 is formed. The semiconductor layers 31 extend in X direction, which is parallel to the semiconductor substrate, and are stacked in Z direction, which is perpendicular to the semiconductor substrate, so as to be apart from each other (with an unillustrated insulating layer interposed therebetween). At each layer as viewed in the Z direction, the semiconductor layers 31 are aligned along Y direction, which is parallel to the semiconductor substrate and intersects the X direction.

The word line pillars WLP are arranged along the X direction so as to extend in the Z direction, between the semiconductor layers 31 arranged in the Y direction. In other words, the word line pillars WLP arranged along the X direction and the groups of semiconductor layers 31 stacked in the Z direction are alternately arranged along the Y direction. The word lines WL are provided above the word line pillars WLP, so as to extend in the Y direction. A block insulating film, a charge storage layer, and a tunnel insulating firm are provided between each word line pillar WLP and the corresponding semiconductor layer 31, at the same layer as the semiconductor layer 31.

One memory cell transistor MC is provided at the intersection of each word line pillar WLP and the corresponding semiconductor layer 31. Accordingly, a plurality of memory cell transistors MC are coupled in the X direction via each semiconductor layer 31. In other words, channels of the memory cell transistors MC are coupled in the X direction.

Each of the contact plugs CBL is provided in the vicinity of one-end portions, as viewed in the X direction, of the corresponding group of semiconductor layers 31 stacked in the Z direction, so as to penetrate the group of semiconductor layers 31 stacked in the Z direction. Each contact plug CBL is commonly coupled to the semiconductor layers 31 stacked in the Z direction. The contact plugs CBL are provided for the respective groups of semiconductor layers 31 arranged along the Y direction. Each of the bit lines BL is provided above the corresponding contact plug CBL, so as to extend in the X direction. The contact plugs CBL are coupled to different bit lines BL.

Each of the contact plugs CSL is provided in the vicinity of the other-end portions, as viewed in the X direction, of the corresponding group of semiconductor layers 31 stacked in the Z direction, so as to penetrate the group of semiconductor layers 31 stacked in the Z direction. Each contact plug CSL is commonly coupled to the group of semiconductor layers 31 stacked in the Z direction. The contact plugs CSL are provided for the respective groups of semiconductor layers 31 arranged along the Y direction. The source line SL is provided above the contact plugs CSL, so as to extend in the Y direction. The contact plugs CSL are commonly coupled to the source line SL.

The select gates SGD are respectively formed at the one-end portions in which the contact plugs CBL are provided, as viewed in the X direction, of the groups of semiconductor layers 31 arranged along the Y direction at each layer, via different insulating layers. The select gates SGD arranged at the same layer are commonly coupled to a select gate line SGDL extending in the Y direction. Accordingly, the semiconductor layers 31 and the select gate lines SGDL are not electrically coupled to each other. Similarly, the select gates SGS are respectively formed at the other-end portions in which the contact plugs CSL are provided, as viewed in the X direction, of the groups of semiconductor layers 31, via different insulating layers. The select gates SGS arranged at the same layer commonly coupled to a select gate line SGSL extending in the Y direction. Accordingly, the semiconductor layers 31 and the select gate line SGSL are not electrically coupled to each other. The select gate lines SGDL and SGSL are stacked in such a manner that each of the select gate lines SGDL and SGSL is arranged at the same layer as the corresponding group of semiconductor layers 31 stacked in the Z direction.

The global select gate lines GSGDL are formed along the XY plane, below the semiconductor layers 31 stacked in the Z direction and the select gate lines SGDL.

At the intersection of the select gate line SGDL and the global select gate line GSGDL, the corresponding contact plug CSGD is provided so as to extend in the Z direction. The contact plugs CSGD are arranged along the Y direction. Each of the contact plugs CSGD includes a coupling portion that is electrically coupled to a corresponding one of the select gate lines SGDL. That is, each contact plug CSGD electrically couples a corresponding global select gate line GSGDL and a corresponding select gate line SGDL. In the example of FIG. 2, the coupling portions of the contact plugs CSGD arranged along the Y direction are respectively coupled to the select gate lines SGDL at different layers.

The global select gate lines GSGSL (not shown in FIG. 2) are formed along the XY plane, below the semiconductor layers 31 stacked in the Z direction and the select gate lines SGSL.

A contact plug CSGS is arranged at the intersection of the select gate line SGSL and the global select gate lines GSGSL, so as to extend in the Z direction. The contact plugs CSGS are arranged along the Y direction. Each of the contact plugs CSGS includes a coupling portion that is electrically coupled to a corresponding one of the select gate lines SGSL. That is, each contact plug CSGS electrically couples a corresponding global select gate line GSGSL and a corresponding select gate line SGSL.

A plurality of memory groups MG (semiconductor layers 31) arranged along the Y direction and corresponding to one of the select gate lines SGDL and one of the select gate lines SGSL, are included in one memory unit MU. Furthermore, a plurality of memory units MU commonly coupled to word line pillars WLP are included in one block BLK.

1.1.3. Circuit Configuration of Memory Cell Array

Figure 4:
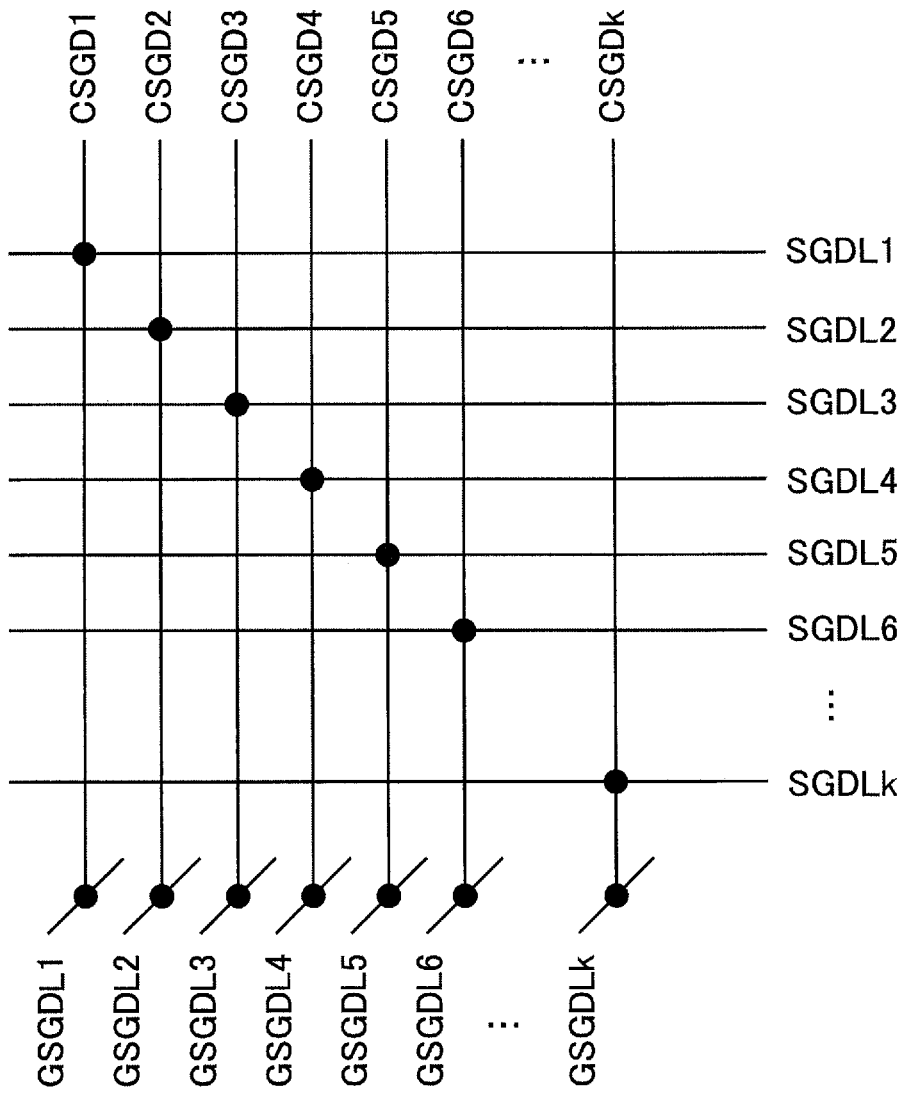
FIG. 4 is a circuit diagram showing coupling of select gate lines SGDL in the memory cell array included in the semiconductor memory device according to the first embodiment.
Figure 5:
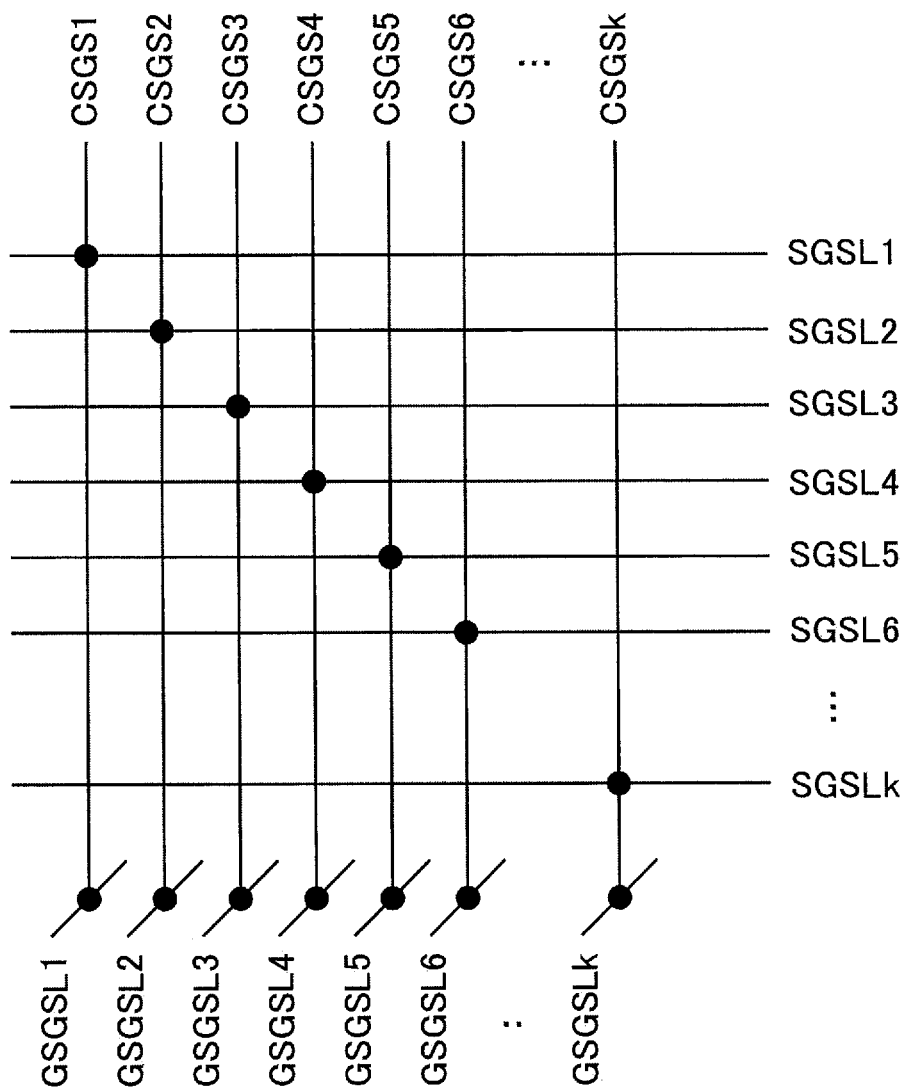
FIG. 5 is a circuit diagram showing coupling of select gate lines SGSL in the memory cell array included in the semiconductor memory device according to the first embodiment.

Next, a circuit configuration of the memory cell array 18 will be described, with reference to FIGS. 3 to 5. FIG. 3 is a circuit diagram of the memory cell array 18. FIG. 4 is a circuit diagram showing couplings between the select gate lines SGDL and the global select gate lines GSGDL. FIG. 5 is a circuit diagram showing couplings between the select gate lines SGSL and the global select gate lines GSGSL. FIG. 3 shows, as an example, a plurality of memory groups MG respectively corresponding to a plurality of semiconductor layers 31 stacked in the Z direction and commonly coupled to one contact plug CBL. FIG. 4 shows a case, as an example, where contact plugs CSGD and global select gate lines GSGDL are coupled to the respective select gate lines SGDL stacked in the Z direction. FIG. 5 shows, as an example, contact plugs CSGS and global select gate lines GSGSL coupled to the respective select gate lines SGSL stacked in the Z direction. Hereinafter, the select gate lines corresponding to the uppermost semiconductor layers 31 (memory groups MG) will be respectively referred to as "SGDL1" and "SGSL1", and select gate lines corresponding to the lowermost semiconductor layers 31 (memory groups MG) will be respectively referred to as "SGDLk" and "SGSLk" (where k is an integer of 2 or more).

As shown in FIG. 3, the memory cell array 18 includes a plurality of memory groups MG. Each of the memory groups MG includes two memory strings MSa and MSb, and select transistors ST1 and ST2. Hereinafter, the memory strings MSa and MSb will be collectively referred to as "memory strings MS", if they need not be distinguished from each other.

The memory string MSa includes, for example, four memory cell transistors MCa0 to MCa3. Similarly, the memory string MSb includes, for example, four memory cell transistors MCb0 to MCb3. Hereinafter, the memory cell transistors MCa0 to MCa3 and MCb0 to MCb3 will be collectively referred to as "memory cell transistors MC", if they need not be distinguished from each other.

Each of the memory cell transistors MC includes a control gate and a charge storage layer, and stores data in a non-volatile manner. The memory cell transistors MC may be either MONOS-type transistors, in which a dielectric film is used as the charge storage layer, or floating gate (FG) type transistors, in which a conductive film is used as the charge storage layer. The number of memory cell transistors MC included in each memory string MS may be 8, 16, 32, 48, 64, 96, 128, etc., and is not limited to a particular number.

The current paths of the memory cell transistors MCa0 to MCa3 included in the memory string MSa are coupled in series. Similarly, the current paths of the memory cell transistors MCb0 to MCb3 included in the memory string MSb are coupled in series. The drains of the memory cell transistors MCa0 and MCb0 are commonly coupled to the source of the select transistor ST1. The sources of the memory cell transistors MCa3 and MCb3 are commonly coupled to the drain of the select transistor ST2. The number of select transistors ST1 and ST2 included in each memory group MG may be set freely, and only need be at least one.

The gates of the memory cell transistors MC of a plurality of memory groups MG arranged along the Z direction are commonly coupled to one word line WL via the respective word line pillars WLP. More specifically, the gates of, for example, memory cell transistors MCa0 arranged along the Z direction are commonly coupled to the word line WLa0. Similarly, the gates of the memory cell transistors MCa1, MCa2 and MCa3 are respectively coupled to the word lines WLa1, WLa2 and WLa3. The gates of the memory cell transistors MCb0 to MCb3 are respectively coupled to the word lines WLb0 to WLb3.

The drains of the select transistors ST1 of the memory groups MG arranged along the Z direction are commonly coupled to one bit line BL via the respective contact plug CBL. The select gates SGD of the select transistors ST1 of the memory groups MG arranged along the Z direction are coupled to different select gate lines SGDL. More specifically, for example, the select gate SGD (SGD1) of, for example, the select transistor ST1 corresponding to the memory group MG arranged at the uppermost layer is coupled to the select gate line SGDL1. The select gate SGD (SGDk) of the select transistor ST1 corresponding to the memory group MG arranged at the lowermost layer is coupled to the select gate line SGDLk.

The sources of the select transistors ST2 of the memory groups MG arranged along the Z direction are commonly coupled to one source line SL via the respective contact plug CSL. The select gates SGS of the select transistors ST2 of the memory groups MG arranged along the Z direction are coupled to different select gate lines SGSL. More specifically, the select gate SGS (SGS1) of the select transistor ST2 corresponding to the memory group MG arranged at the uppermost layer is coupled to the select gate line SGSL1, and the select gate SGS (SGSk) of the select transistor ST2 corresponding to the memory group MG arranged at the lowermost layer is coupled to the select gate line SGSLk.

Next, a description will be given of couplings between the select gate lines SGDL, the contact plugs CSGD, and the global select gate lines GSGDL. Hereinafter, the contact plugs CSGD corresponding to the respective select gate lines SGDL1 to SGDLk stacked in the Z direction will be respectively referred to as "CSGD1" to "CSGDk", and the global select gate lines GSGDL will be referred to as "GSGDL1" to "GSGDLk".

As shown in FIG. 4, the select gate line SGDL1 is coupled to the global select gate line GSGDL1 via the contact plug CSGD1. The same is true of the other select gate lines SGDL. That is, the select gate lines SGDL stacked in the Z direction are coupled to different global select gate lines GSGDL via different contact plugs CSGD.

Next, a description will be given of couplings between the select gate lines SGSL, contact plugs CSGS, and the global select gate lines GSGSL. Hereinafter, the contact plugs CSGS corresponding to the respective select gate lines SGSL1 to SGSLk stacked in the Z direction will be respectively referred to as "CSGS1" to "CSGSk", and the global select gate lines GSGSL will be referred to as "GSGSL1" to "GSGSLk".

As shown in FIG. 5, the select gate line SGSL1 is coupled to the global select gate line GSGSL1 via the contact plug CSGS1. The same is true of the other select gate lines SGSL. That is, the select gate lines SGSL stacked in the Z direction are coupled to different global select gate lines GSGSL via different contact plugs CSGS.

1.1.4. Plane Configuration of Memory Cell Array

Next, a description will be given of an example of a plane configuration of the memory cell array 18.

1.1.4.1. Layout of Semiconductor Layers and Select Gate Lines

Figure 6:
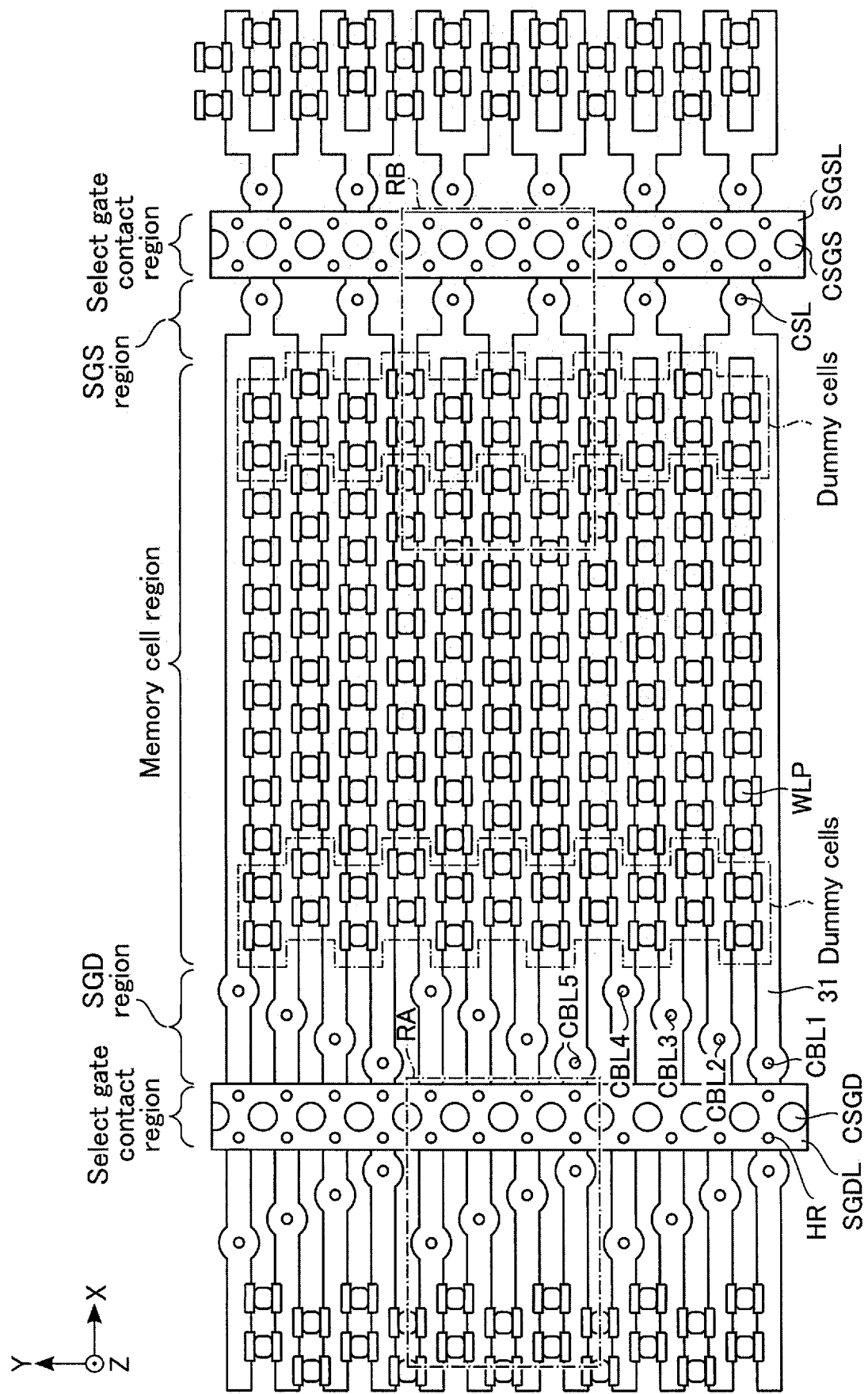
FIG. 6 is a top view of semiconductor layers in the memory cell array included in the semiconductor memory device according to the first embodiment.

A description will be given of the layout of the semiconductor layers 31 at the uppermost layer and the select gate lines SGDL and SGSL corresponding thereto, with reference to FIG. 6. FIG. 6 is a top view of the semiconductor layers 31 at the uppermost layer and the select gate lines SGDL and SGSL corresponding thereto. In the example of FIG. 6, insulating layers are partly omitted.

As shown in FIG. 6, the memory cell array 18 includes a memory cell region, an SGD region, an SGS region, a select gate contact region corresponding to the select gate lines SGDL, and a select gate contact region corresponding to the select gate lines SGSL. The memory cell transistors MC are provided in the memory cell region, namely, the word line pillars WLP are arranged in in the memory cell region. The SGD region is provided adjacent to the memory cell region as viewed in the X direction, and functions as a coupling area between the semiconductor layers 31 and the contact plugs CBL. The select transistors ST1 are provided in the SGD region. The SGS region is provided adjacent to the memory cell region in the X direction, and functions as a coupling area between the semiconductor layers 31 and the contact plugs CSL. The select transistors ST2 are provided in the SGS region. The select gate contact region corresponding to the select gate lines SGDL is provided adjacent to the BL region as viewed in the X direction, and couples the contact plugs CSGD and the select gate lines SGDL. The select gate contact region corresponding to the select gate lines SGSL is provided adjacent to the SL region as viewed in the X direction and couples the contact plugs CSGS and the select gate lines SGSL. The number of memory cell regions, SGD regions, SGS regions, select gate contact regions corresponding to the select gate lines SGDL, and select gate contact regions corresponding to the select gate lines SGSL, included in the memory cell array 18 may be set freely.

In the memory cell region, a plurality of (12 in the example of FIG. 6) semiconductor layers 31 are arranged along the Y direction so as to extend in the X direction. A plurality of (12 in the example of FIG. 6) word line pillars WLP are arranged along the X direction, between two semiconductor layers 31. The word line pillars WLP are arranged in a staggered fashion as viewed in the Y direction. For example, the word line pillars WLP1 and WLP2 are arranged adjacent to each other as viewed in the X direction, the word line pillar WLP3 is arranged between the word line pillars WLP1 and WLP2 as viewed in the X direction, and the word line pillars WLP1 and WLP2 are arranged at different positions as viewed in the Y direction.

In the example of FIG. 6, of the 12 word line pillars WLP arranged along the X direction between two semiconductor layers 31, two word line pillars WLP arranged at either end correspond to dummy memory cell transistors DMC (hereinafter also referred to as "dummy cells"). In other words, two dummy memory cell transistors DMC, eight memory cell transistors MC, and two dummy memory cell transistors DMC are arranged in this order along the X direction. For example, the dummy memory cell transistors DMC are used to electrically couple the channel regions of memory cell transistors MC, formed in the semiconductor layers 31 in the memory cell region, and the select transistors ST1 and ST2, formed in the semiconductor layers 31 in the SGD and SGS regions. The number of dummy memory cell transistors DMC may be set freely, and may even be zero.

In the SGD region, a select gate SGD is provided on the sides of each semiconductor layer 31, with a gate oxide film interposed therebetween (to be described in detail later).

Furthermore, a plurality of (12 in the example of FIG. 6) contact plugs CBL are provided so as to be coupled to the respective groups of semiconductor layers 31 arranged along the Y direction. In the example of FIG. 6, the contact plugs CBL are arranged in four rows in a staggered manner along the Y direction. In other words, a four-row pattern in which four contact plugs CBL adjacent to each other in the Y direction are arranged with their positions varying in the X direction, is repeated as viewed in the Y direction.

The four-row staggered arrangement will be described below. The contact plugs CBL1 to CBL4 are arranged, for example, with their positions shifted in sequence in the X direction. More specifically, the contact plug CBL2 adjacent to the contact plug CBL1 is provided at a position different from the contact plug CBL1 as viewed in the X direction. The contact plug CBL3 adjacent to the contact plug CBL2 is provided at a position different from the contact plugs CBL1 and CBL2 as viewed in the X direction. Similarly, the contact plug CBL4 adjacent to the contact plug CBL3 is provided at a position different from the contact plugs CBL1, CBL2 and CBL3 as viewed in the X direction.

The contact plugs CBL1 to CBL4 are arranged in such a manner, for example, that the distance between the contact plugs CBL1 and CBL2, the distance between the contact plugs CBL2 and CBL3, and the distance between the contact plugs CBL3 and CBL4 as viewed in the X direction are substantially the same.

The above-described four-row staggered arrangement is repeated as viewed in the Y direction. For example, the contact plug CBL5 adjacent to the contact plug CBL4 as viewed in the Y direction is placed at the same position as the contact plug CBL1 as viewed in the X direction.

In the four-row staggered arrangement, the positions of the contact plugs CBL1 to CBL4 as viewed in the X direction may be set freely. For example, the contact plugs CBL1 to CBL4 need not be arranged at regular intervals in the X direction, but may be arranged in a different order in the X direction. The arrangement of the contact plugs CBL is not limited to the four-row staggered arrangement. For example, the contact plugs CBL may be arranged in a line along the Y direction, and may be staggered in two or more rows.

In the SGS region, a select gate SGS is provided on the sides of each semiconductor layer 31, with a gate oxide film interposed therebetween (to be described in detail later).

In addition, two semiconductor layers 31 adjacent to each other along the Y direction are bundled into a single entity, and commonly coupled to one contact plug CSL. In the example of FIG. 6, two semiconductor layers 31 are commonly coupled to one contact plug CSL; however, the configuration is not limited thereto. For example, one contact plug CSL may be provided for one semiconductor layer 31, and three or more semiconductor layers 31 may be bundled and commonly coupled to one contact plug CSL.

In the select gate contact region corresponding to the select gate lines SGDL, a plurality of contact plugs CSGD are provided along the Y direction. Each of the contact plugs CSGD penetrates the select gate lines SGDL stacked in the Z direction, and is electrically coupled to a corresponding one of the select gate lines SGDL stacked in the Z direction.

In the select gate contact region corresponding to the select gate lines SGDL, a plurality of dummy pillars HR that penetrate the select gate lines SGDL stacked in the Z direction are also provided. The arrangement of the dummy pillars HR is optional. The dummy pillars HR are formed of insulating layers, and are not electrically coupled to the other interconnects. The dummy pillars HR function as pillars for supporting interlayer insulating films when a gap is formed therebetween in an etching step (to be described later).

Similarly, in the select gate contact region corresponding to the select gate lines SGSL, a plurality of contact plugs CSGS are provided along the Y direction. Each of the contact plugs CSGS penetrates the select gate lines SGSL stacked in the Z direction, and is electrically coupled to a corresponding one of the select gate lines SGSL stacked in the Z direction.

In the select gate contact region corresponding to the select gate lines SGSL, a plurality of dummy pillars HR that penetrate the select gate lines SGSL stacked in the Z direction are also provided, as in the select gate contact region corresponding to the select gate lines SGDL.

1.1.4.2. Layout of Word Lines and Source Line

Figure 7:
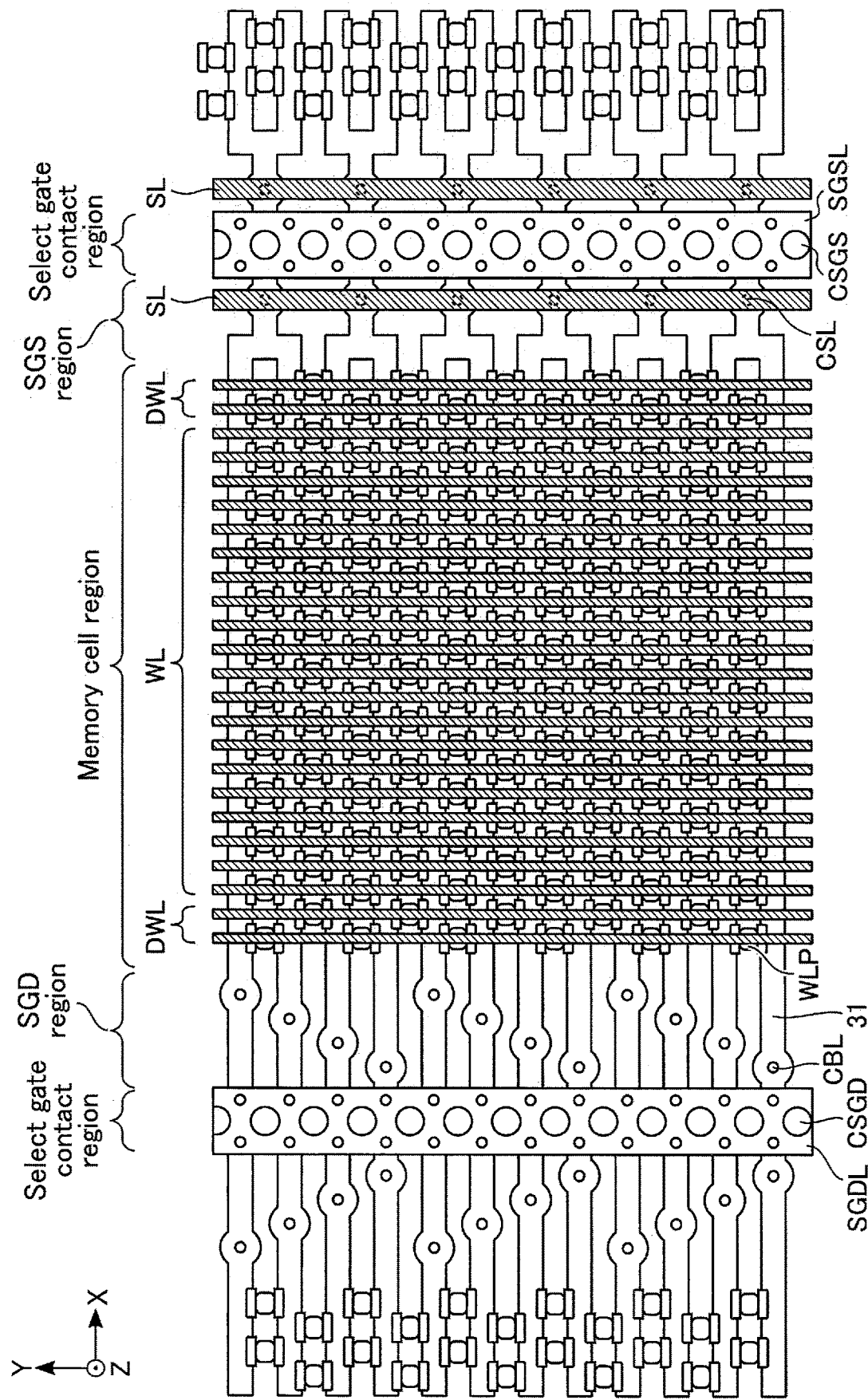
FIG. 7 is a top view of word lines and a source line in the memory cell array included in the semiconductor memory device according to the first embodiment.

Next, a description will be given of the layout of the word lines WL and the source line SL. FIG. 7 is a top view of the word lines WL and the source line SL. FIG. 7 shows a case, as an example, where the word lines WL and the source line SL are formed at the same layer. In the example of FIG. 7, insulating layers are partly omitted.

As shown in FIG. 7, in the memory cell region, a plurality of (24 in the example of FIG. 7) word lines WL extend in the Y direction, and are arranged along the X direction. The word lines WL are provided above a plurality of word line pillars WLP, and are electrically coupled to the word line pillars WLP provided therebelow. FIG. 7 shows a case, as an example, where the pitch of the word lines WL (i.e., the interval between two adjacent word lines WL) as viewed in the X direction is ½ of the pitch of the word line pillars WLP arranged along the X direction. The pitch of the word lines WL can be freely set. For example, the pitch of the word lines WL may be ¼ of the pitch of the word line pillars WLP.

Furthermore, FIG. 7 shows a case where four word lines WL in total, two of which arranged at either end, of the 24 word lines WL, correspond to dummy word lines DWL. The number and the arrangement of the dummy word lines DWL may be set freely. For example, the number of dummy word lines DWL may be zero.

In the SGS region, the source line SL is provided so as to extend in the Y direction. The source line SL is provided on the contact plugs CSL, and is electrically coupled to the contact plugs CSL provided therebelow.

1.1.4.3. Layout of Bit Lines

Figure 8:
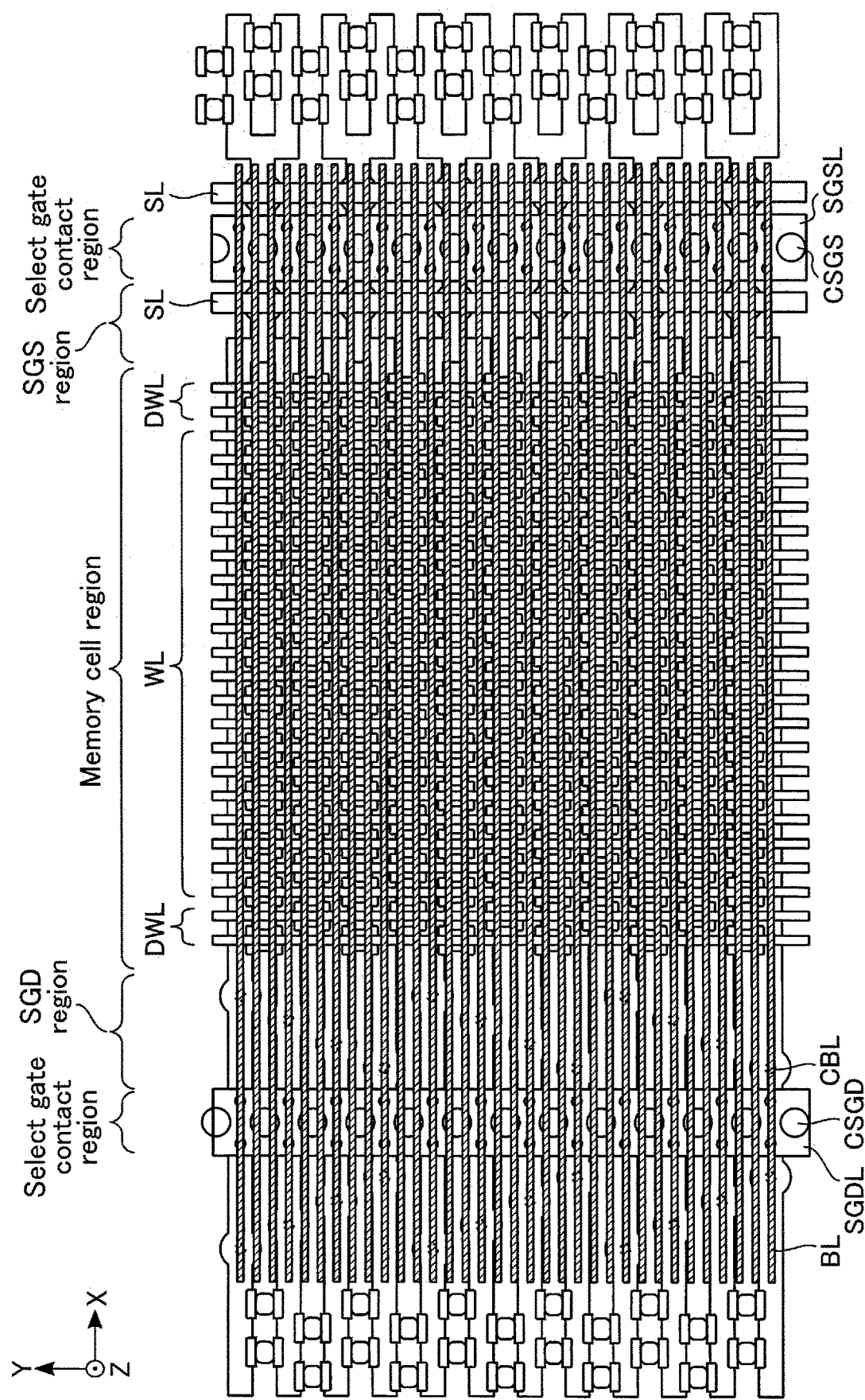
FIG. 8 is a top view of bit lines in the memory cell array included in the semiconductor memory device according to the first embodiment.

Next, a description will be given of the layout of the bit lines BL, with reference to FIG. 8. FIG. 8 is a top view of the bit lines BL. FIG. 8 shows a case, as an example, where the bit lines BL are provided above the word lines WL and the source line SL. In the example of FIG. 8, insulating layers are partly omitted.

As shown in FIG. 8, a plurality of (e.g., 33 in FIG. 8) bit lines BL are arranged along the Y direction above the word lines WL and the source line SL, so as to extend in the X direction. The bit lines BL are provided above the contact plugs CBL, and are electrically coupled to the contact plugs CBL provided therebelow. FIG. 8 shows a case, as an example, where the pitch of the bit lines BL (i.e., the interval between two adjacent bit lines BL) as viewed in the Y direction is ¼ of the pitch of the contact plugs CBL as viewed in the Y direction. The pitch of the bit lines BL can be freely set. For example, the pitch of the bit lines BL may be ½ of the pitch of the contact plugs CBL.

1.1.4.4 Layout of Global Select Gate Lines

Figure 9:
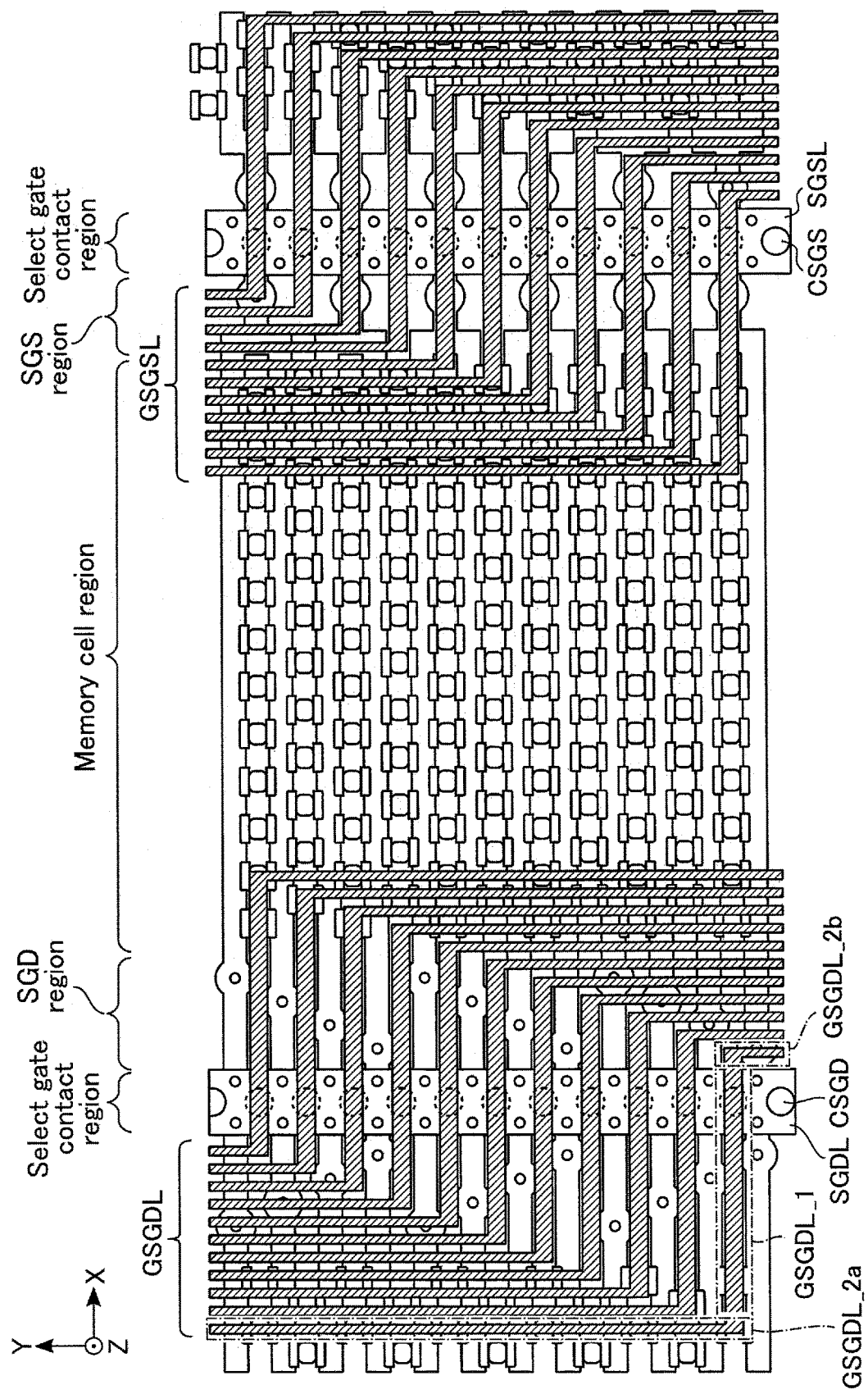
FIG. 9 is a schematic diagram showing global select gate lines in the memory cell array included in the semiconductor memory device according to the first embodiment.

Next, a description will be given of the layout of the global select gate lines GSGDL and GSGSL, with reference to FIG. 9. FIG. 9 is a schematic diagram showing an arrangement of the global select gate lines GSGDL and GSGSL in the memory cell array 18. The global select gate lines GSGDL and GSGSL are provided at, for example, the lowermost layer of the memory cell array 18. In the example of FIG. 9, insulating layers are partly omitted.

As shown in FIG. 9, each of the global select gate lines GSGDL includes a first portion GSGDL_1 extending in the X direction and coupled to the corresponding contact plug CSGD, and two second portions GSGDL_2a and GSGDL_2b coupled to the respective ends of the first portion GSGDL_1 and extending in the Y direction. More specifically, each global select gate line GSGDL includes a second portion GSGDL_2a coupled to one end of the first portion GSGDL_1 and extending in the Y direction (upward direction as viewed in FIG. 9), and a second portion GSGDL_2b coupled to the other end of the first portion GSGDL_1 and extending in the Y direction (downward direction as viewed in FIG. 9). In other words, the global select gate lines GSGDL extending in the Y direction are bent in the X direction, and are coupled to the respective contact plugs CSGD. After being coupled to the contact plug CSGD, the global select gate lines GSGDL are bent and extend in the Y direction (this shape will be referred to as "crank shape" hereinafter).

In the global select gate lines GSGDL, the first portions GSGDL_1 are arranged along the Y direction, and the second portions GSGDL_2a and GSGDL_2b are arranged along the X direction.

The same is true of the global select gate lines GSGSL.

Figure 10:
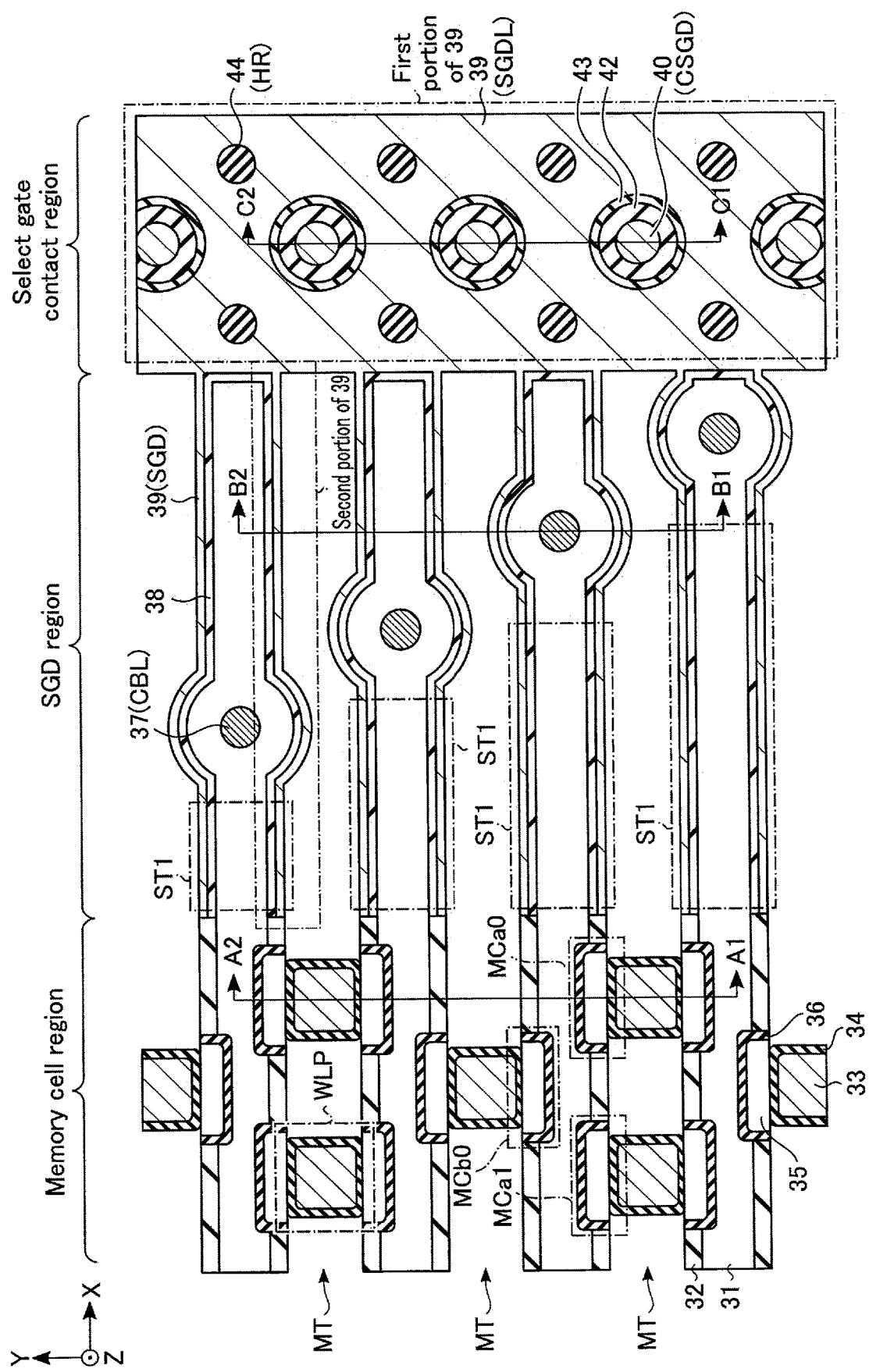
FIG. 10 is an enlarged view of a region RA shown in FIG. 6.

1.1.4.5. Details of Memory Cell Region, SGD Region, and Select Gate Contact Region Next, a description will be given of the details of the plane configuration of the memory cell array 18 in the memory cell region, the SGD region, and the select gate contact region corresponding to the select gate lines SGDL, with reference to FIG. 10. FIG. 10 is an enlarged view of the region RA shown in FIG. 6. In the example of FIG. 10, insulating layers are partly omitted. In addition, dummy memory cell transistors DMC are omitted in the example of FIG. 10, in order to simplify the description.

As shown in FIG. 10, a memory trench MT is provided between two semiconductor layers 31 arranged along the Y direction, and an insulating layer (not shown in FIG. 10) is embedded in the memory trench MT.

In the memory cell region, an insulating layer 32 is provided on the sides of each semiconductor layer 31. The insulating layer 32 functions as an etching stopper in forming an insulating layer 36 (tunnel insulating film) and a charge storage layer 35 (to be described later).

In the memory cell region, a plurality of word line pillars WLP are also provided, so as to isolate the memory trenches MT. Each of the word line pillars WLP includes a conductive layer 33 extending in the Z direction and an insulating layer 34 that is in contact with the sides of the conductive layer 33. The insulating layer 34 functions as a block insulating film of the memory cell transistor MC.

A charge storage layer 35 and an insulating layer 36 are provided between each word line pillar WLP and the corresponding semiconductor layer 31 as viewed in the Y direction, so as to isolate the insulating layer 32. The insulating layer 36 functions as a tunnel insulating film. More specifically, as viewed in the XY plane, one side of the charge storage layer 35 along the X direction is in contact with the insulating layer 34 of the word line pillar WLP, and the other sides (i.e., the other sides along the X direction and the two sides along the Y direction) of the charge storage layer 35 are in contact with the insulating layer 36. The sides of the insulating layer 36 are partly in contact with the semiconductor layer 31 and the insulating layer 32.

Therefore, the insulating layer 34, the charge storage layer 35, and the insulating layer 36 are formed in this order between the conductive layer 33 and the semiconductor layer 31. A region including part of the semiconductor layer 31, part of the conductive layer 33, part of the insulating layer 34, the charge storage layer 35, and the insulating layer 36 (also referred to as an "intersection area" between the semiconductor layer 31 and the word line pillar WLP) functions as a memory cell transistor MC. In the example of FIG. 10, an intersection area between each semiconductor layer 31 and the word line pillar WLP provided therebelow, as viewed in FIG. 10, functions as a memory cell transistor MCa, and an intersection area between each semiconductor layer 31 and the word line pillar WLP provided thereabove, as viewed in FIG. 10, functions as a memory cell transistor MCb. In addition, a plurality of memory cell transistors MCa corresponding to one semiconductor layer 31, for example, will be referred to as MCa0, MCa1, ... in the order of approaching the SGS region from the SGD region. The same is true of a plurality of memory cell transistors MCb0, MCb1, ....

In the SGD region, a conductive layer 37 is provided so as to penetrate the semiconductor layers 31. The conductive layer 37 functions as a contact plug CBL. In the example of FIG. 10, the semiconductor layer 31 is in the shape of a circle at the coupling area between the semiconductor layer 31 and the conductive layer 37. The shape of the semiconductor layer 31 in the coupling area between the semiconductor layer 31 and the conductive layer 37 may be set freely. The coupling area may be in the shape of, for example, a polygon. The coupling area may be in any shape that leaves a sufficient margin in the XY plane to prevent the hole of the contact plug CBL protruding from the semiconductor layer 31 by variation in manufacturing, etc., in processing the hole of the contact plug CBL so as to penetrate the semiconductor layer 31.

In the SGD region, an insulating layer 38 is provided so as to surround the sides of each semiconductor layer 31, namely, so as to be in contact with the ends of the semiconductor layer 31 as viewed in the X direction and the sides of the semiconductor layer 31 along the X direction. The insulating layer 38 functions as a gate insulating film of the select transistor ST1. One side of the insulating layer 38, opposed to the other side of the insulating layer 38 that is in contact with the semiconductor layer 31, is in contact with a conductive layer 39.

The conductive layer 39 functions as a select gate line SGDL. More specifically, the conductive layer 39 includes a first portion (SGDL) extending in the Y direction, and a plurality of second portions (SGD) provided in the SGD region so as to extend in the X direction in such a manner that one side of the second portion along the X direction is in contact with the insulating layer 38, and that one end of the second portion is coupled to the first portion of the conductive layer 39.

In the SGD region, a region ranging from the memory cell region to the conductive layer 37, including the semiconductor layer 31, the insulating layer 38, and the second portion of the conductive layer 39, functions as a select transistor ST1. More specifically, the second portion of the conductive layer 39 functions as a gate electrode of the select transistor ST1, the insulating layer 38 functions as a gate insulating film of the select transistor ST1, and a channel of the select transistor ST1 is formed in the semiconductor layer 31. Accordingly, the select transistors ST1 corresponding to the contact plugs CBL, arranged in four rows, differ in gate length.

In the select gate contact region, a conductive layer 40 and an insulating layer 44 are provided so as to penetrate the first portion of the conductive layer 39. The conductive layer 40 functions as a contact plug CSGD. The insulating layer 44 functions as a dummy pillar HR. The conductive layer 40 is electrically coupled to a corresponding one of the first portions of the conductive layers 39 stacked in the Z direction. The insulating layer 42 is provided in contact with the side (also referred to as "outer surface" hereinafter) of the conductive layer 40. The insulating layer 43 is formed in contact with the outer surface of the insulating layer 42.

Figure 11:
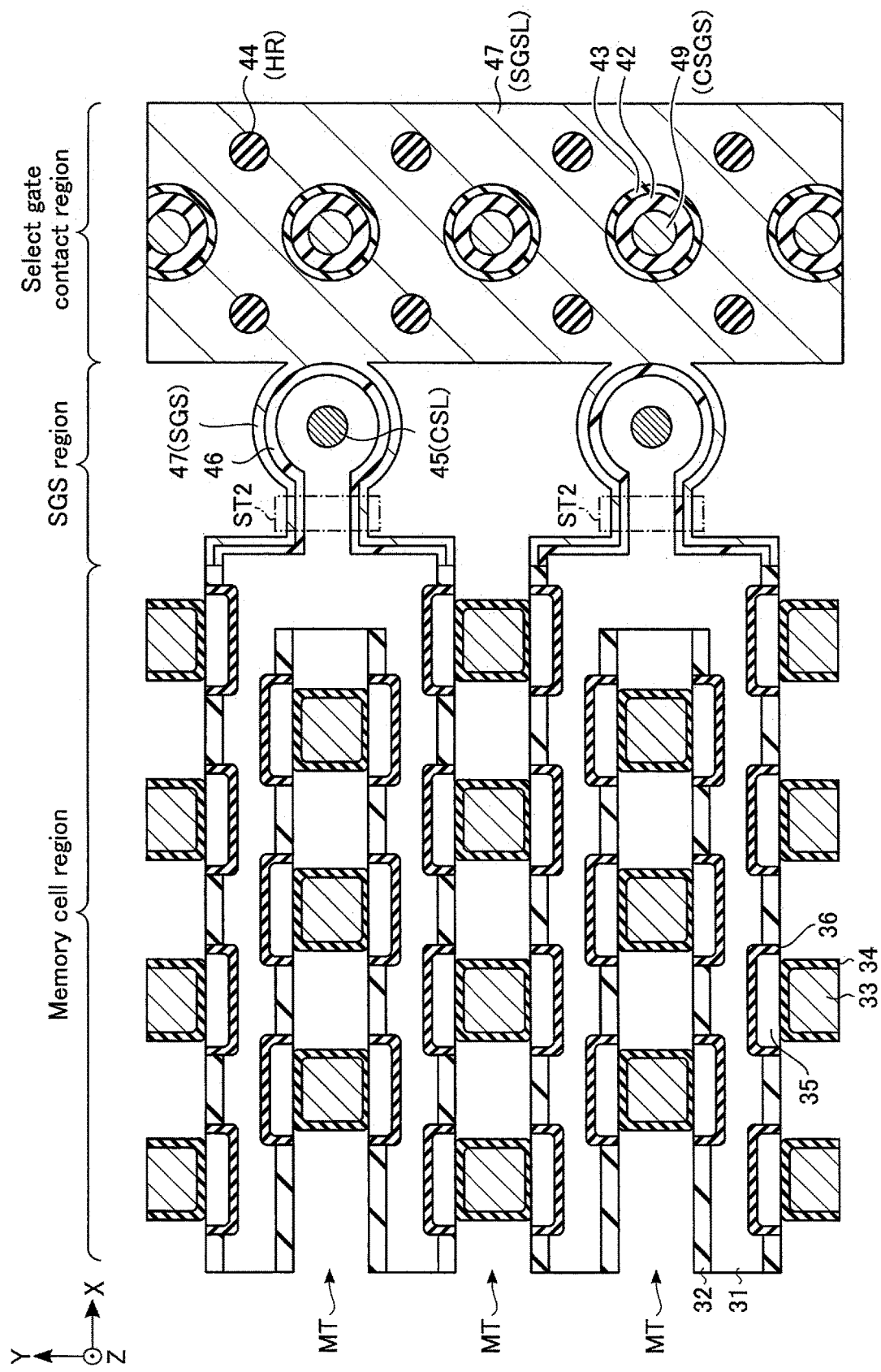
FIG. 11 is an enlarged view of a region RB shown in FIG. 6.

1.1.4.6. Details of Memory Cell Region, SGS Region and Select Gate Contact Region A description will be given of the details of the plane configuration of the memory cell array 18 in the memory cell region, the SGS region, and the select gate contact region corresponding to the select gate lines SGSL, with reference to FIG. 11. FIG. 11 is an enlarged view of the region RB shown in FIG. 6. In the example of FIG. 11, insulating layers are partly omitted. In addition, dummy memory cell transistors DMC are omitted in the example of FIG. 11, in order to simplify the description.

As shown in FIG. 11, two semiconductor layers 31 are commonly coupled in the vicinity of the SGS region, and a conductive layer 45 is formed in the SGS region so as to penetrate the semiconductor layers 31. The conductive layer 45 functions as a contact plug CSL. In the example of FIG. 11, the semiconductor layer 31 is in the shape of a circle at the coupling area between the semiconductor layer 31 and the conductive layer 45, as in the example of FIG. 10. The conductive layer 45 may be formed of the same conductive material as that of the conductive layer 37 (contact plug CBL).

In the SGS region, an insulating layer 46 is formed so as to surround the sides of the semiconductor layer 31, as in the insulating layer 38. The insulating layer 46 functions as a gate insulating film of the select transistor ST2. The insulating layer 46 may be formed of the same insulating material as that of the insulating layer 38.

One side of the insulating layer 46, which is opposed to the other side that is in contact with the semiconductor layer 31, is in contact with a conductive layer 47. The conductive layer 47 functions as a select gate line SGSL. More specifically, the conductive layer 47 includes a first portion extending in the Y direction, and includes a plurality of second portions provided in the SGS region, in such a manner that one side of the second portion is in contact with the insulating layer 46 and that one end of the second portion is in contact with the first portion of the conductive layer 47. The conductive layer 47 may be formed of the same conductive material as that of the conductive layer 39 (select gate line SGDL).

In the SGS region, a region ranging from the memory cell region to the conductive layer 45, including the semiconductor layer 31, the insulating layer 46, and the second portion of the conductive layer 47, functions as a select transistor ST2. More specifically, the second portion of the conductive layer 47 functions as a gate electrode of the select transistor ST2, the insulating layer 46 functions as a gate insulating film of the select transistor ST2, and a channel of the select transistor ST1 is formed in the semiconductor layer 31.

In the select gate contact region, a conductive layer 49 and an insulating layer 44 are formed so as to penetrate the first portion of the conductive layers 47. The conductive layer 49 functions as a contact plug CSGD. The conductive layer 49 is electrically coupled to a corresponding one of the first portions of the conductive layers 47 stacked in the Z direction. The insulating layers 42 and 43 are formed so as to surround the conductive layer 49, as in the select gate contact region corresponding to the select gate lines SGDL. The conductive layer 49 may be formed of the same conductive material as that of the conductive layer 40 (contact plug CSGD).

1.1.5. Sectional Configuration of Memory Cell Array

Next, a description will be given of an example of a sectional configuration of the memory cell array 18.

1.1.5.1. Sectional Configuration of Memory Cell Region

Figure 12:
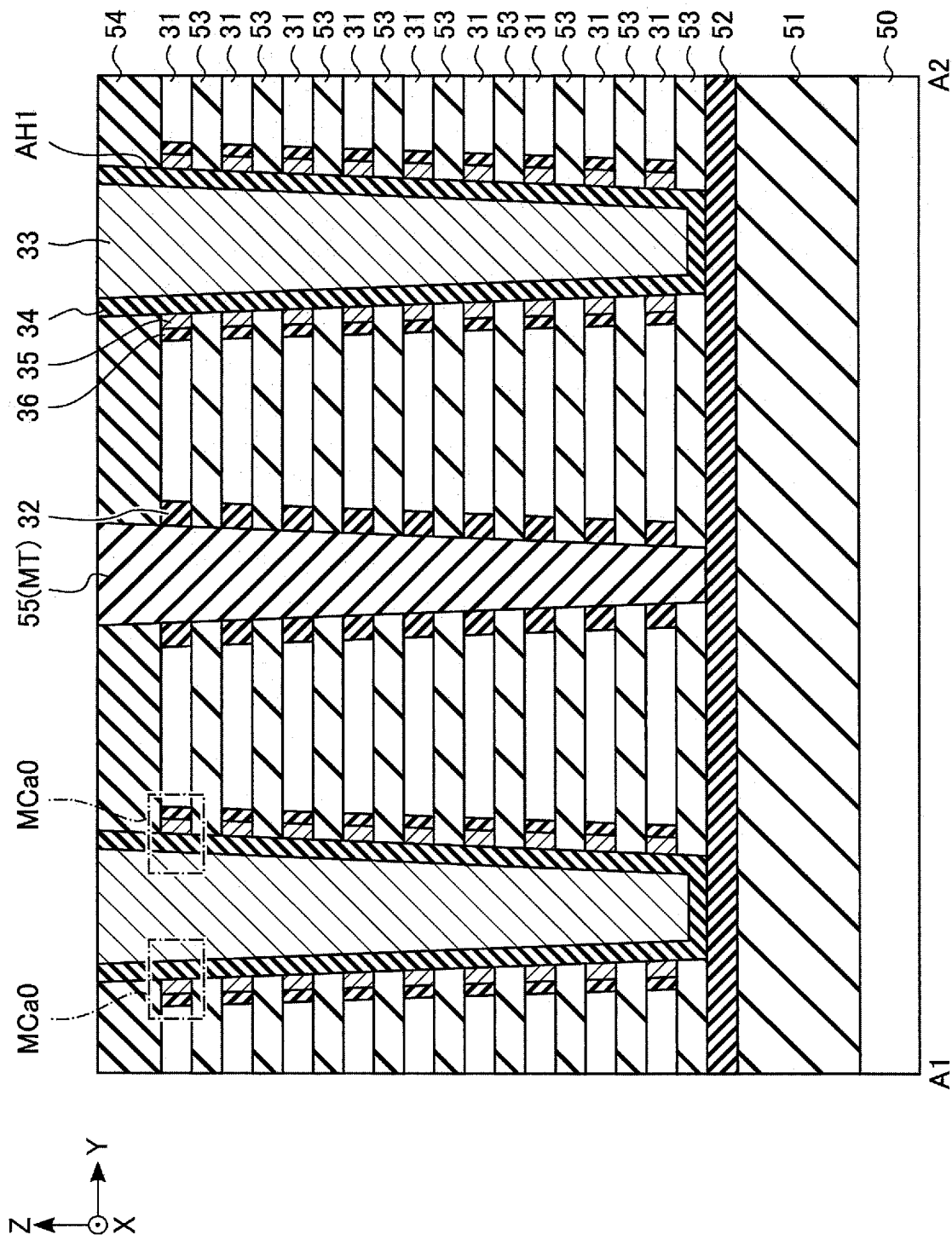
FIG. 12 is a sectional view taken along line A1-A2 shown in FIG. 10.

The sectional configuration of the memory cell region will be described with reference to FIG. 12. FIG. 12 is a sectional view taken along line A1-A2 shown in FIG. 10.

As shown in FIG. 12, an insulating layer 51 is formed on a semiconductor substrate 50. For example, silicon oxide ($SiO_2$) is used as the insulating layer 51. The insulating layer 51 includes a plurality of interconnect layers and a transistor (not shown in FIG. 12) formed on the semiconductor substrate 50. The memory cell array 18 is provided on the insulating layer 51.

More specifically, an insulating layer 52 is formed on an insulating layer 51. The insulating layer 52 functions as an etching stopper in processing holes for various contact plugs, memory trenches MT, etc. The insulating layer 52 may be of any insulating material that provides a sufficiently high etching selectivity to an insulating layer 53 formed thereon. The insulating material is selected from a metal nitride (for example, silicon nitride (SiN)) or a metal oxide (for example, aluminum oxide (AlO)). The insulating material may be a mixture film or a laminated film of these materials.

The insulating layer 53 is formed on the insulating layer 52. For example, $SiO_2$ is used as the insulating layer 53. Nine semiconductor layers 31 are stacked on the insulating layer 53, with the insulating layer 53 interposed between two adjacent semiconductor layers 31. That is, nine insulating layers 53 and nine semiconductor layers 31, for example, are alternately stacked on the insulating layer 52. The number of semiconductor layers 31 stacked may be set freely. For example, polysilicon is used as the semiconductor layers 31.

An insulating layer 54 is formed on the uppermost semiconductor layer 31. For example, $SiO_2$ is used as the insulating layer 54.

A hole AH is formed so as to penetrate the insulating layer 54 and the alternately-stacked nine semiconductor layers 31 and nine insulating layers 53, and to reach the insulating layer 52 at its bottom. A word line pillar WLP is formed in the hole AH. An insulating layer 34 is formed on the side and bottom of the hole AH, and a conductive layer 33 is embedded in the hole AH. A charge storage layer 35 which is in contact with the side of the insulating layer 34, and an insulating layer 36 provided between the charge storage layer 35 and the semiconductor layer 31, are formed between the insulating layer 34 and the semiconductor layer 31.

The conductive layer 33 is formed of a conductive material. For example, a metal material or a semiconductor material doped with impurities may be used as the conductive material.

The insulating layer 34 is formed of an insulating material. For example, the insulating material may be selected from a high dielectric constant film, such as oxide or nitride of aluminum (Al), titanium (Ti), zirconium (Zr), or lanthanum (La), a high breakdown voltage film, such as $SiO_2$ or silicon oxynitride (SiON), or a mixture film or a laminated film of these materials.

For example, polysilicon is used as the charge storage layer 35. The charge storage layer 35 may be selected from a metal nitride, such as SiN, tantalumnitride (TaN), or titanium nitride (TiN), a metal silicon compound included tungsten (W) or ruthenium (Ru), or a mixture film or a laminated film of silicon that contains metal particle or insulating film.

The insulating layer 36 may be selected from, for example, $SiO_2$, SiN, SiON, or a mixture film or a laminated film of these materials.

A memory trench MT is formed so as to penetrate the insulating layer 54 and the alternately-stacked nine semiconductor layers 31 and nine insulating layers 53, and reach the insulating layer 52 at its bottom. An insulating layer 55 is embedded in the memory trench MT. For example, $SiO_2$ is used as the insulating layer 55.

An insulating layer 32 is formed between the insulating layer 55 and each semiconductor layer 31. For example, $SiO_2$ is used as the insulating layer 32.

1.1.5.2. Sectional Configuration of SGD Region

Figure 13:
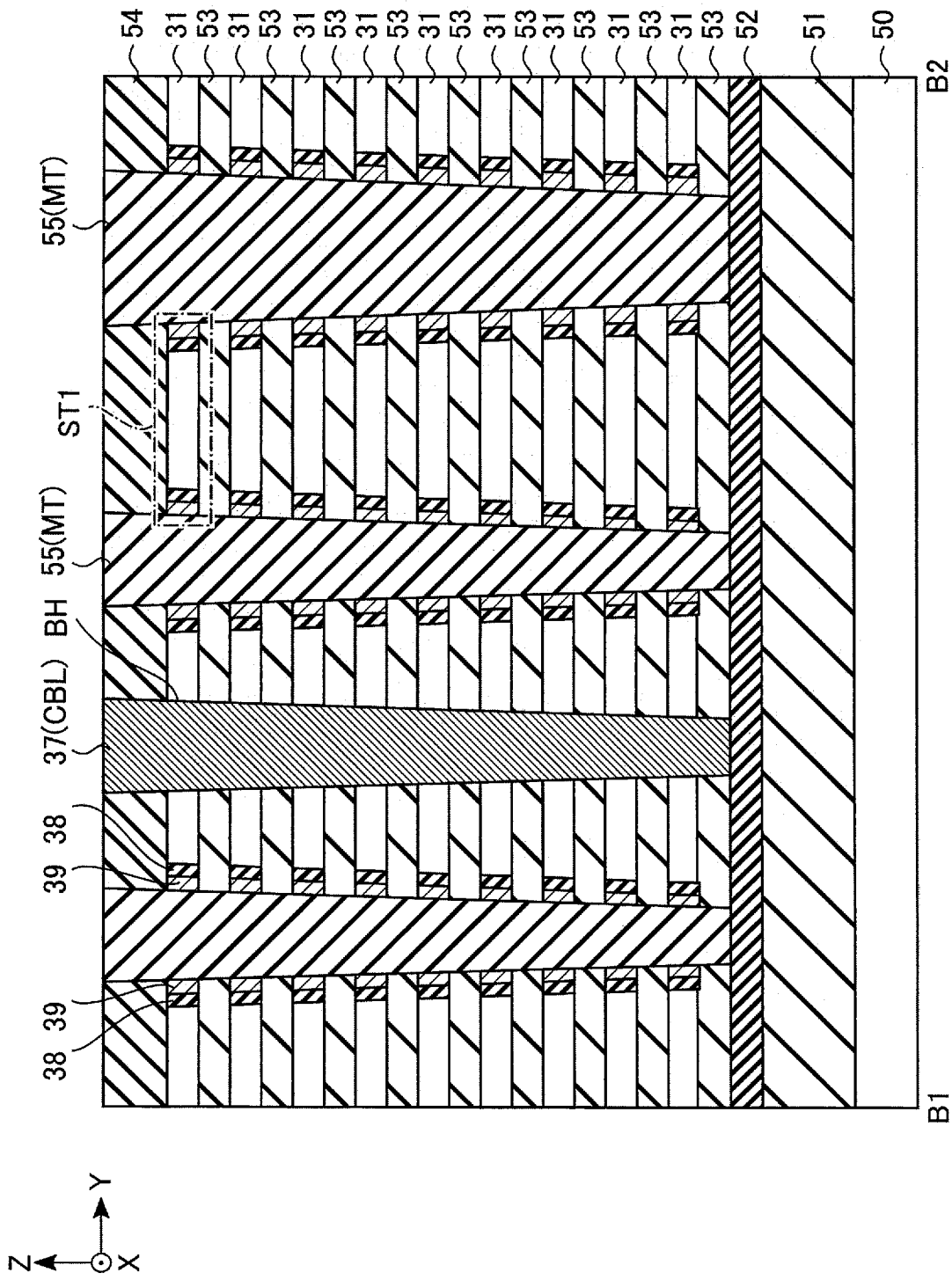
FIG. 13 is a sectional view taken along line B1-B2 shown in FIG. 10.

A sectional configuration of the SGD region will be described below with reference to FIG. 13. FIG. 13 is a sectional view taken along line B1-B2 shown in FIG. 10.

As shown in FIG. 13, nine insulating layers 53 and nine semiconductor layers 31, for example, are alternately stacked on an insulating layer 52, and an insulating layer 54 is formed on the uppermost semiconductor layer 31, as in FIG. 12.

A hole BH is formed so as to penetrate the insulating layer 54, and the alternately-stacked nine semiconductor layers 31 and nine insulating layers 53, and reach the insulating layer 52 at its bottom. A contact plug CBL is formed in the hole BH. A conductive layer 37 is embedded in the hole BH. The conductive layer 37 is formed of a conductive material which may be, for example, a metal material or a semiconductor material doped with impurities.

In the SGD region, a conductive layer 39 which is in contact with the side of the insulating layer 55, and an insulating layer 38 provided between the conductive layer 39 and each semiconductor layer 31, are formed between the insulating layer 55 and the semiconductor layer 31. The conductive layer 39 is formed of a conductive material which may be, for example, a metal material or a semiconductor material such as Si doped with impurities. For example, $SiO_2$ is used as the insulating layer 38.

1.1.5.3. Sectional Configuration of Select Gate Contact Region

Figure 14:
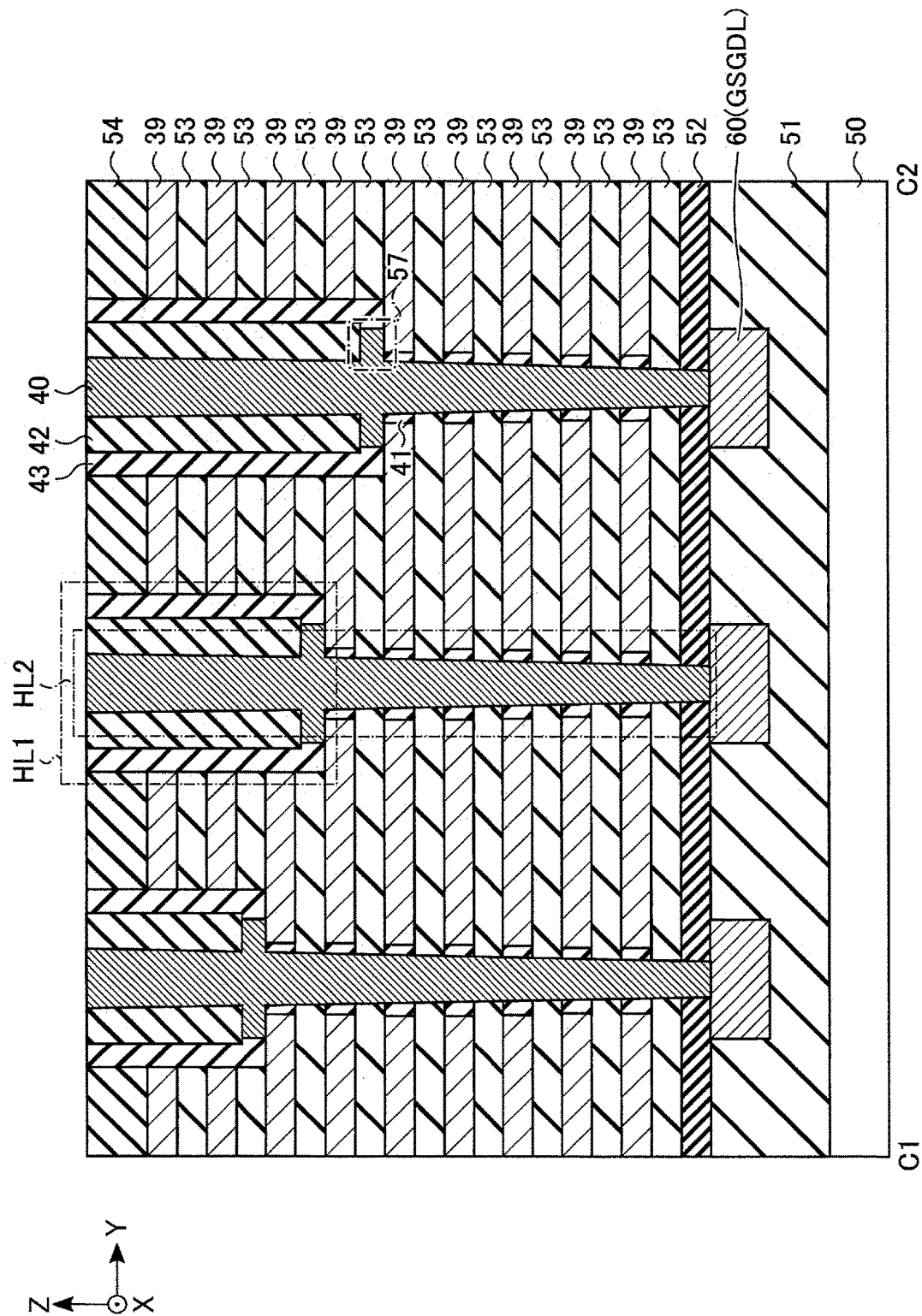
FIG. 14 is a sectional view taken along line C1-C2 shown in FIG. 10.

A sectional configuration of the select gate contact region corresponding to the select gate lines SGDL will be described below, with reference to FIG. 14. FIG. 14 is a sectional view taken along line C1-C2 shown in FIG. 10.

As shown in FIG. 14, a plurality of conductive layers 60 are formed in the vicinity of the top surface of the insulating layer 51, so as to extend in the X direction. The conductive layers 60 function as global select gate lines GSGDL. The conductive layers 60 are formed of, for example, a metal material, or a semiconductor material doped with impurities.

Nine insulating layers 53 and nine conductive layers 39, for example, are alternately stacked on an insulating layer 52. The conductive layers 39 are formed at the same layer as the semiconductor layers 31. The insulating layer 54 is formed on the uppermost conductive layer 39.

A plurality of holes HL1 are formed so as to penetrate the insulating layer 54, and reach one of the stacked conductive layers 39 at their bottoms. At least one hole HL1 is formed in each of the conductive layers 39. Thus, the number of holes HL1 is not less than the number of conductive layers 39. FIG. 14 shows, as an example, a hole HL1 that reaches, at its bottom, the third conductive layer 39 from the top; a hole HL1 that reaches, at its bottom, the fourth conductive layer 39 from the top; and a hole HL1 that reaches, at its bottom, the fifth conductive layer 39 from the top.

An insulating layer 43 is formed on part of the side and bottom of each of the holes HL1. For example, SiN is used as the insulating layer 43. In each of the holes HL1, the insulating layer 42 is formed in such a manner that its side is in contact with the insulating layer 43. For example, $SiO_2$ is used as the insulating layer 42.

A hole HL2 is formed so as to penetrate each of the holes HL1 and reach the corresponding conductive layer 60 at its bottom. An insulating layer 41 is formed on part of the side of the hole HL2, and the conductive layer 40 is embedded in the hole HL2.

In the vicinity of the bottom of each of the holes HL1, a part of the insulating layer 43 is removed, and a coupling portion 57 is formed at the conductive layer 40 so as to protrude from its side. The bottom of the coupling portion 57 is coupled to the conductive layer 39. That is, the conductive layer 40 (contact plug CSGD) is electrically coupled, at its bottom, to the corresponding conductive layer 60 (global select gate line GSGDL), and also electrically coupled to one of the conductive layers 39 (select gate line SGDL) via the coupling portion 57 protruding therefrom.

For example, the top of the coupling portion 57 is at a level below the bottom of the conductive layer 39 provided thereabove.

1.2 Method of Manufacturing Memory Cell Array

Next, a description will be given of a method of manufacturing the memory cell array 18, with reference to FIGS. 15 to 26. FIGS. 15 to 26 show top views of the uppermost semiconductor layer 31 ("Semiconductor layer top"), and at least one of sectional views taken along A1-A2 ("A1-A2 section"), B1-B2 ("B1-B2 section"), C1-C2 ("C1-C2 section"), and D1-D2 ("D1-D2 section") in a manufacturing process. In the examples of FIGS. 15-30, a method of manufacturing the SGS region and the select gate contact region corresponding to the select gate lines SGSL is omitted, in order to simplify the description; however, they are formed in a manner similar to the SGD region and the select gate contact region corresponding to the select gate lines SGDL, and are, for example, simultaneously formed.

Figure 15:
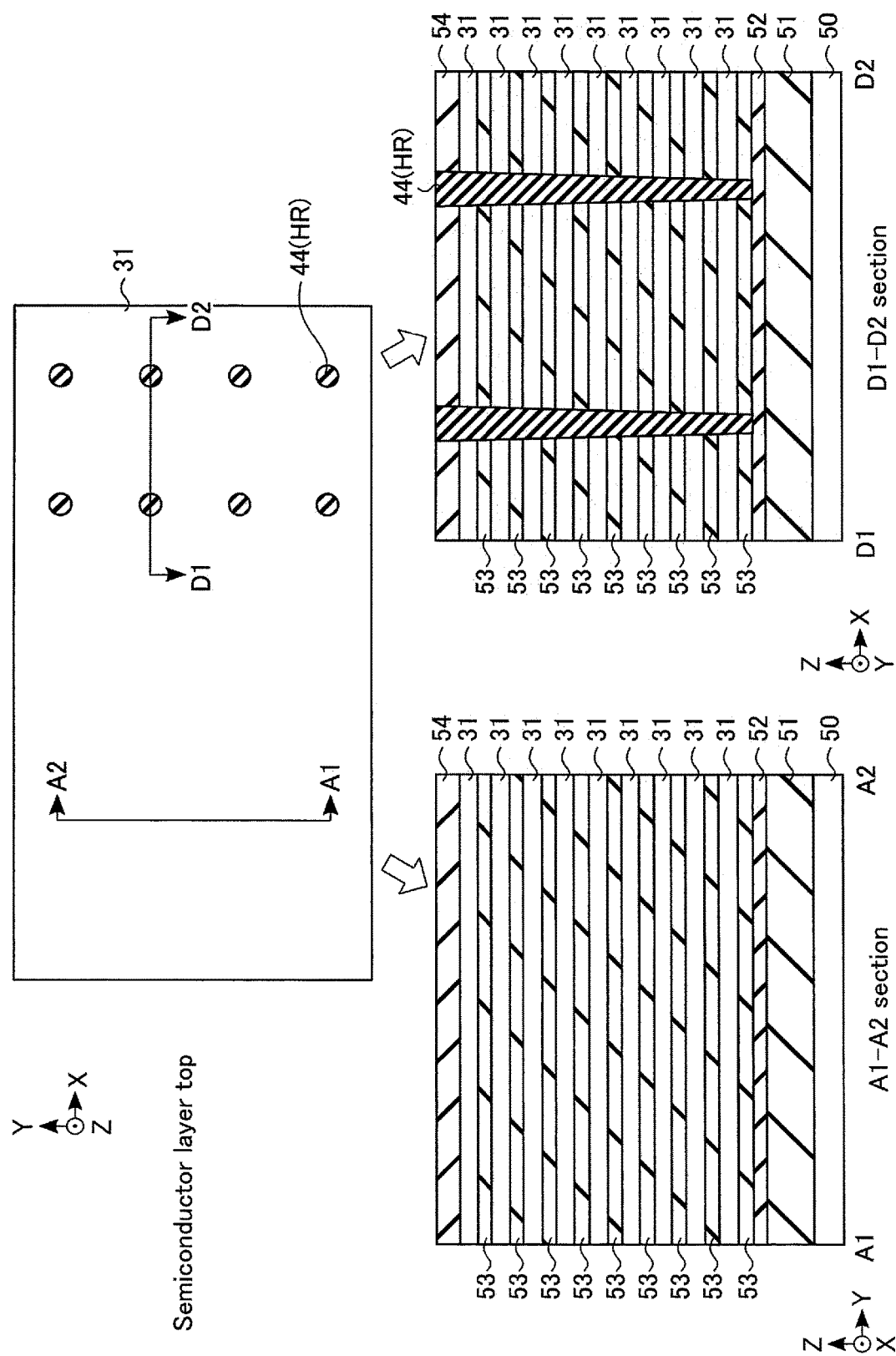
FIGS. 15-26 are diagrams showing a process of manufacturing the memory cell array included in the semiconductor memory device according to the first embodiment.

As shown in FIG. 15, insulating layers 51 and 52 are stacked in this order on a semiconductor substrate 50, and nine insulating layers 53 and nine semiconductor layers 31 are alternately stacked on the insulating layer 52. An insulating layer 54 is formed on the uppermost semiconductor layer 31.

Thereafter, holes of dummy pillars HR are formed in in the select gate contact region by dry etching, so as to penetrate the insulating layer 54, the nine semiconductor layers 31, and the nine insulating layers 53, and reach the insulating layer 52 at its bottom.

After a processing of increasing an etching rate of the semiconductor layers 31 that are arranged at vicinity of the dummy pillars HR, an insulating layers 44 are embedded in the holes of the dummy pillar HR. The insulating layer 44 is formed of, for example, $SiO_2$.

Figure 16:
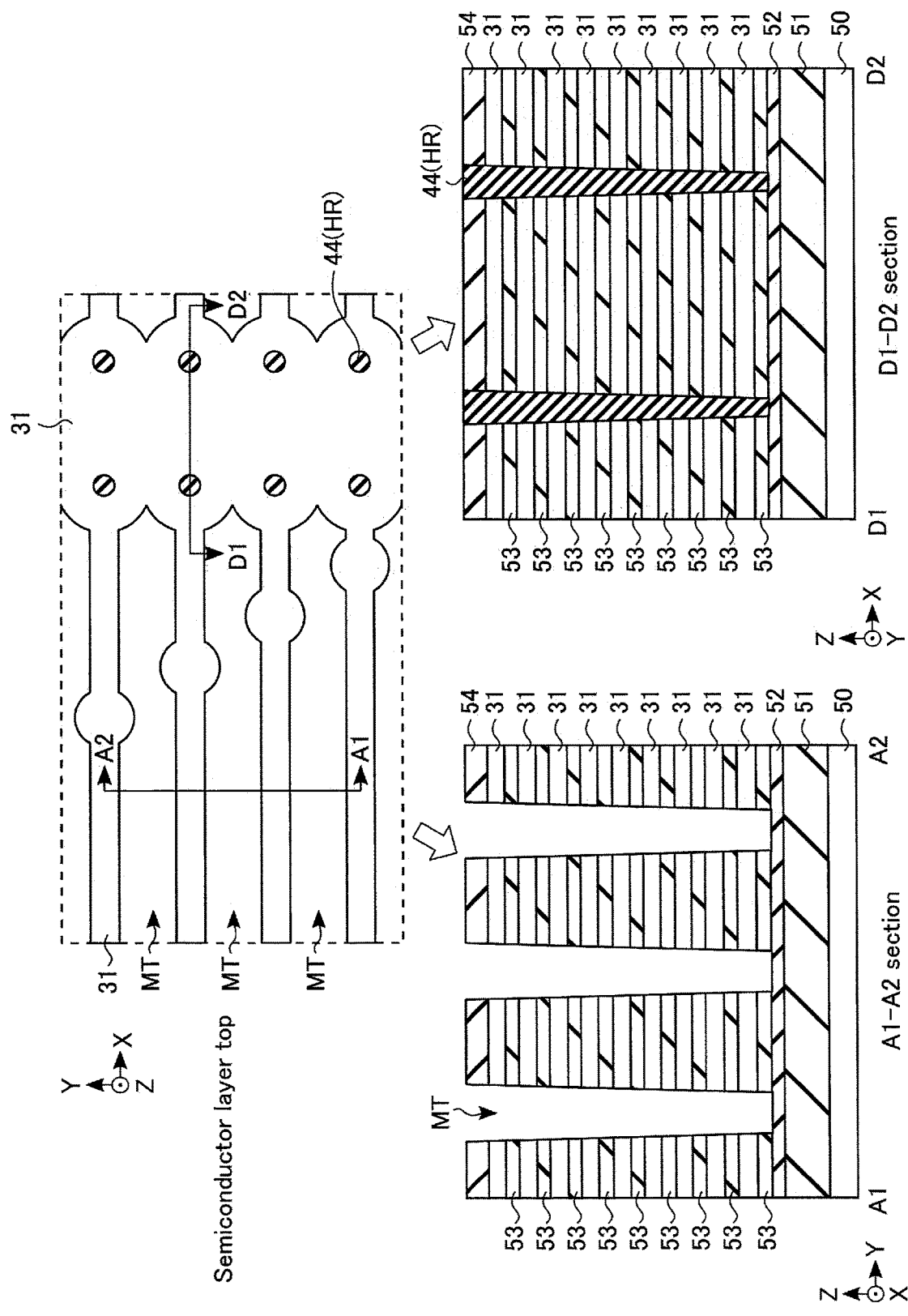

As shown in FIG. 16, each of memory trenches MT is formed by dry etching, so as to penetrate the insulating layer 54, the nine semiconductor layers 31, and the nine insulating layers 53, and reach the insulating layer 52 at its bottom.

Figure 17:
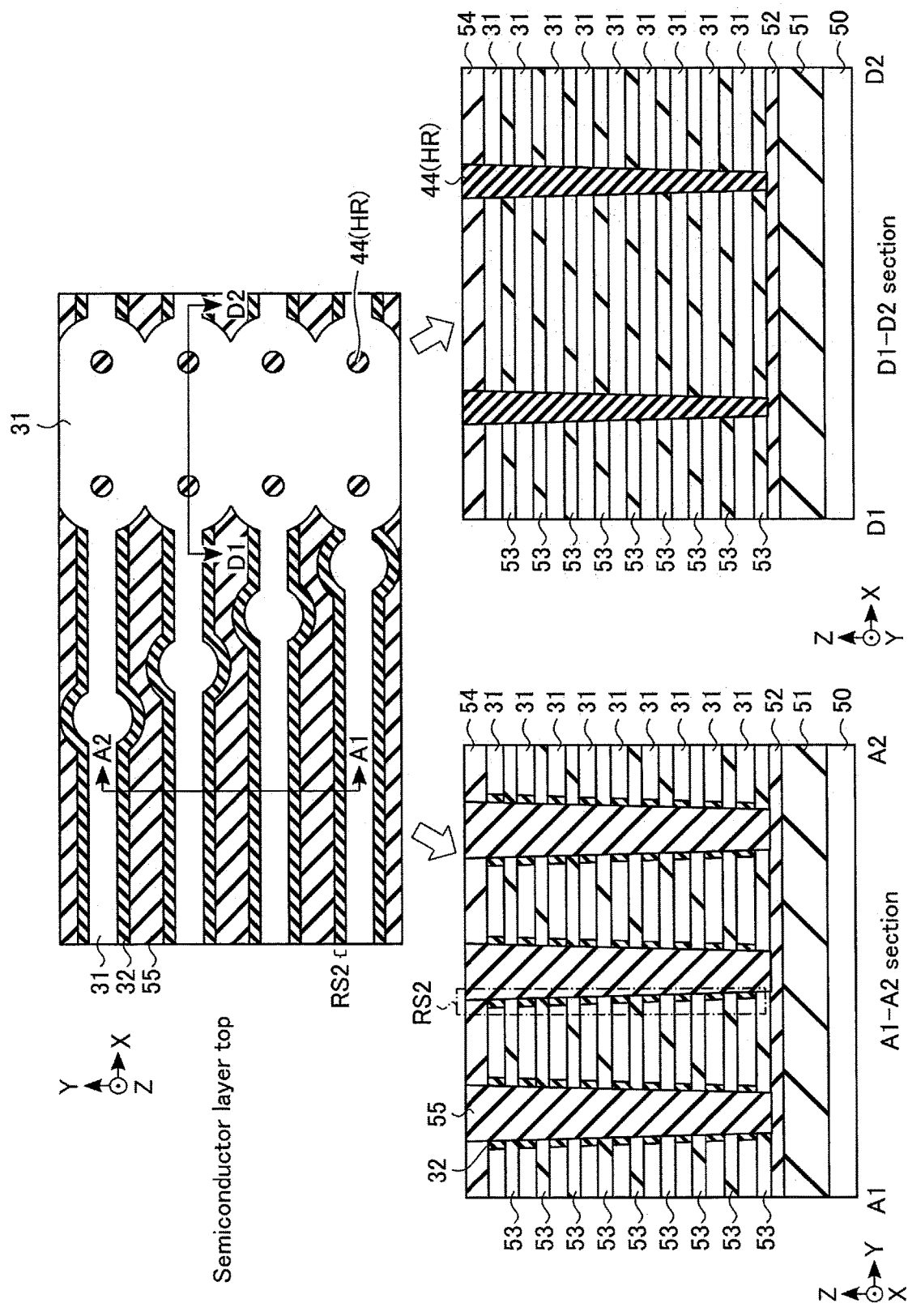

As shown in FIG. 17, the semiconductor layers 31 are partly etched from the side of the memory trench MT by wet etching, thereby forming recess regions RS2.

Thereafter, insulating layers 32 are embedded in the recess regions RS2. More specifically, after a conformal insulating layer 32 is formed, the insulating layer 32 on the side and bottom of the memory trench MT and on the insulating layer 54 is removed, and the insulating layers 32 are formed in the recess regions RS2.

Subsequently, an insulating layers 55 are embedded in the memory trenches MT.

Figure 18:
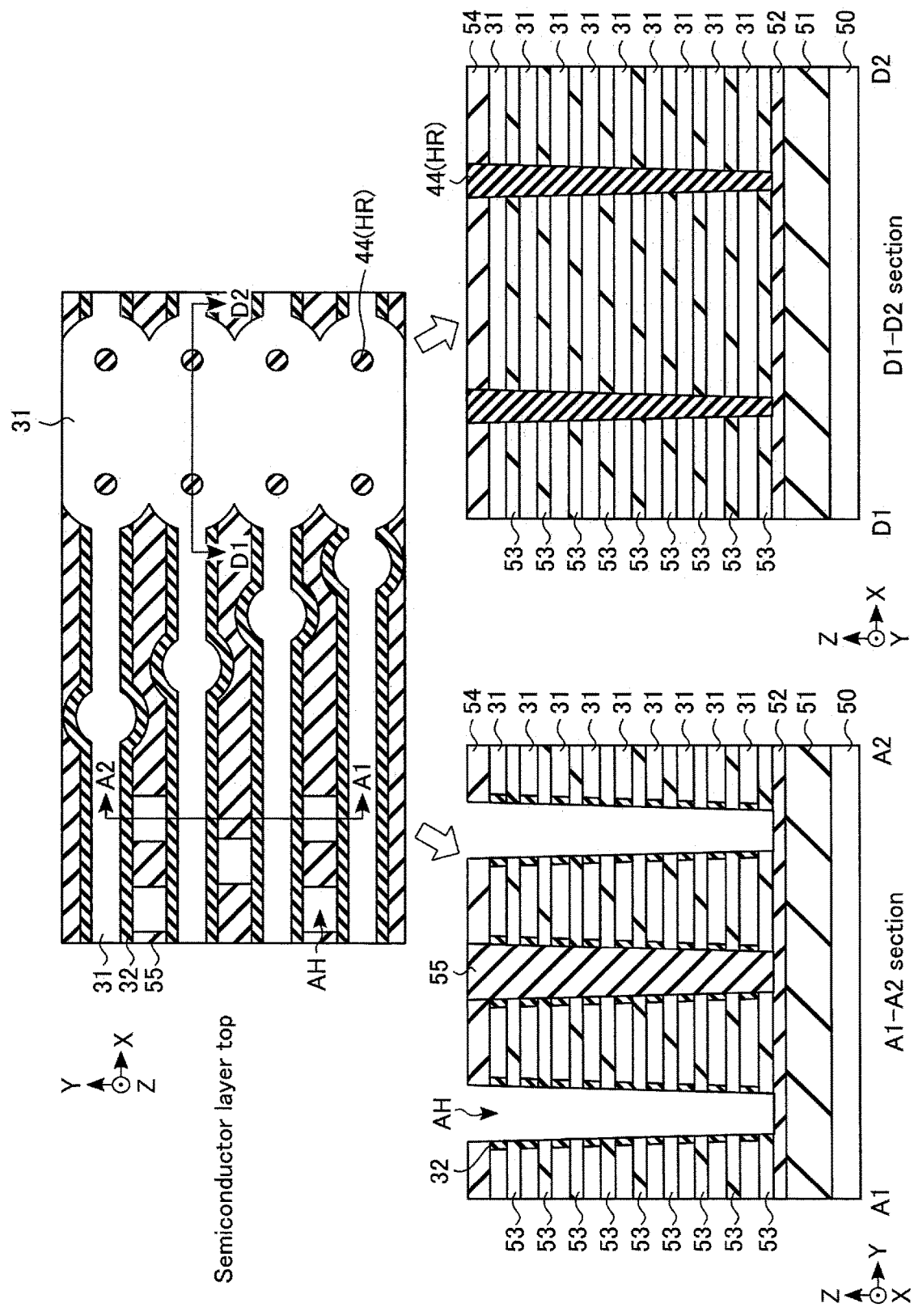

As shown in FIG. 18, each of the holes AH is formed by partly removing the insulating layer 55 by dry etching.

Figure 19:
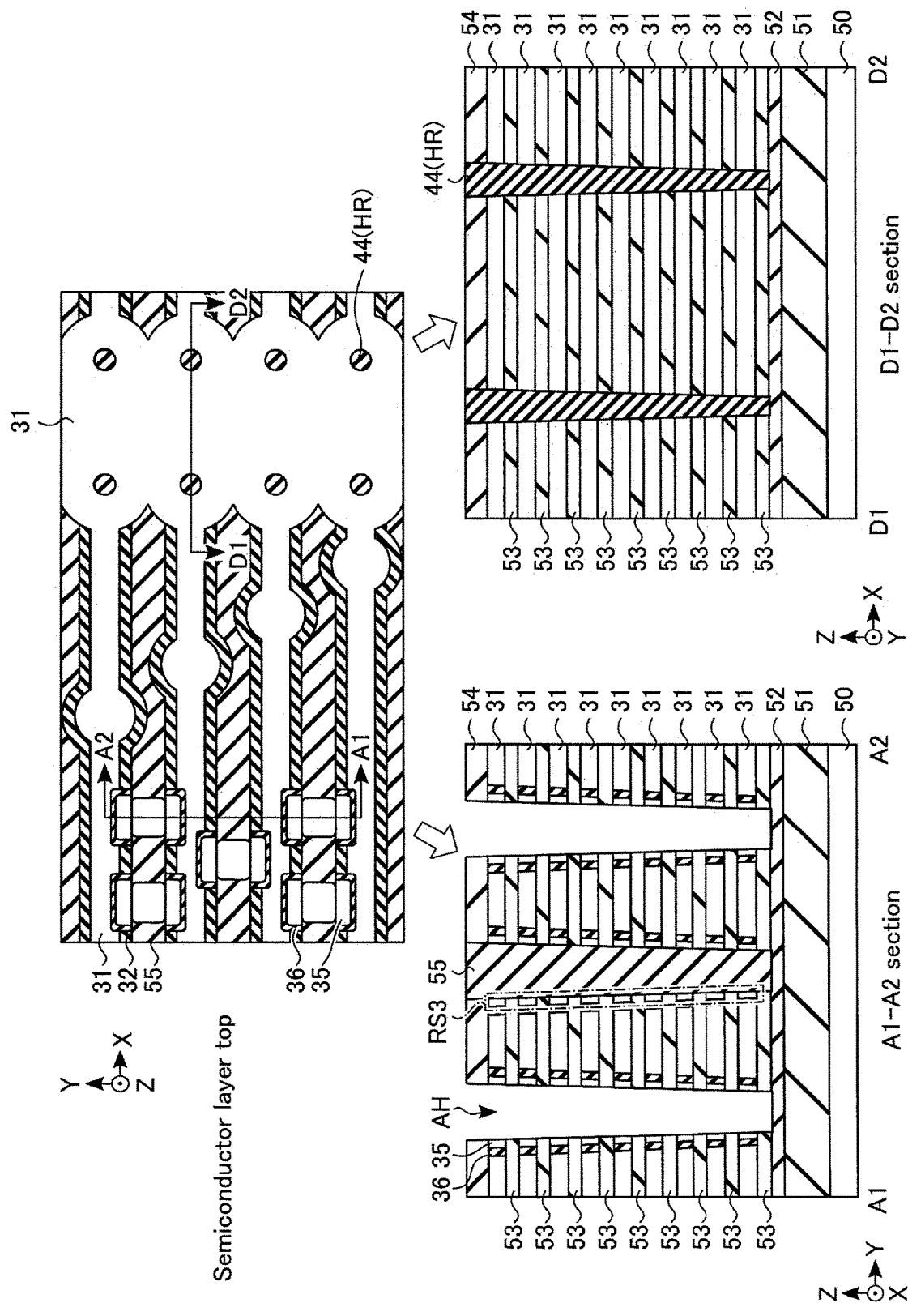

As shown in FIG. 19, insulating layers 36 and charge storage layers 35 are formed in the periphery of the holes AH.

More specifically, the insulating layers 32 are removed from the periphery of the holes AH by wet etching.

Subsequently, insulating layers 36 are formed on the side of the semiconductor layers 31 exposed from the holes AH. Subsequently, a charge storage layers 35 are formed and embedded in the recess regions RS3 formed by partly removing a part of the insulating layers 32.

More specifically, a conformal charge storage layer 35 is formed.

The charge storage layer 35 on the side and bottom of the hole AH and on the insulating layer 54 is removed, thereby forming the charge storage layers 35 in the recess regions RS3.

Figure 20:
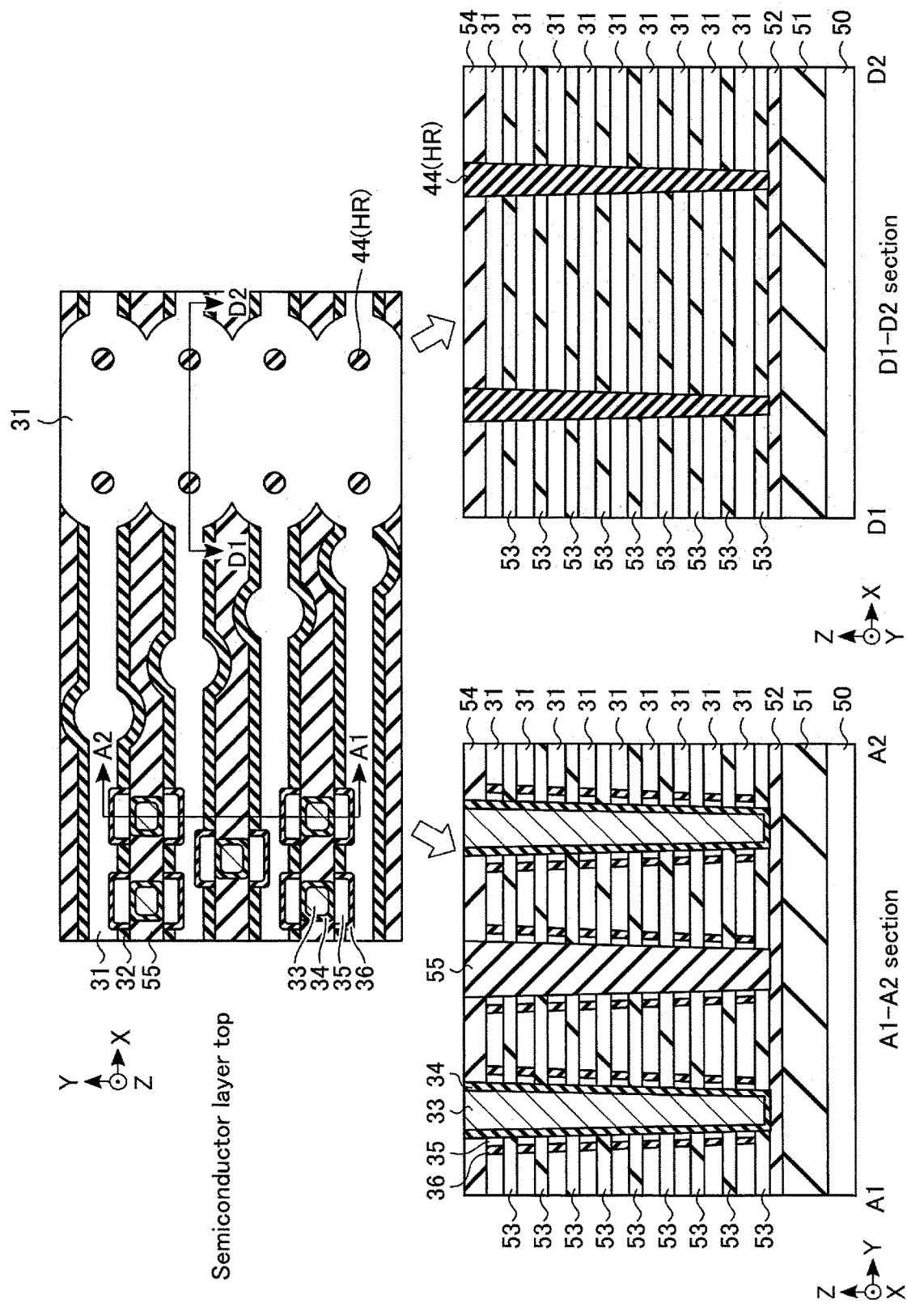

As shown in FIG. 20, an insulating layer 34 is formed on the side and bottom of the hole AH, and a conductive layer 33 is then embedded in the hole AH.

Figure 21:
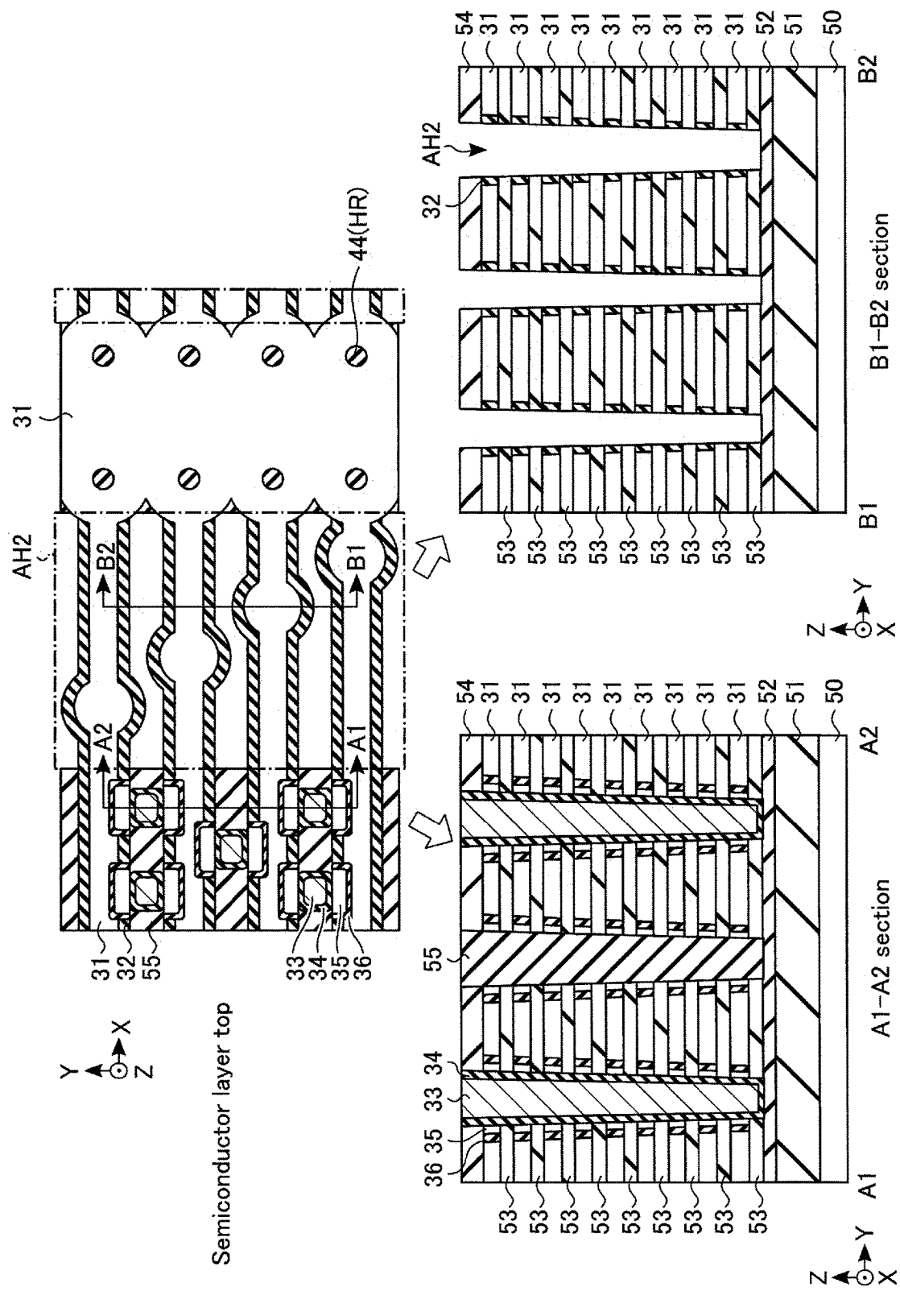

As shown in FIG. 21, the insulating layers 54 in the memory trenches MT in the SGD region (and the SGS region, not shown) are removed, thereby forming a hole AH2.

Figure 22:
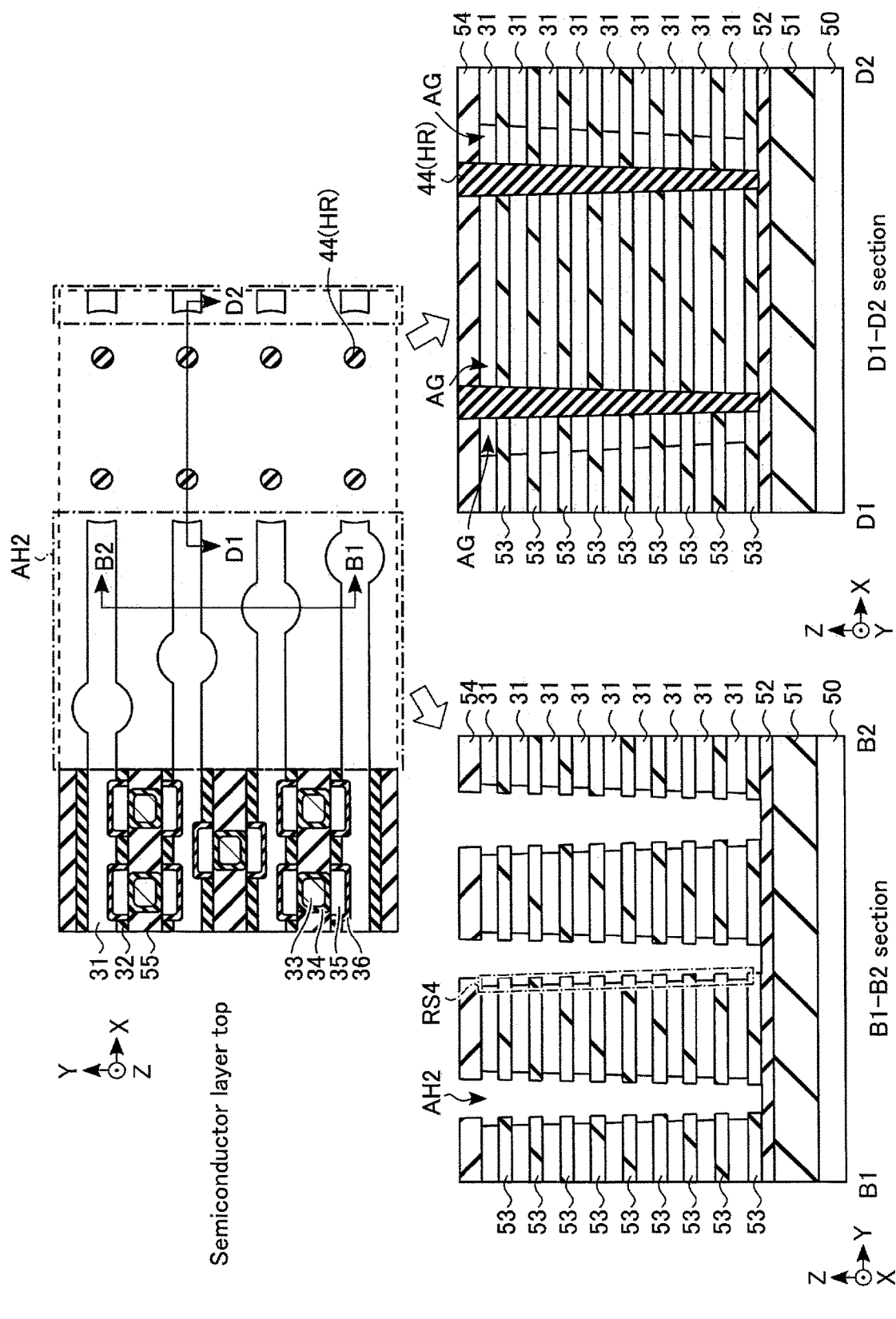

As shown in FIG. 22, the insulating layers 32 are removed from the SGD region (hole AH2 region) by, for example, wet etching, thereby forming recess regions RS4.

Thereafter, the semiconductor layers 31 exposed to the side on the hole AH2 are removed. In this process, an amount of etching of the semiconductor layer 31 is adjusted in such a manner that, after the etching, the semiconductor layer 31 in the SGD region remains, and that the semiconductor layer 31 in the vicinity of the dummy pillar HR ceases to remain. It is possible to suppress the pattern from collapsing even when air gaps AG are formed between the insulating layers 53 stacked in the Z direction by support of the insulating layers 44 in the dummy pillars 44.

Figure 23:
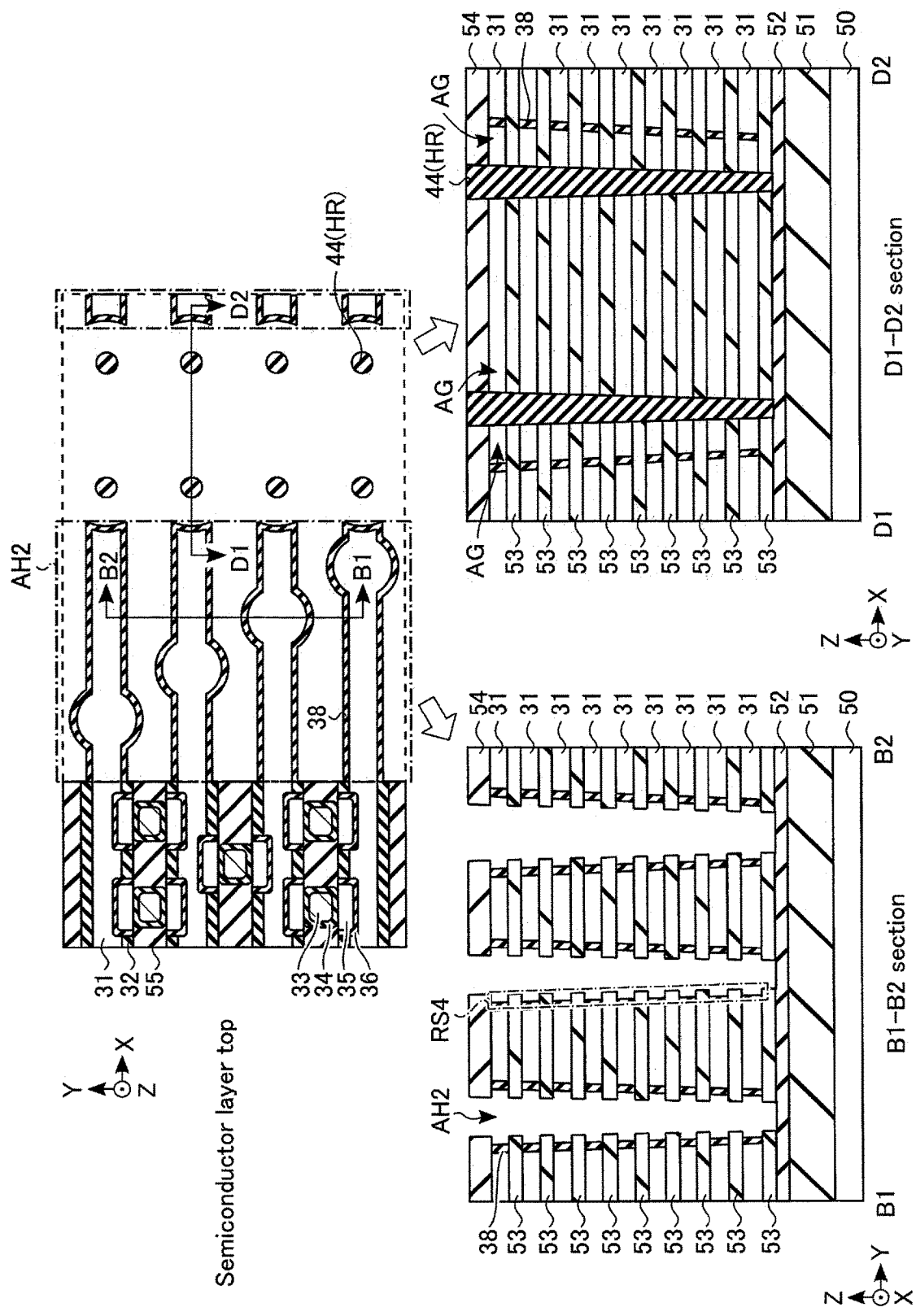

As shown in FIG. 23, insulating layers 38 are formed on the sides of the semiconductor layers 31 exposed to the recess regions RS4 in the SGD region.

Figure 24:
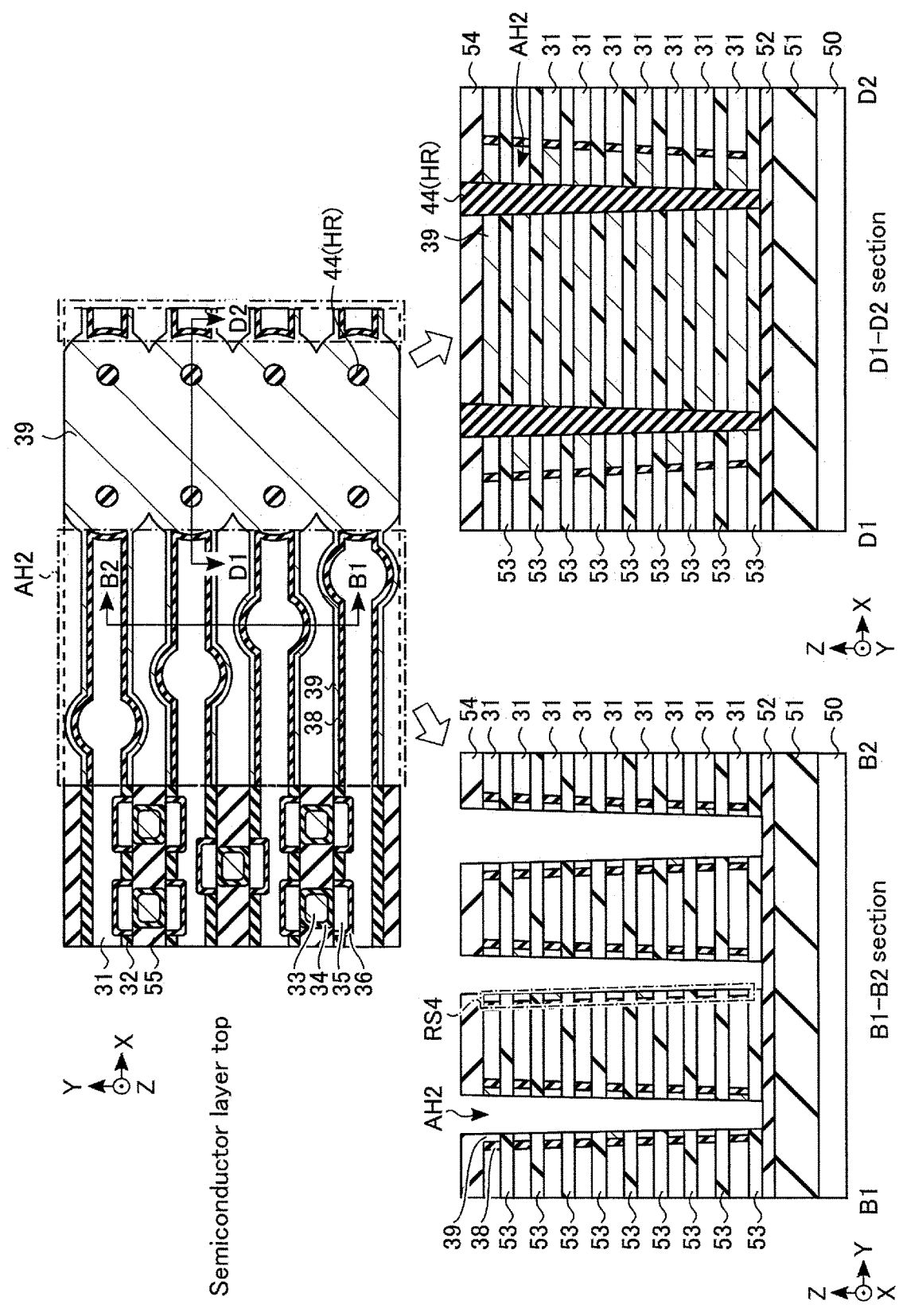

As shown in FIG. 24, a conductive layer 39 is formed.

More specifically, the conductive layer 39 is formed so as to be embedded in the recess region RS4 and the air gap AG in the periphery of the dummy pillar HR.

Thereafter, the conductive layer 39 is removed from the side (side of the insulating layer 53) and the bottom of the memory trench MT and from on the insulating layer 54.

Figure 25:
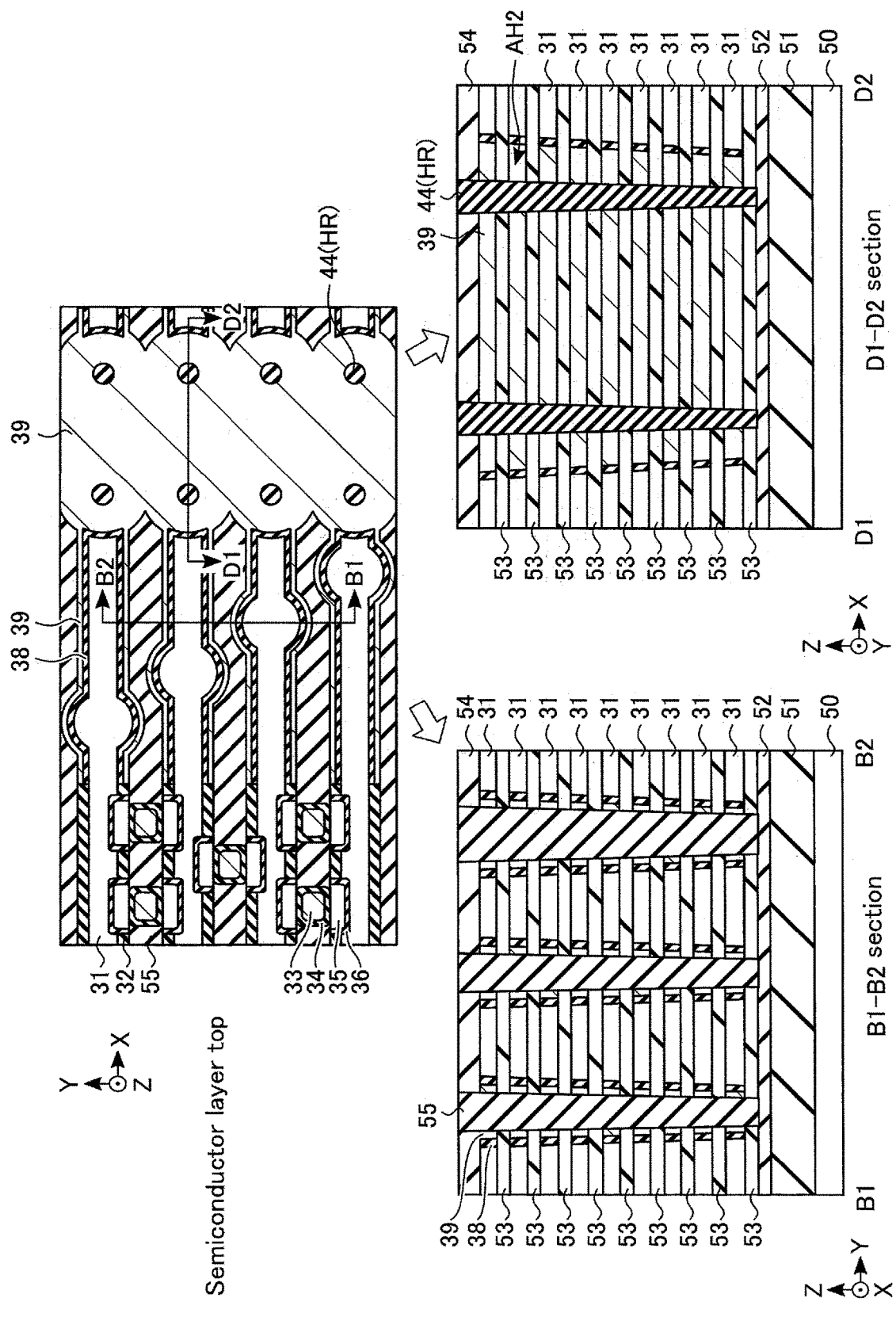

As shown in FIG. 25, an insulating layer 55 is embedded in the memory trench MT (hole AH2) in the SGD region.

Figure 26:
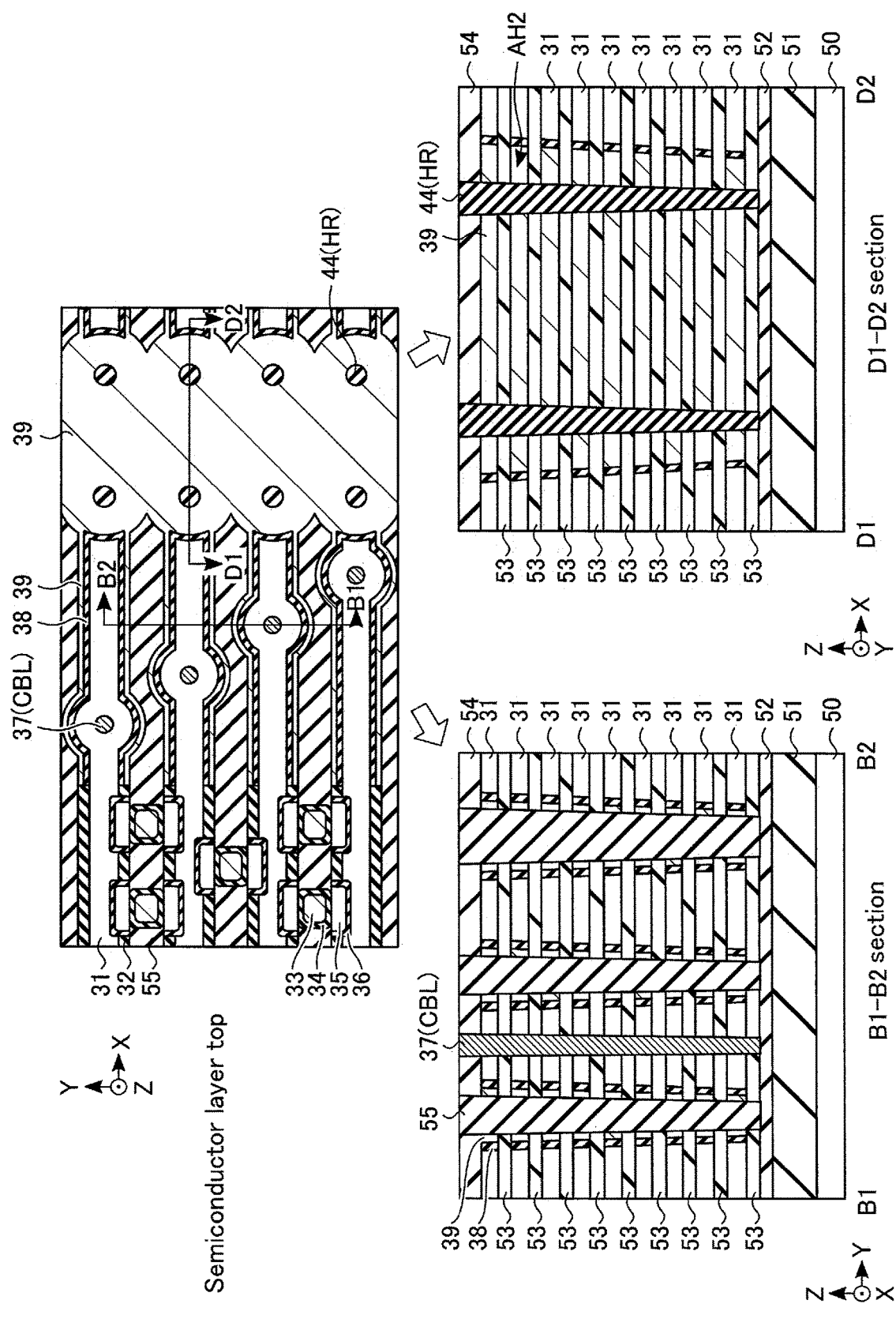

As shown in FIG. 26, contact plugs CBL are formed.

More specifically, each of holes BH is formed in the SGD region so as to penetrate the insulating layer 54, the nine semiconductor layers 31, and the nine insulating layers 53, and reach the insulating layer 52 at its bottom, and a conductive layer 37 is embedded in the hole BH.

1.3 Voltages of Interconnects in Read Operation

Figure 27:
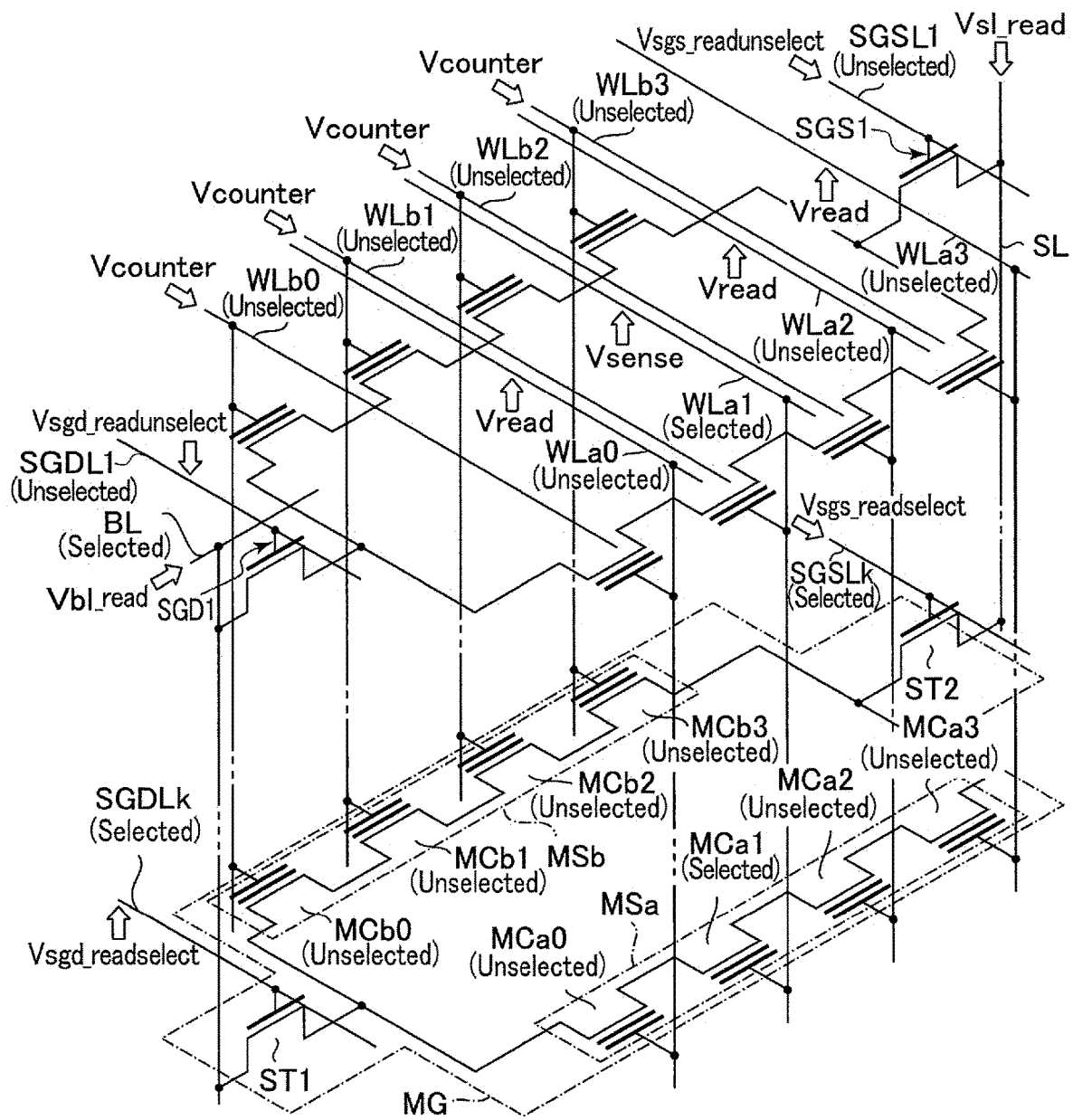
FIG. 27 is a circuit diagram of the memory cell array of the semiconductor memory device according to the first embodiment, showing voltages of interconnects in a read operation.
Figure 28:
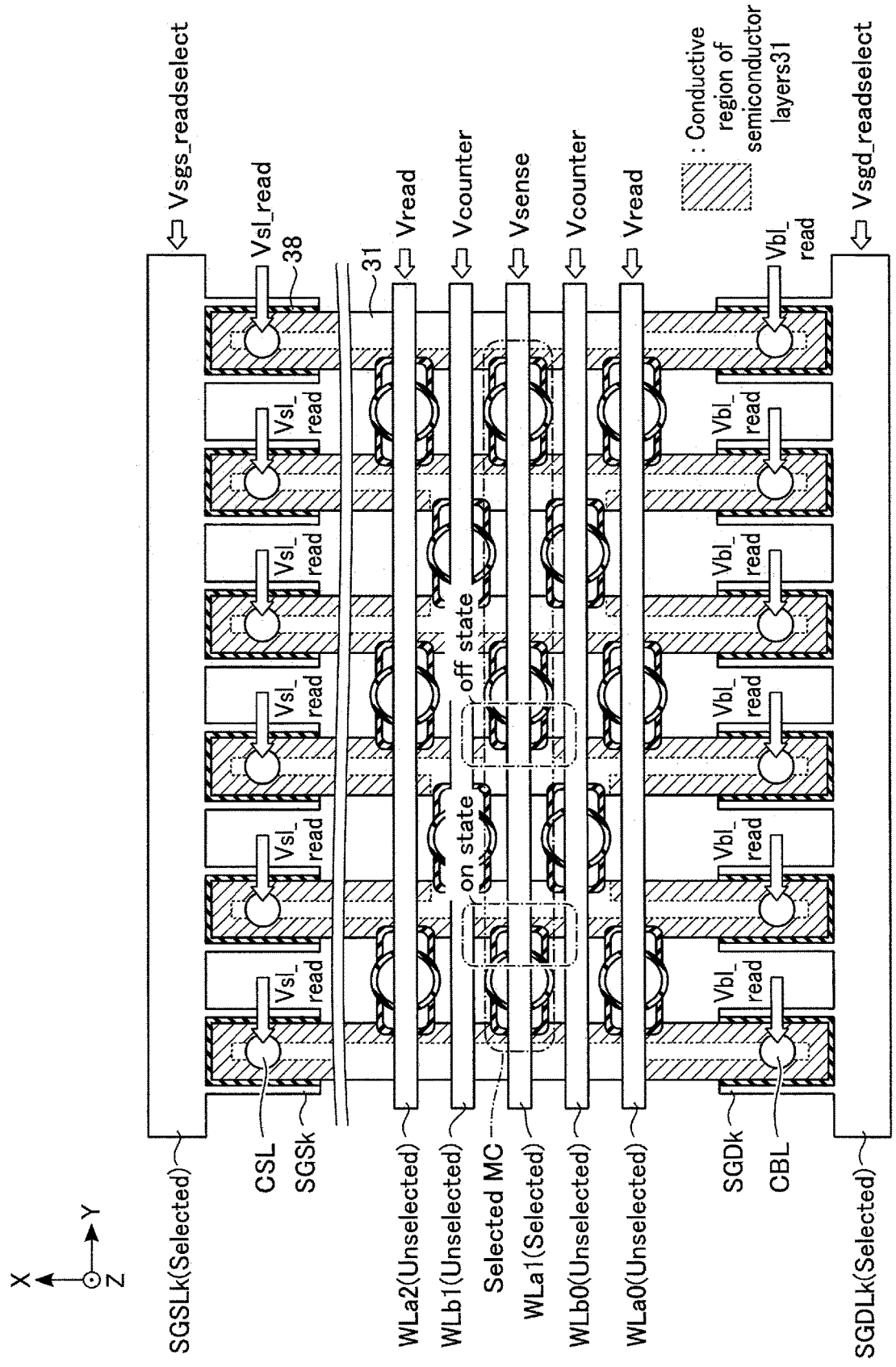
FIG. 28 is a plan view of the memory cell array of the semiconductor memory device according to the first embodiment, showing voltages of interconnects in a read operation.

Next, a description will be given of the voltages of interconnects in a read operation, with reference to FIGS. 27 and 28. FIG. 27 is a circuit diagram of a plurality of memory groups MG stacked in the Z direction and commonly coupled to one contact plug CBL. FIG. 27 is showing a case, as an example, where a memory cell transistor MCa1 in a memory group MG corresponding to the lowermost select gate line SGDLk is selected as a read target. FIG. 28 is a schematic diagram showing, as an example, a top view of the select gate line SGDLk, a top view of semiconductor layers 31 corresponding thereto, and a top view of word lines WL. In the example of FIG. 28, a description will be given of the case where one semiconductor layer 31 corresponds to one contact plug CSL, in order to simplify the description.

As shown in FIG. 27, the row decoder 19 respectively applies gate potentials Vsgd_readselect and Vsgs_readselect to select gate lines SGDLk and SGSLk corresponding to the selected memory group MG. The gate potentials Vsgd_readselect and Vsgs_readselect are an appropriate potentials that turn on the select transistors. The row decoder 19 applies a gate potential Vsgd_readunselect to other select gate lines SGDL1 to SGDL(k−1) corresponding to unselected memory groups MG, and applies a gate potential Vsgs_readunselect to other select gate lines SGSL1 to SGSL (k−1) corresponding to unselected memory groups MG. The gate potentials Vsgd_readunselect and Vsgs_readunselect are an appropriate potentials that turns off the select transistors. Thereby, select transistors ST1 and ST2 corresponding to the selected memory group MG are turned on, and select transistors ST1 and ST2 corresponding to the unselected memory groups MG are turned off.

The row decoder 19 applies a read potential Vsense to a selected word line WLa1 corresponding to the selected memory cell transistor MCa1. The potential Vsense is determined according to the threshold level of the read target data. For example, when the threshold of the memory cell transistor MCa1 is lower than the potential Vsense, the memory cell transistor MCa1 is turned on, and when the threshold of the memory cell transistor MCa1 is higher than the potential Vsense, the memory cell transistor MCa1 is turned off.

The row decoder 19 applies a potential Vread to word lines WLa0, WLa1, and WLa3, respectively corresponding to the unselected memory cell transistors MCa0, MCa2, and MCa3, in a memory string MSa including the selected memory cell transistor MCa1. The potential Vread is a potential that turns on a memory cell transistor MC, regardless of the threshold of the memory cell transistor MC. The potential Vread may be uniformly for the unselected memory cell transistors MC, or may be individually adjusted to an appropriate value for each of the unselected memory cell transistors MC based on the threshold of the memory cell transistor MC or position for the selected memory cell transistor MC.

The row decoder 19 also applies a potential Vcounter to word lines WLb0 to WLb3, respectively corresponding to the unselected memory cell transistors MCb0 to MCb3, in a memory string MSb not including the memory cell transistor MCa1. The potential Vcounter is a potential that cuts off a memory cell transistor MC, regardless of the threshold of the memory cell transistor MC. The potential Vcounter may be, for example, a negative voltage.

In this state, the sense amplifier 20 applies a potential Vbl_read to a bit line BL to be a read target. The source line SL is applied with the potential Vsl_read.

As shown in FIG. 28, in a read operation, data is collectively read from a plurality of memory cell transistors MCa1 corresponding to a plurality of word line pillars WLP, coupled to the selected word line WLa1 and corresponding to the selected select gate line SGDLk.

In the semiconductor layers 31 corresponding to the select gate line SGDLk, the regions indicated by the diagonal lines, for example, function as conductive regions, namely, regions where channels are formed.

More specifically, in the SGD and SGS regions, conductive regions are formed in the vicinity of the surfaces of the semiconductor layers 31 that are in contact with the select gate lines SGDLk and SGSLk respectively applied with the potential Vsgd_readselect and Vsgs_readselect via the insulating layers 38, so as to be electrically coupled to the contact plugs CBL and CSL.

In the memory cell region, conductive regions, namely, channels are formed in the semiconductor layers 31 in the vicinity of the unselected memory cell transistors MC corresponding to the unselected word lines WL applied with the potential Vread. Conductive regions are not formed in the vicinity of the unselected memory cell transistors MC corresponding to the unselected word lines WL applied with the potential Vcounter.

In the vicinity of the select memory cell transistor MC corresponding to the select word line WL applied with the potential Vsense, conductive regions are formed when the select memory cell transistor MCa1 is turned on. On the other hand, conductive regions are not formed when the select memory cell transistor MCa1 is turned off.

Accordingly, when the select memory cell transistor MCa1 is turned on, the contact plug CBL and the contact plug CSL are electrically coupled via the conductive region of the semiconductor layer 31. When the select memory cell transistor MCa1 is turned off, the contact plug CBL and the contact plug CSL are not electrically coupled.

1.4 Voltages of Interconnects in Write Operation

Figure 30:
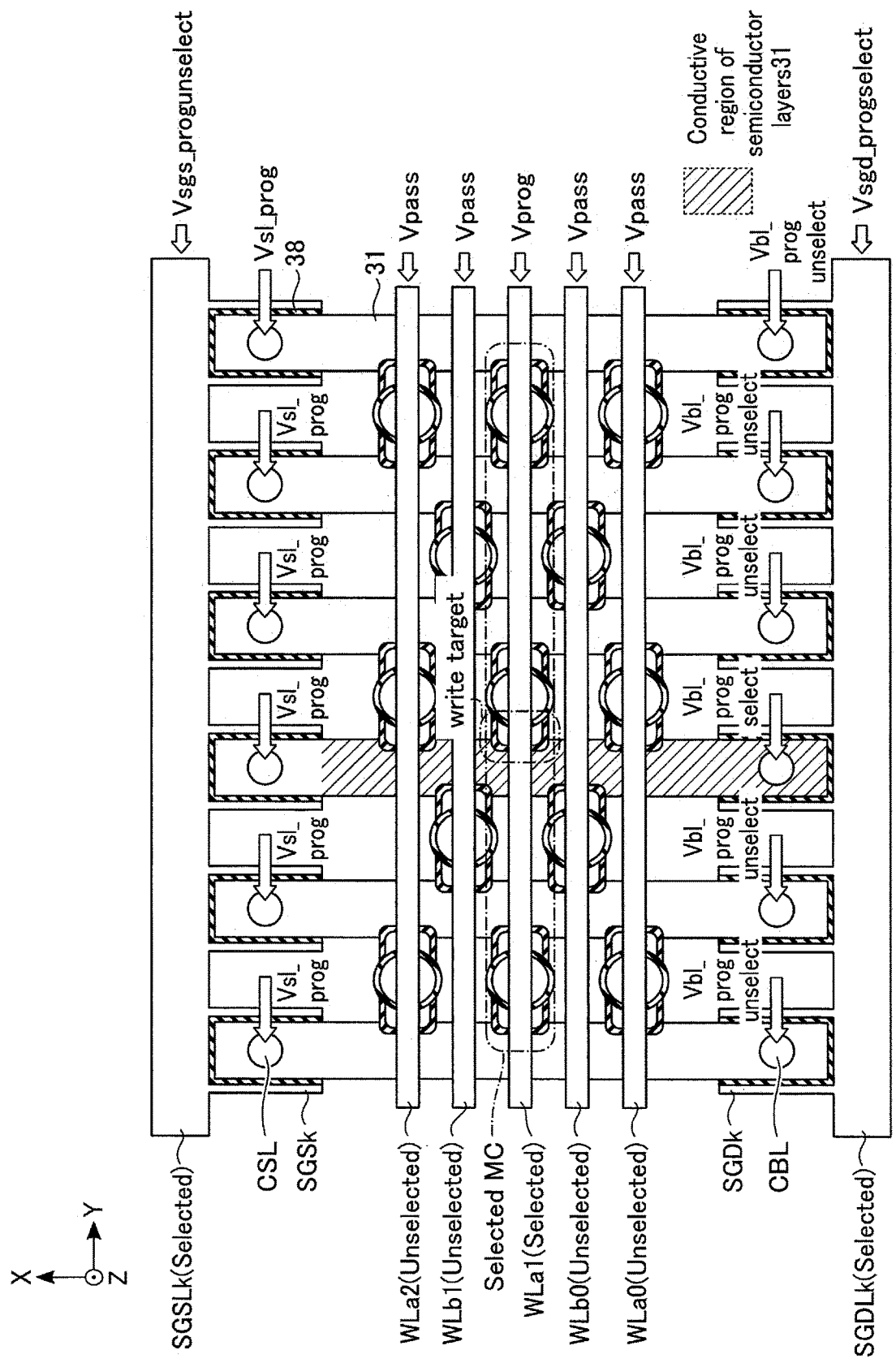
FIG. 30 is a plan view of the memory cell array of the semiconductor memory device according to the first embodiment, showing voltages of interconnects in a write operation.

Next, a description will be given of the voltages of interconnects in a write operation, with reference to FIGS. 29 and 30. FIG. 29 is a circuit diagram of a plurality of memory groups MG stacked in the Z direction and commonly coupled to one contact plug CBL, showing a case, as an example, where a memory cell transistor MCa1 in a memory group MG corresponding to the lowermost select gate line SGDLk is selected as a write target. FIG. 30 is a schematic diagram showing, as an example, a top view of the select gate line SGDLk, a top view of semiconductor layers 31 corresponding thereto, and a top view of word lines WL. In the example of FIG. 30, a description will be given of the case where one semiconductor layer 31 corresponds to one contact plug CSL, in order to simplify the description.

As shown in FIG. 29, the row decoder 19 applies, for example, a gate potential Vsgd_progselect to a select gate line SGDLk corresponding to the selected memory group MG. The gate potential Vsgd_progselect is an appropriate potential that turns on the select transistor.

The row decoder 19 applies a gate potential Vsgd_progunselect to select gate lines SGDL1 to SGDL(k−1) corresponding to the unselected memory group MG. The row decoder 19 also applies a gate potential Vsgs_progunselect to a select gate line SGSLk corresponding to the selected memory group MG and SGSL1 to SGSL(k−1) corresponding to the unselected memory groups MG. The gate potentials Vsgd_progunselect and Vsgs_progunselect are an appropriate potentials that turn off the select transistors. Thereby, a select transistor ST2 corresponding to the selected memory group MG and select transistors ST1 and ST2 corresponding to the unselected memory group MG are turned off.

The row decoder 19 applies a write potential Vprog to a selected word line WLa1 corresponding to the selected memory cell transistor MCa1, and applies a potential Vpass to unselected word lines WLa0, WLa1, WLa3, and WLb0 to WLb3. The potential Vprog is sufficiently high as to allow electrons to be injected into the charge storage layer 35. The potential Vpass is a potential that turns on the memory cell transistor MC, regardless of the threshold of the memory cell transistor MC. The potential Vprog and the potential Vpass satisfy the relationship of Vprog>Vpass.

In this state, the sense amplifier 20 applies, for example, a potential Vbl_progselect to a bit line BL to be made a write target, and applies, for example, a potential Vbl_progunselect to a bit line BL not to be a write target. The potential Vbl_progselect is an appropriate potential that turns on the select gate transistor. The potential Vbl_progunselect is an appropriate potential that turns off the select gate transistor. Thereby, of the select transistors ST1 corresponding to the select gate line SGDLk, a select transistor ST1 corresponding to the contact plug CBL applied with the potential Vbl_progunselect is turned off, and a select transistor ST1 corresponding to the contact plug CBL applied with the potential Vbl_progselect are turned on.

As shown in FIG. 30, a write operation is performed in a memory cell transistor MCa1 corresponding to the selected word line WLa1 and the select gate line SGDL0, and corresponding to a contact plug CBL applied with the potential Vbl_progselect.

More specifically, in the SGD and memory cell regions, a conductive region is formed in a semiconductor layer 31 corresponding to a contact plug CBL applied with the potential Vbl_progselect, so as to electrically couple the memory cell transistor MCa1 to be made a write target and the contact plug CBL. On the other hand, a conductive region is not formed in a semiconductor layer 31 corresponding to a contact plug CBL applied with the potential Vbl_progunselect. Accordingly, memory cell transistors MCa1, not to be made a write target, are made to a floating state.

In this state, when a write potential Vprog is applied to the word line pillar WLP coupled to the selected word line WLa1, charge is injected into the charge storage layer 35 by a potential difference between the word line pillar WLP and the channel in the memory cell transistor MCa1 to be made a write target. On the other hand, in a memory cell transistor MCa1 not to be made a write target, charge is hardly injected into the charge storage layer 35, since the coupling caused by the potential Vprog and potential Vpass increase the potential of the channel.

1.5 Voltages of Interconnects in Erase Operation

Figure 31:
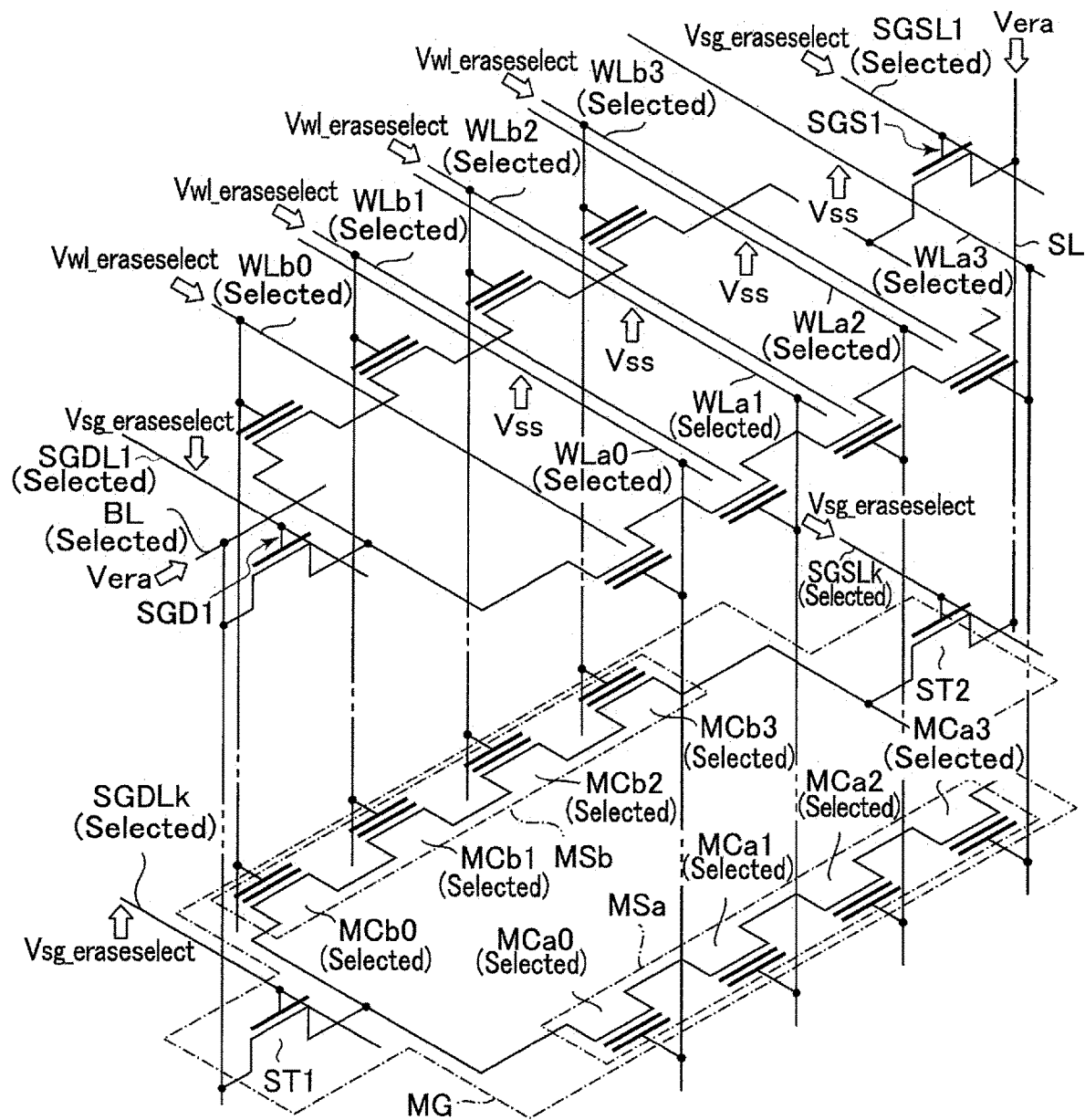
FIG. 31 is a circuit diagram of the memory cell array of the semiconductor memory device according to the first embodiment, showing voltages of interconnects in an erase operation.
Figure 32:
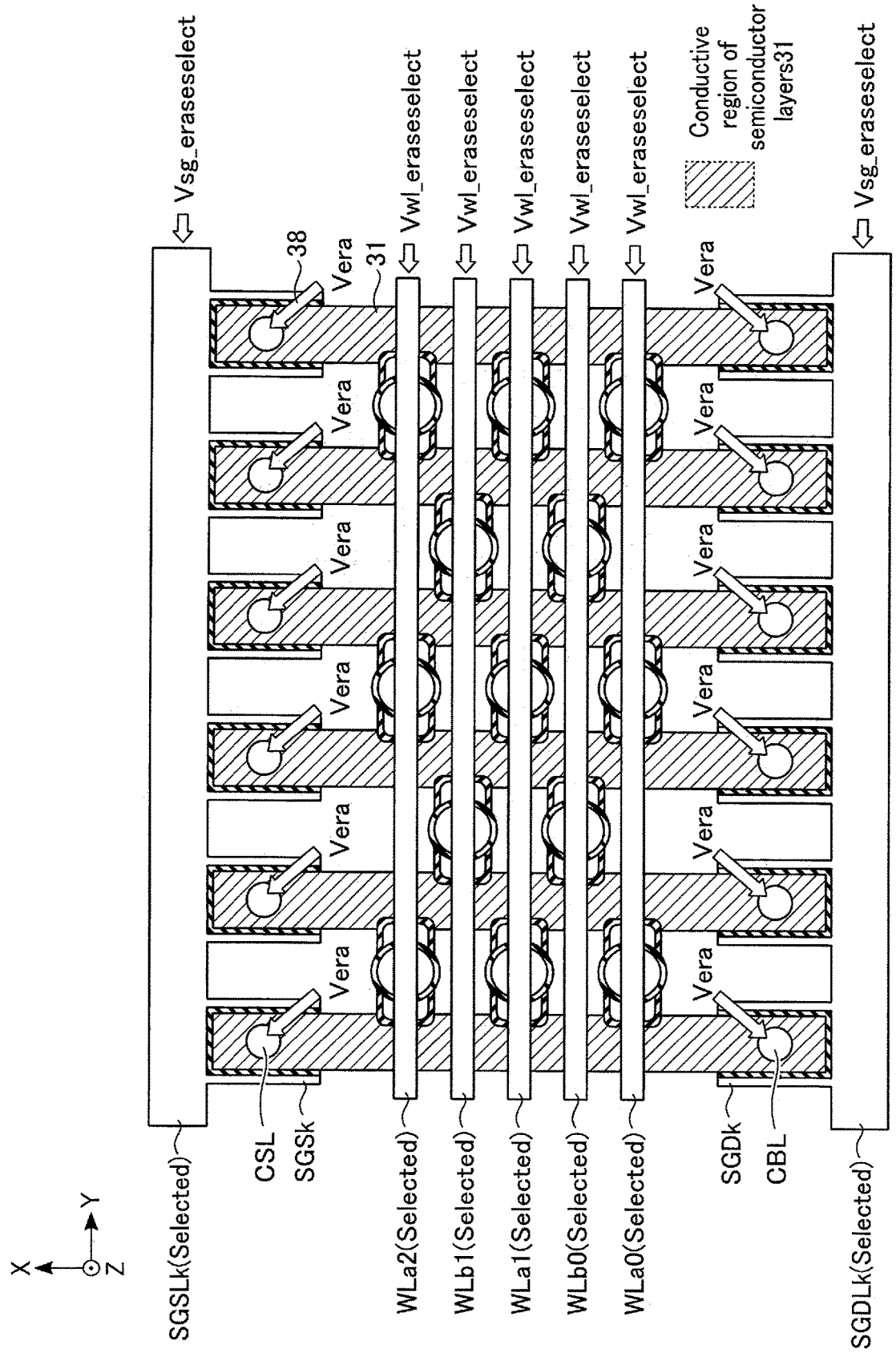
FIG. 32 is a plan view of the memory cell array of the semiconductor memory device according to the first embodiment, showing voltages of interconnects in an erase operation.

Next, a description will be given of the voltages of interconnects in an erase operation, with reference to FIGS. 31 and 32. FIG. 31 shows, as an example, a circuit diagram of a plurality of memory groups MG stacked in the Z direction and commonly coupled to one contact plug CBL. FIG. 32 is a schematic diagram showing, as an example, a top view of the select gate line SGDLk, a top view of semiconductor layers 31 corresponding thereto, and a top view of word lines WL. In the example of FIG. 32, a description will be given of the case where one semiconductor layer 31 corresponds to one contact plug CSL, in order to simplify the description.

In an erase operation, memory cell transistors MC included in one block BLK, for example, are selected as erase targets. Accordingly, in the example of FIG. 35, memory cell transistors MCa0 to MCa3 and MCb0 to MCb3 stacked in the Z direction, and included in each memory group MG commonly coupled to one contact plug CBL, are selected as erase targets.

As shown in FIG. 31, the row decoder 19 applies a potential Vera to the source line SL. The potential Vera is the high potential that extracts electrons from the charge storage layer 35. The row decoder 19 also applies a potential Vsg_eraseselect to the select gate lines SGDL and SGSL corresponding to the selected block BLK. The potential Vsg_eraseselect is an appropriate potential that transfers the potential Vera.

The row decoder 19 applies a potential Vwl_eraseselect to word lines WL corresponding to the selected block BLK. The memory cell transistor MC applied the potential Vwl_eraseselect has an appropriate erase characteristics.

As shown in FIG. 32, in an erase operation, the erase potential Vera is applied between the semiconductor layer 31 and the word line pillar WLP, so as to erase data in each memory cell transistor MC.

1.6 Effects of Present Embodiment

According to the configuration of the present embodiment, it is possible to provide a semiconductor memory device with improved reliability. This advantageous effect will be described in detail below.

According to the configuration of the present embodiment, a cell structure is provided in which a plurality of memory strings MS, each including a plurality of memory cell transistors MC coupled in series, are formed along the XY plane parallel to the semiconductor substrate, and word line pillars WLP coupled to word lines WL corresponding thereto extend in the Z direction.

With such a configuration, it is possible to freely set the length of the semiconductor layers 31 corresponding to one memory group MG, namely, the channel length of the memory string MS, regardless of the number of the memory cell transistors MC stacked in the Z direction. This suppresses increase in channel resistance in a memory string MS, and suppresses decrease in cell current. It is thus possible to suppress incorrect read and improve reliability of the semiconductor memory device.

Moreover, according to the configuration of the present embodiment, it is possible to form a contact plug CSGD (or CSGS) that penetrates a plurality of select gate lines SGDL (or SGSL) stacked in the Z direction and electrically coupled to one of the select gate lines SGDL.

In the case of, for example, forming lead portions in the form of a staircase by multiplying the number corresponding to the number of stacked select gate lines SGDL by the number of bit lines BL arranged in the Y direction, and forming contact plugs on the respective lead portions, the area of the select gate contact region increases as the number of stacked select gate lines SGDL (semiconductor layers 31) increases. Such a restriction on the chip area restricts the number of select gate lines SGDL (semiconductor layers 31) that can be stacked. On the other hand, according to the configuration of the present embodiment, the area of the select gate contact region can be kept constant, regardless of the number of layers stacked in the Z direction, thus increasing the number of layers that can be stacked. It is thus possible to increase the number of bits per chip, resulting in reduction in bit cost.

Moreover, according to the configuration of the present embodiment, it is possible to arrange a plurality of contact plugs CBL respectively coupled to a plurality of semiconductor layers 31, arranged along the Y direction in a plurality of rows in a staggered manner. It is thereby possible to shorten the interval between the semiconductor layers 31 as viewed in the Y direction, as compared to an arrangement other than the staggered arrangement. This suppresses increase in chip area of the semiconductor memory device.

Furthermore, according to the configuration of the present embodiment, memory strings MS (memory cell transistors MC) are provided in one semiconductor layer 31 on their two sides extending in the X direction. It is thereby possible to increase the cell density in the memory cell region.

Furthermore, according to the configuration of the present embodiment, a plurality of word line pillars WLP provided in the memory cell region can be arranged in a staggered manner. It is thereby possible to lengthen the distance between two memory cell transistors MC provided on opposed sides of the semiconductor layer 31, as compared to the case where a plurality of word line pillars WLP are arranged along the Y direction. This suppresses interference from opposed memory strings MS by coupling, etc., and suppresses incorrect read.

Second Embodiment

Next, a second embodiment will be described. In the second embodiment, two examples will be described of the case where a plurality of memory cell arrays are stacked. Hereinafter, the explanation will focus mainly on the matters which differ from the first embodiment.

2.1 First Example

Figure 33:
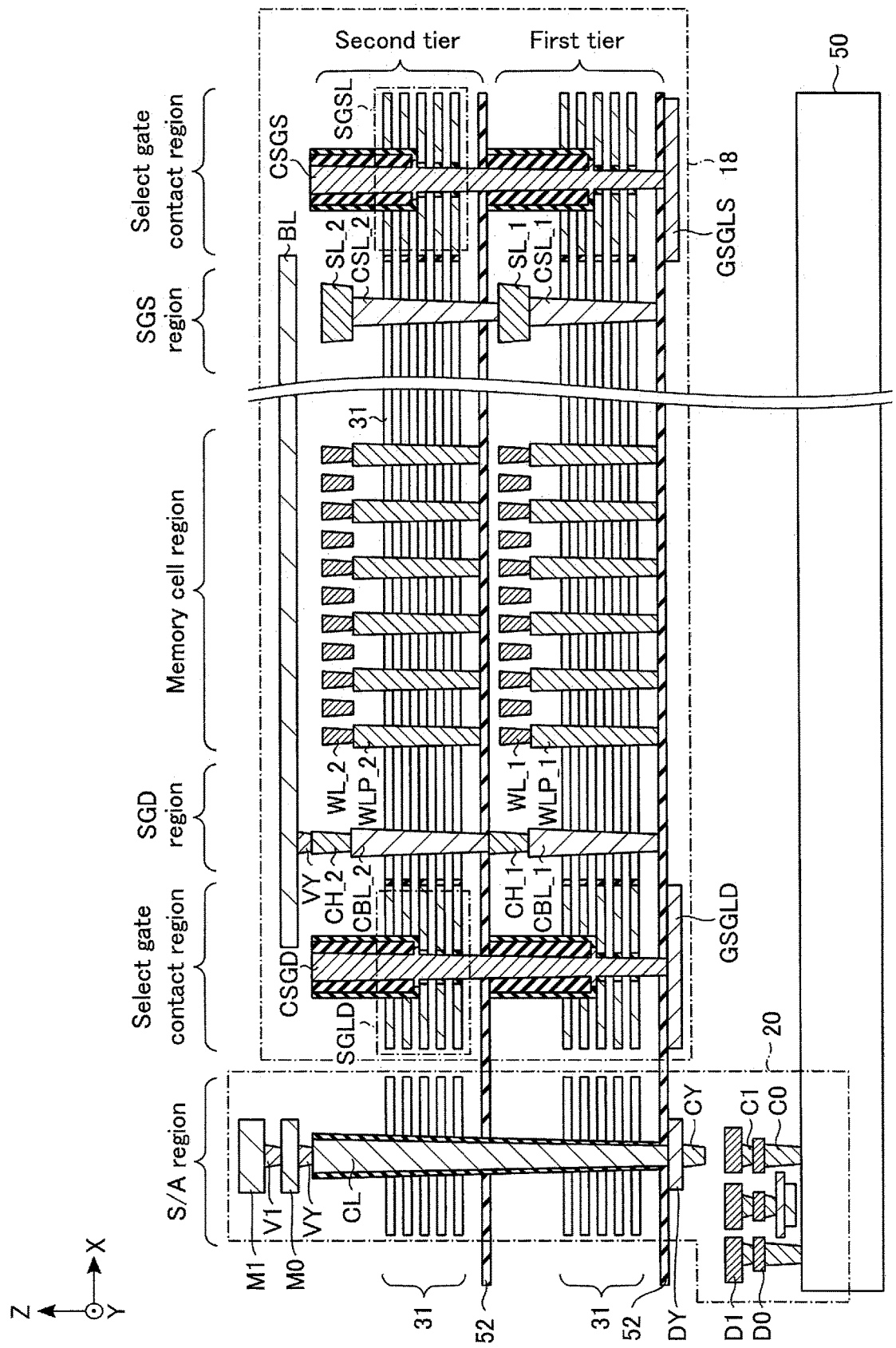
FIG. 33 is a sectional view of a memory cell array of a semiconductor memory device according to a first example of a second embodiment.

A cross-sectional configuration of a memory cell array 18 according to a first example will be described with reference to FIG. 33. In order to simplify the description, FIG. 33 shows an example in which only one transistor to be used for a sense amplifier 20 is shown on a semiconductor substrate 50. In the example of FIG. 33, insulating layers are partly omitted.

As shown in FIG. 33, a transistor to be used for, for example, the sense amplifier 20 is formed on the semiconductor substrate 50, and a first tier and a second tier of the memory cell array 18 are stacked above the semiconductor substrate 50. Each of the first tier and the second tier corresponds to the configuration of the memory cell array 18 described with reference to the first embodiment.

More specifically, a transistor to be used for, for example, the sense amplifier 20 is formed on the semiconductor substrate 50 in an S/A region. For example, interconnect layers D0 and D1 are coupled onto the source and drain of the transistor via contact plugs C0 and C1. The interconnect layers D0 and D1 are coupled to the gate electrode of the transistor via the contact plugs C0 and C1.

A contact plug CY is formed above the interconnect layer D1 corresponding to either the source or the drain of the transistor, and an interconnect layer DY is formed on the contact plug CY.

Global select gate lines GSGDL and GSGSL are formed at the same layer as the interconnect layer DY.

An insulating layer 52 is formed on the global select gate lines GSGDL and GSGSL, and the first tier is formed thereon.

At the first tier, a word line WL_1 corresponding to the first tier is formed on a word line pillar WLP_1. A contact plug CH_1 is formed on a contact plug CBL_1, and a source line SL_1 is formed on a contact plug CSL_1. A contact plug CSGD is coupled to one of the select gate lines SGDL of the first tier, and to one of the select gate lines SGDL of the second tier; it is also coupled to, at its bottom, the global select gate line GSGDL. Similarly, a contact plug CSGS is coupled to one of the select gate lines SGSL of the first tier, and to one of the select gate lines SGSL of the second tier; and it is also coupled to, at its bottom, the global select gate line GSGSL.

An insulating layer 52 corresponding to the second tier is formed above the word line WL_1 of the first tier, and the second tier is formed thereon.

At the second tier, a word line WL_2 corresponding to the second tier is formed on a word line pillar WLP_2.

A contact plug CBL_2 of the second tier is formed on the contact plug CH_1 of the first tier, so as to penetrate the insulating layer 52. A contact plug CH_2 corresponding to the second tier is formed on a contact plug CBL_2 of the second tier, and a contact plug VY is formed on the contact plug CH_2. A bit line BL extending in the X direction is formed on the contact plug VY. That is, the contact plugs CBL_1 and CBL_2 are coupled to one bit line BL.

The contact plug CSL_2 of the second tier is formed on the source line SL_1 of the first tier, so as to penetrate the insulating layer 52. A source line SL_2 is formed on the contact plug CSL_2 of the second tier. That is, the source line SL_1 of the first tier and the source line SL_2 of the second tier are commonly coupled.

In the S/A region, a contact plug CL that penetrates the first tier and the second tier of the memory cell array and that reaches, at its bottom, the interconnect layer DY is formed. An insulating layer is formed on the side of the contact plug CL, and is electrically decoupled from the semiconductor layer 31. Interconnect layers M0 and M1 are coupled onto the contact plug CL via the contact plugs VY and V1.

2.2 Second Example

Next, a description will be given of a memory cell array 18 according to a second example.

2.2.1 Configuration of Memory Cell Array

Figure 34:
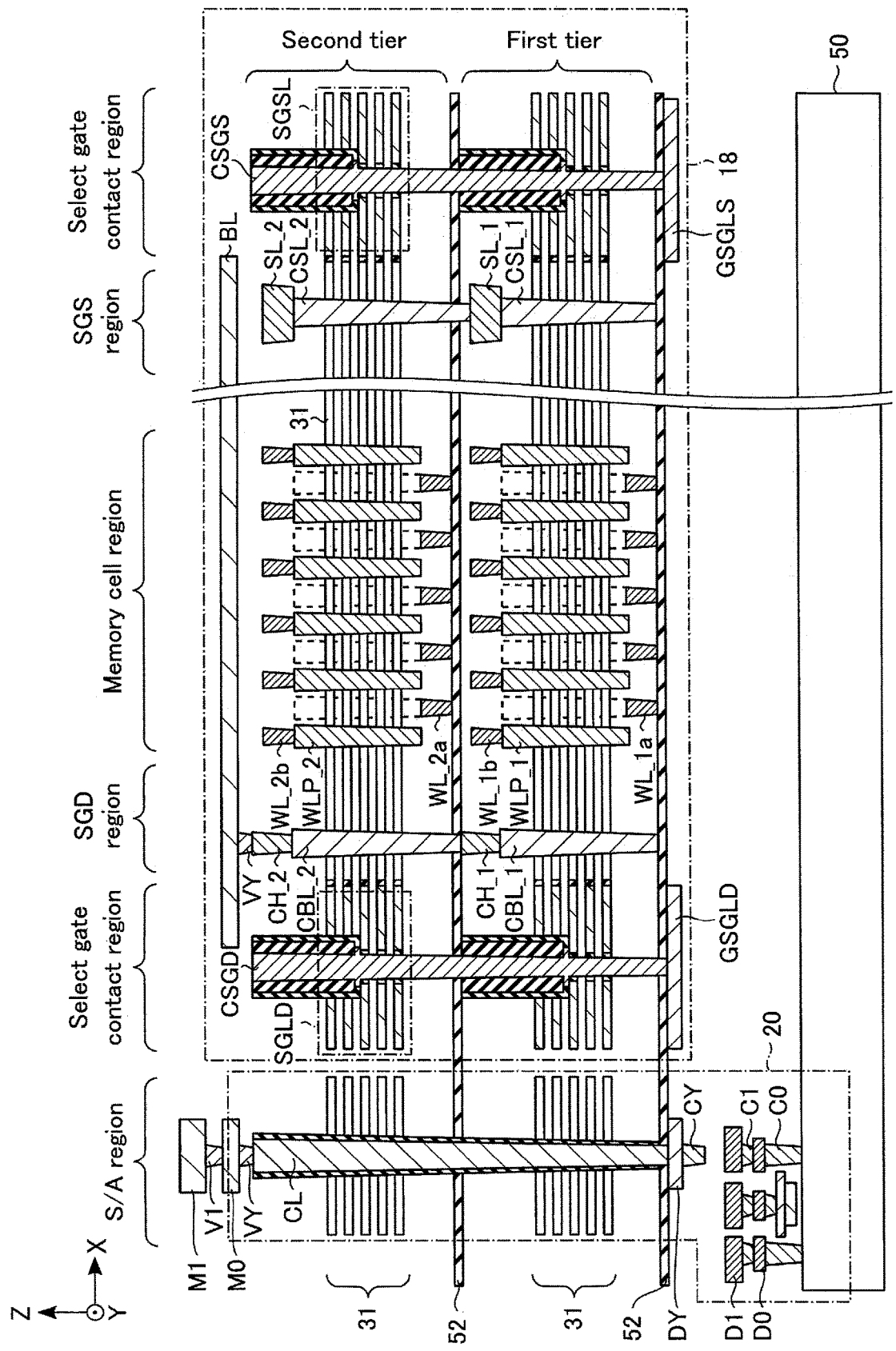
FIG. 34 is a sectional view of a memory cell array included in a semiconductor memory device according to a second example of the second embodiment.

A cross-sectional configuration of the memory cell array 18 according to the second example will be described with reference to FIG. 34. In order to simplify the description, FIG. 34 shows an example in which only one transistor to be used for a sense amplifier 20 is shown on a semiconductor substrate 50. In the example of FIG. 34, insulating layers are partly omitted. Hereinafter, the explanation will focus mainly on the matters which differ from the first example.

As shown in FIG. 34, the second example is configured in such a manner that word lines WL are alternately arranged above and below the semiconductor layer 31 as viewed in the X direction at each tier, in such a manner that the word lines WL are in contact with either the top surface or the bottom surface of the word line pillar WLP.

More specifically, a word line WL_1a is formed on an insulating layer 52, and its bottom is coupled to the word line pillar WLP_1. On the other hand, the word line WL_1b is formed on the word line pillar WLP_1.

The arrangement of the word lines WL_2a and WL_2b at the second tier is similar to the arrangement of the word lines WL_1a and WL_1b, respectively.

Figure 37:
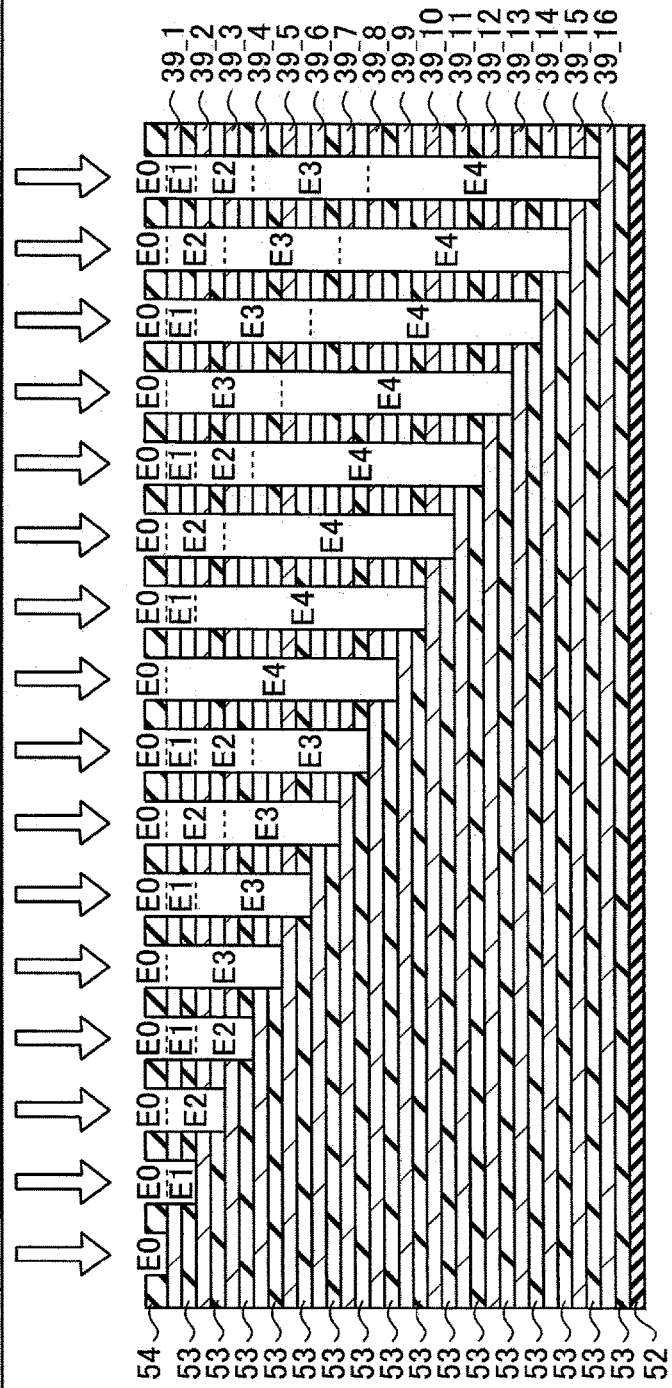
FIG. 37 is a diagram showing a method of forming a hole HL1 in a memory cell array included in a semiconductor memory device according to a fourth embodiment.

The other configuration is similar to that of the first example shown in FIG. 37.

2.2.2 Voltages of Interconnects in Read Operation

Figure 35:
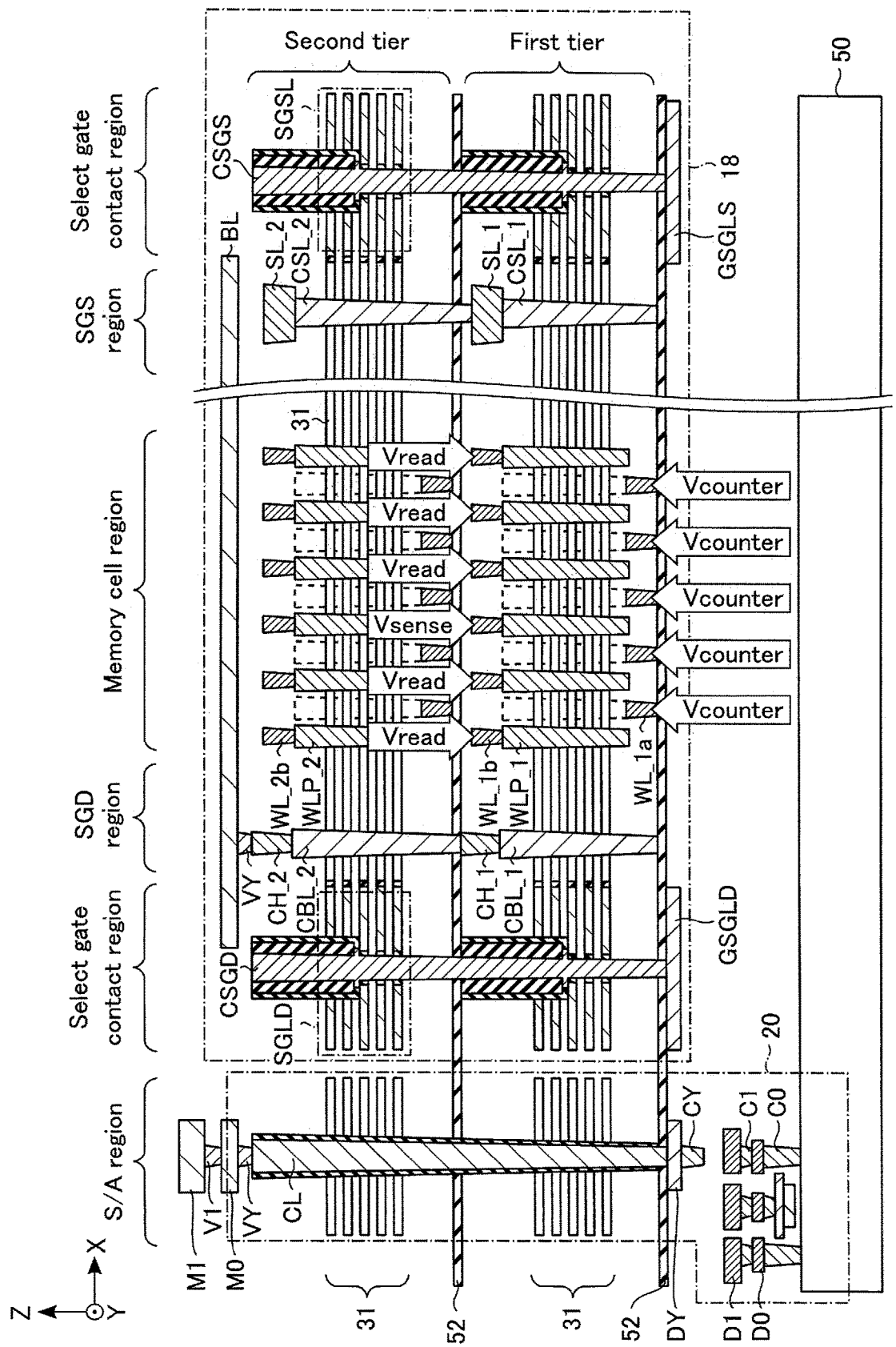
FIG. 35 is a sectional view of the memory cell array of the semiconductor memory device according to the second example of the second embodiment, showing voltages of word lines in a read operation.

Next, a description will be given of the voltages of interconnects in a read operation, with reference to FIG. 35. FIG. 35 shows a case, as an example, where one of the word lines WL_1b at the first tier is selected in a read operation. The voltages applied to the bit lines BL, the source line SL, and the select gate lines SGDL and SGSL, are the same as those shown in FIGS. 27 and 28 of the first embodiment, and are therefore omitted in the example of FIG. 35 in order to simplify the description.

As shown in FIG. 35, the row decoder 19 applies a potential Vcounter to an unselected word line WL_1a, applies a potential Vsense to a selected word line WL_1b, and applies a potential Vread to a unselected word line WL_1b, at the first tier.

When the word lines WL_1a and WL_1b are alternately arranged above and below the semiconductor layers 31, word lines WL applied with the potential Vread (which is a positive voltage) and word lines WL applied with the potential Vcounter (which is, for example, a negative voltage) are separately arranged above and below the semiconductor layers 31 in a read operation.

2.3 Configuration of Present Embodiment

According to the configuration of the present embodiment, it is possible to obtain an advantageous effect similar to that of the first embodiment.

Moreover, according to the configuration of the present embodiment, it is possible to freely set the height of a word line pillar WLP corresponding to one tier, regardless of the number of memory cell transistors MC stacked in the Z direction, thereby suppressing an increase in resistance of the word line pillar WLP.

Furthermore, according to the configuration of the second example of the present embodiment, it is possible to alternately arrange a plurality of word lines WL above and below the semiconductor layers 31, as viewed in the X direction. It is thus possible to lengthen the interconnect interval between the word lines WL at the same layer as viewed in the X direction, as compared to the interval of the word line pillars WLP. In addition, in a read operation, for example, word lines WL applied with a potential Vread (which is a positive voltage) and word lines WL applied with a potential Vcounter (which is, for example, a negative voltage) are separately arranged above and below the semiconductor layers 31. It is thus possible to reduce the interconnect capacitance between the word lines WL at a single layer.

3. Third Embodiment

Next, a third embodiment will be described. In the third embodiment, a case will be described where a global select gate line GSGDL (and GSGSL) is coupled to a plurality of contact plugs CSGD (and CSGS), which are in turn coupled to one select gate line SGDL (and SGSL). Hereinafter, the explanation will focus mainly on the matters which differ from the first and second embodiments.

3.1 Layout of Global Select Gate Lines

Figure 36:
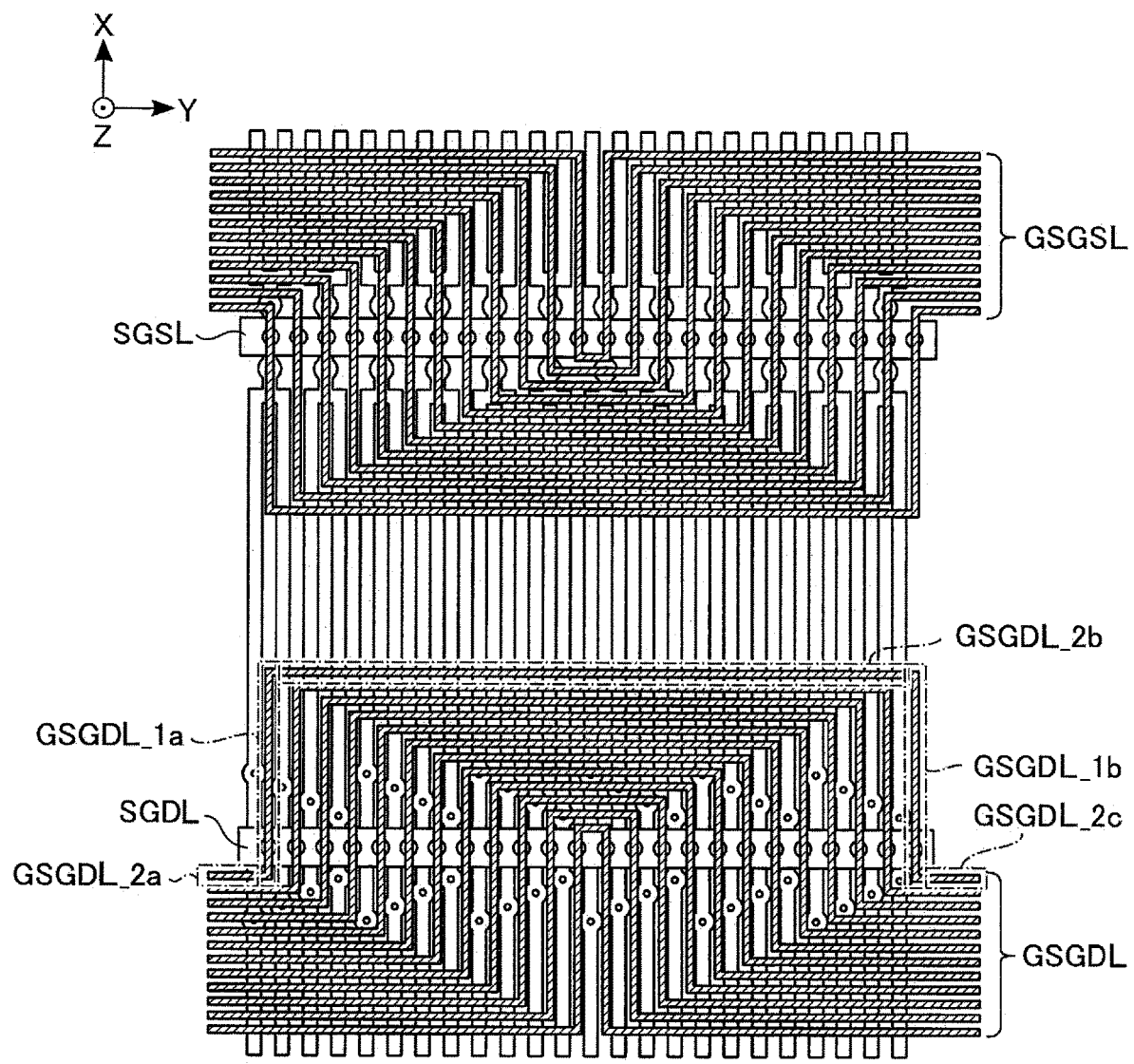
FIG. 36 is a schematic diagram showing global select gate lines in a memory cell array included in a semiconductor memory device according to a third embodiment.

A description will be given of the layout of the global select gate lines GSGDL and GSGSL, with reference to FIG. 36. FIG. 36 is a schematic diagram showing the arrangement of the global select gate lines GSGDL and GSGSL in the memory cell array 18. The global select gate lines GSGDL and GSGSL are provided at, for example, the lowermost layer of the memory cell array 18. FIG. 36 shows a case, as an example, where one global select gate line GSGDL (and GSGSL) is coupled to two contact plugs CSGD (and CSGS). In the example of FIG. 40, insulating layers are partly omitted.

As shown in FIG. 36, each of the global select gate lines GSGDL includes first portions GSGDL_1a and GSGDL_1b, and second portions GSGDL_2a, GSGDL_2b, and GSGDL_2c. The two first portions GSGDL_1a and GSGDL_1b are extending in the X direction and are respectively coupled to two contact plugs CSGD. The second portion GSGDL_2b is extending in the Y direction and is coupling one end of the first portion GSGDL_1a and one end of the first portion GSGDL_1b. The second portion GSGDL_2a is extending in the Y direction and is coupled to the other end of the first portion GSGDL_1a. The second portion GSGDL_2c is extending in the Y direction and is coupled to the other end of the first portion GSGDL_1b.

That is, each global select gate line GSGDL is repeatedly bent in the XY plane, and coupled to two contact plugs CSGD. In other words, the global select gate line GSGDL has at least two crank shapes.

The same is true of the global select gate lines GSGSL. The number of contact plugs CSGD (and CSGS) coupled to one global select gate line GSGDL (and GSGSL) may be three or more.

3.2 Advantageous Effect of Present Embodiment

The configuration of the present embodiment is applicable to the first and second embodiments.

Moreover, according to the configuration of the present embodiment, it is possible to provide a plurality of contact plugs CSGD (or CSGS) that are coupled to one select gate line SGDL (or SGSL). It is thereby possible to reduce the distance from the contact plugs CSGD (or CSGS) to the semiconductor layers 31 coupled to one select gate line SGDL (or SGSL), namely, variation in interconnect resistance.

Furthermore, according to the configuration of the present embodiment, global select gate lines GSGDL (or GSGSL) and select gate lines SGDL (or SGSL) are coupled in parallel via a plurality of contact plugs CSGD (or CSGS). Thus, it is possible to reduce the effective interconnect resistance of the select gate line SGDL (or SGSL).

4. Fourth Embodiment

Next, a fourth embodiment will be described. In the fourth embodiment, a case will be described where a plurality of holes HL1, respectively corresponding to $2^n$ conductive layers 39 (where n is any integer) stacked in the Z direction, are formed by (n+1) processes (of lithography and etching). In the description that follows, a case will be described where a hole HL1 is formed in a select gate line SGDL; however, the same applies to the case where a hole HL1 is formed in a select gate line SGSL.

4.1 Method of Forming Holes HL1

A method of forming holes HL1 will be described below, with reference to FIG. 37. FIG. 37 shows, as an example, a table showing processing conditions of 16 holes HL1 that respectively correspond to 16 ($=2^4$) conductive layers 39_1 to 39_16 stacked in the Z direction, and a cross section of the SGD region. In the table of FIG. 37, "1" represents a case where etching is performed, and "0" represents a case where etching is not performed by protecting the surface with a resist mask. The 16 conductive layers 39 (select gate lines SGDL) will be referred to as "39_1" to "39_16" in order from top to bottom.

As shown in FIG. 37, in the present embodiment, 16 holes HL1 are formed by five (=4+1) processes E0 to E4, in such a manner that the bottom of each hole HL1 reaches the top of the corresponding one of the 16 conductive layers 39_1 to 39_16.

In the first process E0, holes HL1 are etched in an insulation layer 54 (hard mask HM) provided at the uppermost layer on the conductive layer 39_1, so as to respectively reach the conductive layers 39_1 to 39_16. At this time, the conductive layers 39 are not etched. That is, in the process E0, the conductive layers 39 are etched by zero layers.

Thereafter, in the second process E1, the holes HL1 are etched in one ($2^0$) of the conductive layers 39, so as to respectively reach the conductive layers 39_2, 39_4, 39_6, 39_8, 39_10, 39_12, 39_14, and 39_16. More specifically, the holes HL1 are etched in the conductive layer 39 and the insulating layer 53 from the top.

Thereafter, in the third process E2, the holes HL1 are etched in two ($2^1$) of the conductive layers 39, so as to respectively reach the conductive layers 39_3, 39_4, 39_7, 39_8, 39_11, 39_12, 39_15, and 39_16. More specifically, the holes HL1 are etched in two of conductive layers 39 and two of insulating layers 53 from the top.

In the fourth process E3, the holes HL1 are etched in four ($2^2$) of the conductive layers 39, so as to respectively reach the conductive layers 39_5, 39_6, 39_7, 39_8, 39_13, 39_14, 39_15, and 39_16. More specifically, the holes HL1 are etched in four of conductive layers 39 and four of insulating layers 53 from the top.

Thereafter, in the fifth process E4, the holes HL1 are etched in eight ($2^3$) of the conductive layers 39, so as to respectively reach the conductive layers 39_9, 39_10, 39_11, 39_12, 39_13, 39_14, 39_15, and 39_16. More specifically, the holes HL1 are etched in eight of conductive layers 39 and eight of insulating layers 53 from the top.

The order of the processes E1 to E4 may be set freely. The processes may be performed in the order of, for example, E4, E3, E2, and E1, in such a manner that a process requiring a higher amount of etching is performed earlier, to allow for a greater processing margin.

4.2 Advantageous Effect of Present Embodiment

The configuration of the present embodiment is applicable to the first to third embodiments.

Moreover, according to the configuration of the present embodiment, it is possible to increase the number of layers of the conductive layers 39 (select gate lines SGDL) to be etched to the power of two, in the processing of the holes HL1. It is thereby possible to reduce the number of processes, as compared to the case where holes HL1 are formed one by one, by repeating the processes by the number of layers of the conductive layers 39. Thus, it is possible to reduce the number of processes required in manufacturing the semiconductor memory device, and reduce the manufacturing cost.

5. Modifications, Etc

According to above embodiments, a semiconductor memory device includes: a conductive layer (39) including a first portion (SGDL) extending in a first direction (Y direction) and a second portion (SGD) electrically coupled to the first portion and extending in a second direction (X direction) intersecting the first direction; a first contact plug (CSGD) extending in a third direction (Z direction) intersecting the first and second directions, and electrically coupled to the first portion; a first semiconductor layer (31) extending in the second direction; a first insulating layer (38) between the second portion and the first semiconductor layer, and between the first portion and the first semiconductor layer; a second contact plug (CBL) extending in the third direction, and coupled to the first semiconductor layer in a region (SGD region) in which the first insulating layer is formed; a first interconnect (WLP) extending in the third direction; and a first memory cell (MC) apart from the second portion in the second direction and storing information between the first semiconductor layer and the first interconnect.

It is possible to provide a semiconductor memory device with improved reliability by applying the above-described embodiments. The embodiments are not limited to the above-described embodiments, and various modifications can be made.

The term "couple" in the above-described embodiments includes indirect coupling via a transistor, a resistor or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a conductive layer including a first portion and a second portion, the first portion extending in a first direction, and the second portion electrically coupled to the first portion and extending in a second direction intersecting the first direction;
    a first contact plug extending in a third direction intersecting the first and second directions, and electrically coupled to the first portion;
    a first semiconductor layer extending in the second direction;
    a first insulating layer between the second portion and the first semiconductor layer, and between the first portion and the first semiconductor layer;
    a second contact plug extending in the third direction, and coupled to the first semiconductor layer in a region in which the first insulating layer is formed;
    a first interconnect extending in the third direction; and a first memory cell apart from the second portion in the second direction and storing information between the first semiconductor layer and the first interconnect;
    a second semiconductor layer adjacent to the first semiconductor layer in the first direction and extending in the second direction;
    a fourth insulating layer; and a second memory cell apart from the first memory cell in the first direction and storing information between the first interconnect and the second semiconductor layer,
    wherein the conductive layer further includes a third portion apart from the second portion in the first direction and extending in the second direction, and
    the fourth insulating layer is provided between the second semiconductor layer and the third portion, and between the second semiconductor layer and the first portion.

2. The device according to claim 1, wherein
    the first memory cell includes:
    a second insulating layer between the first interconnect and the first semiconductor layer;
    a charge storage layer between the first interconnect and the second insulating layer; and
    a third insulating layer between the first interconnect and the charge storage layer.

3. The device according to claim 1, wherein
the first insulating layer is provided between a surface of the second portion facing the first direction and a surface of the first semiconductor layer facing the first direction and opposed to the surface of the second portion facing the first direction, and between a surface of the first portion facing the second direction and a surface of the first semiconductor layer opposed to the surface of the first portion facing the second direction.

4. The device according to claim 1, further comprising:
a second conductive layer including a fourth portion and a fifth portion, the fourth portion extending in the first direction, and the fifth portion extending in the second direction;
a third contact plug extending in the third direction and electrically coupled to the fourth portion;
a fifth insulating layer between the fifth portion and the first semiconductor layer, and between the fourth portion and the first semiconductor layer; and
a fourth contact plug extending in the third direction, and coupled to the first semiconductor layer in a region in which the fifth insulating layer is formed.

5. The device according to claim 1, further comprising:
a second interconnect between the first semiconductor layer and the second semiconductor layer, adjacent to the first interconnect in the second direction, and extending in the third direction;
a third memory cell apart from the first memory cell in the second direction and storing information between the second interconnect and the first semiconductor layer, and
a fourth memory cell apart from the second memory cell in the second direction and storing information between the second interconnect and the second semiconductor layer.

6. The device according to claim 5, further comprising:
a third interconnect arranged between the first interconnect and the second interconnect in the second direction, arranged at a position different from the first and second interconnects in the first direction, and extending in the third direction; and
a fifth memory cell apart from the first and third memory cells in the second direction and storing information between the third interconnect and the second semiconductor layer.

7. The device according to claim 1, further comprising:
a fourth interconnect electrically coupled to the first interconnect and extending in the first direction.

8. The device according to claim 1, further comprising:
a fifth interconnect electrically coupled to the second contact plug and extending in the second direction.

9. The device according to claim 4, further comprising:
a sixth interconnect electrically coupled to the fourth contact plug and extending in the first direction.

10. A semiconductor memory device comprising:
a first semiconductor layer extending in a first direction parallel to a semiconductor substrate;
a second semiconductor layer above the first semiconductor layer in a second direction perpendicular to the semiconductor substrate, and extending in the first direction;
third and fourth semiconductor layers respectively arranged adjacent to the first and second semiconductor layers in a third direction intersecting the first and second directions, and extending in the first direction;
a first interconnect between the first semiconductor layer and the third semiconductor layer, between the second semiconductor layer and the fourth semiconductor layer, and extending in the second direction;
a first memory cell storing information between the first semiconductor layer and the first interconnect;
a second memory cell storing information between the second semiconductor layer and the first interconnect;
a third memory cell storing information between the third semiconductor layer and the first interconnect;
a fourth memory cell storing information between the fourth semiconductor layer and the first interconnect;
first to fourth insulating layers that are respectively in contact with sides of the first to fourth semiconductor layers in a first region;
a first conductive layer including a side that is in contact with the first and third insulating layers in the first region; and
a second conductive layer above the first conductive layer and including a side that is in contact with the second and fourth insulating layers in the first region.

11. The device according to claim 10, wherein
the first region includes one-end portions of the first to fourth semiconductor layers,
the first insulating layer is, in the first region, in contact with a side of the one-end portion of the first semiconductor layer and a part of a side of the first semiconductor layer extending in the first direction from the one-end portion,
the second insulating layer is, in the first region, in contact with a side of the one-end portion of the second semiconductor layer and a part of a side of the second semiconductor layer extending in the first direction from the one-end portion,
the third insulating layer is, in the first region, in contact with a side of the one-end portion of the third semiconductor layer and a part of a side of the third semiconductor layer extending in the first direction from the one-end portion,
the fourth insulating layer is, in the first region, in contact with a side of the one-end portion of the fourth semiconductor layer and a part of a side of the fourth semiconductor layer extending in the first direction from the one-end portion,
the first conductive layer includes a first portion and a plurality of second portions, the first portion extending in the third direction and being in contact with a part of the first and third insulating layers, and one end of each of the second portions being coupled to the first portion and in contact with a side of the first or third insulating layer extending in the first direction, and
the second conductive layer includes a third portion and a plurality of fourth portions, the third portion extending in the third direction, being in contact with a part of the second and fourth insulating layers, and provided above the first portion of the first conductive layer, and each of the fourth portions extending in the first direction, including one end coupled to the third portion, and being in contact with a side of the second or fourth insulating layer extending in the first direction.

12. The device according to claim 11, further comprising:
a first contact plug extending in the second direction, and electrically coupled to the first portion of the first conductive layer; and
a second contact plug extending in the second direction and electrically coupled to the third portion of the second conductive layer.

13. The device according to claim 10, further comprising:
a first transistor including, in the first region, a part of the first semiconductor layer, a part of the first conductive layer, and a part of the first insulating layer;
a second transistor including, in the first region, a part of the second semiconductor layer, a part of the second conductive layer, and a part of the second insulating layer;
a third transistor including, in the first region, a part of the third semiconductor layer, a part of the first conductive layer, and a part of the third insulating layer; and
a fourth transistor including, in the first region, a part of the fourth semiconductor layer, a part of the second conductive layer, and a part of the fourth insulating layer.

14. The device according to claim 10, further comprising:
a fifth insulating layer provided between the first semiconductor layer and the first interconnect;
a charge storage layer provided between the fifth insulating layer and the first interconnect; and
a sixth insulating layer provided between the charge storage layer and the first interconnect.

15. The device according to claim 10, further comprising:
a third contact plug in the first region, extending in the second direction, penetrating the first and second semiconductor layers, and respectively coupled to the first and second semiconductor layers; and
a fourth contact plug in the first region, extending in the second direction, penetrating the third and fourth semiconductor layers, and respectively coupled to the third and fourth semiconductor layers.

16. The device according to claim 15, wherein
the fourth contact plug is arranged at a position different from the third contact plug in the first and third directions.

17. The device according to claim 12, wherein
the first contact plug includes a coupling portion that protrudes at least in the first direction, and
a bottom of the coupling portion is coupled to a top of the first conductive layer.

18. The device according to claim 12, wherein
the first contact plug penetrates the first and second conductive layers, and is electrically decoupled from the second conductive layer, and
the second contact plug penetrates the first and second conductive layers, and is electrically decoupled from the first insulating layer.

19. The device according to claim 10, further comprising:
a second interconnect extending in the second direction;
a fifth memory cell storing information between the first semiconductor layer and the second interconnect; and
a sixth memory cell storing information between the second semiconductor layer and the second interconnect,
wherein the first and second semiconductor layers are arranged between the first interconnect and the second interconnect.

* * * * *